(12) United States Patent
Strukov et al.

(10) Patent No.: US 12,106,211 B2
(45) Date of Patent: Oct. 1, 2024

(54) MIXED SIGNAL NEUROMORPHIC COMPUTING WITH NONVOLATILE MEMORY DEVICES

(71) Applicant: The Regents of the University of California, Oakland, CA (US)

(72) Inventors: Dmitri Strukov, Goleta, CA (US); Farnood Merrikh Bayat, Goleta, CA (US); Mohammad Bavandpour, Goleta, CA (US); Mohammad Reza Mahmoodi, Goleta, CA (US); Xinjie Guo, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1259 days.

(21) Appl. No.: 16/608,006

(22) PCT Filed: Apr. 27, 2018

(86) PCT No.: PCT/US2018/029970
§ 371 (c)(1),
(2) Date: Oct. 24, 2019

(87) PCT Pub. No.: WO2018/201060
PCT Pub. Date: Nov. 1, 2018

(65) Prior Publication Data
US 2021/0019609 A1 Jan. 21, 2021

Related U.S. Application Data

(60) Provisional application No. 62/491,020, filed on Apr. 27, 2017.

(51) Int. Cl.
*G06N 3/049* (2023.01)
*G06N 3/065* (2023.01)
(Continued)

(52) U.S. Cl.
CPC ............. *G06N 3/065* (2023.01); *G06N 3/049* (2013.01); *G11C 16/0425* (2013.01);
(Continued)

(58) Field of Classification Search
CPC . G06N 3/049; G11C 16/0425; G11C 16/0458
See application file for complete search history.

(56) References Cited

U.S. PATENT DOCUMENTS 5,029,130 A 7/1991 Yeh
8,294,197 B2 10/2012 Wang et al.
(Continued)

OTHER PUBLICATIONS

PCT International Search Report & Written Opinion Aug. 28, 2018, PCT Application No. PCT/US2018/029970.

*Primary Examiner* — Mark V Prenty
(74) *Attorney, Agent, or Firm* — GATES & COOPER LLP

(57) ABSTRACT

Building blocks for implementing Vector-by-Matrix Multiplication (VMM) are implemented with analog circuitry including non-volatile memory devices (flash transistors) and using in-memory computation. In one example, improved performance and more accurate VMM is achieved in arrays including multi-gate flash transistors when computation uses a control gate or the combination of control gate and word line (instead of using the word line alone). In another example, very fast weight programming of the arrays is achieved using a novel programming protocol. In yet another example, higher density and faster array programming is achieved when the gate(s) responsible for erasing devices, or the source line, are re-routed across different rows, e.g., in a zigzag form. In yet another embodiment a neural network is provided with nonlinear synaptic weights implemented with nonvolatile memory devices.

14 Claims, 44 Drawing Sheets

(51) Int. Cl.
  *G11C 16/04* (2006.01)
  *H01L 29/423* (2006.01)
(52) U.S. Cl.
  CPC .... *G11C 16/0458* (2013.01); *H01L 29/42324* (2013.01); *H01L 29/42328* (2013.01); *H01L 29/42344* (2013.01)

(56) References Cited

U.S. PATENT DOCUMENTS

| | | |
|---|---|---|
| 8,344,443 B2 | 1/2013 | Chen et al. |
| 2006/0050557 A1 | 3/2006 | Ishimaru et al. |
| 2008/0123416 A1 | 5/2008 | Chih |
| 2016/0328578 A1 | 11/2016 | Plusquellic et al. |
| 2017/0337466 A1 | 11/2017 | Bayat et al. |
| 2021/0019609 A1* | 1/2021 | Strukov .............. G11C 16/14 |

* cited by examiner

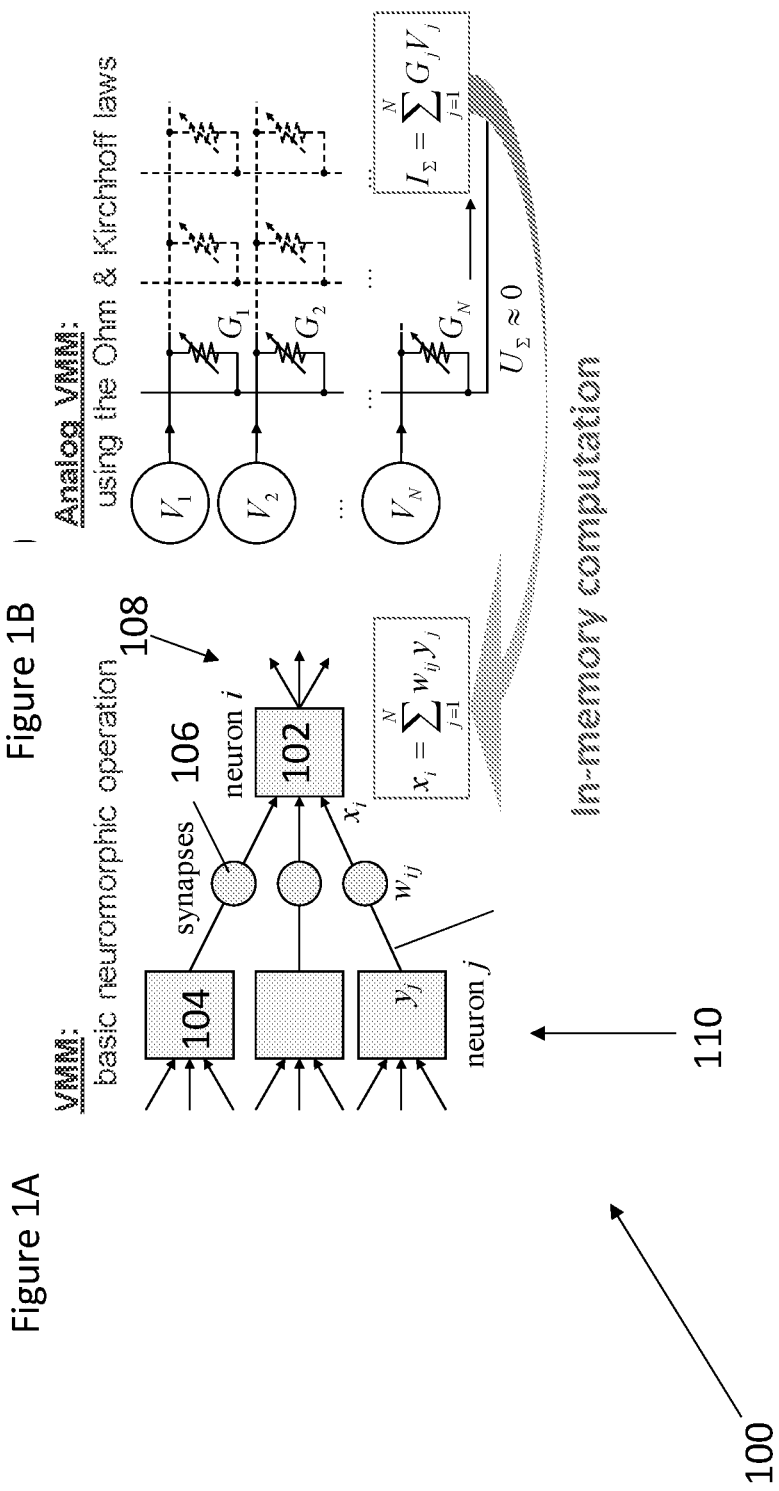

EG: Erase Gate
CG: Control Gate
WL: Word Line
SL: Source Line
BL= Bit Line

For reading one row: WL=2.5V, CG=2.5V, EG=0V, SL=0V, BL=1V are applied to selected row, and for other rows: WL=CG=EG=SL=0

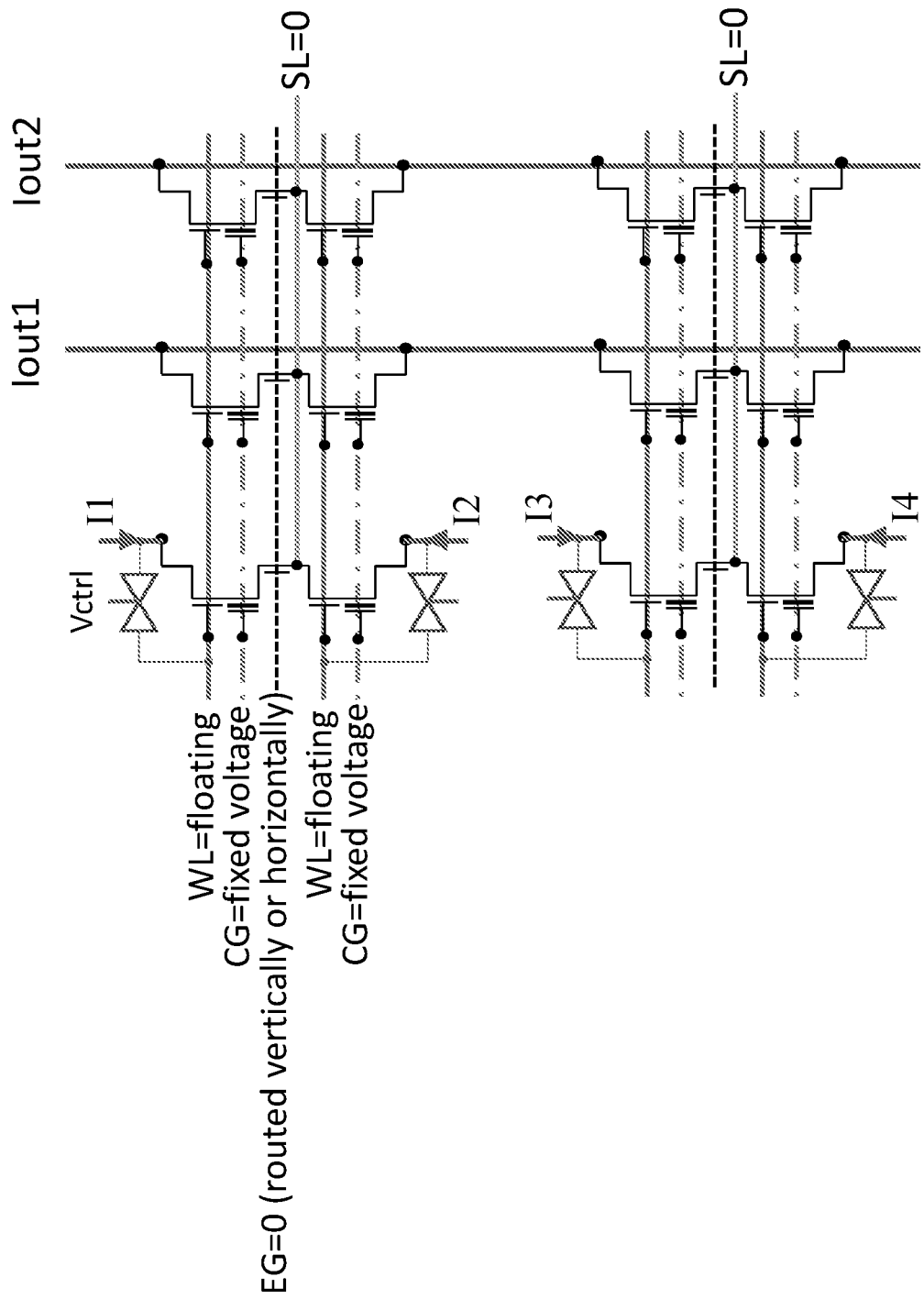

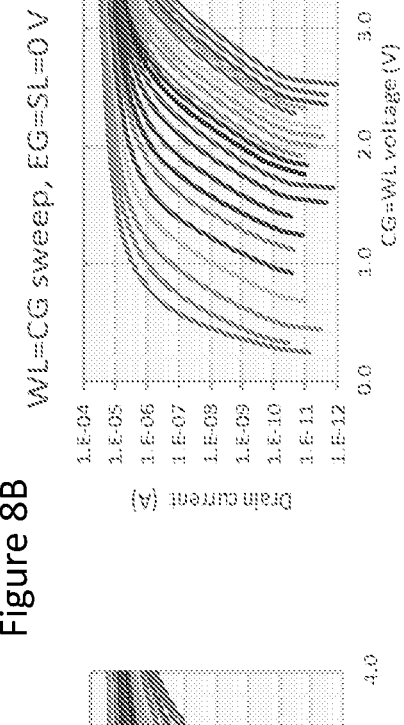
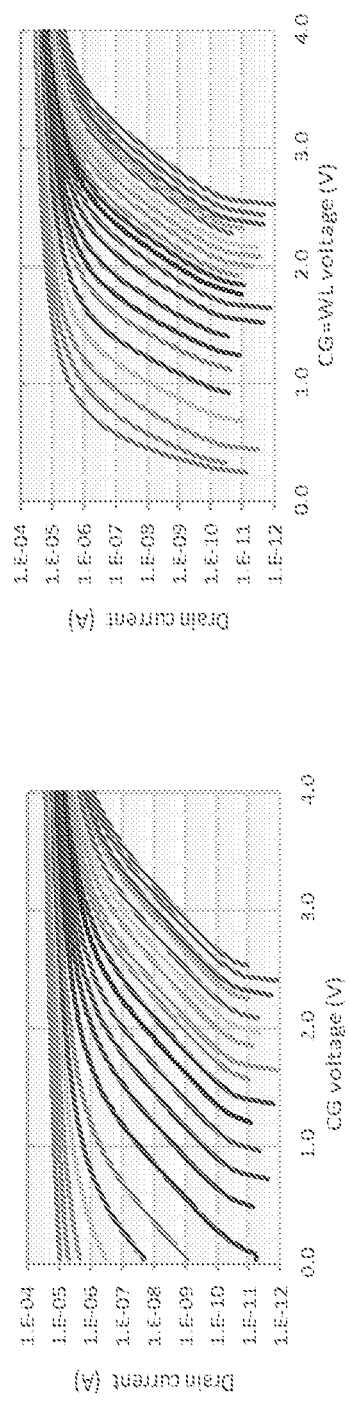
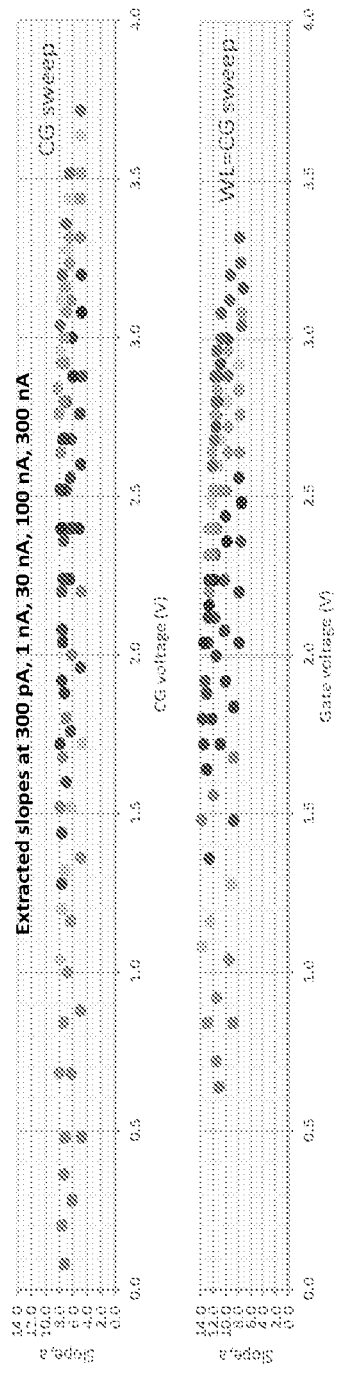
Figure 8A
Figure 8B
Figure 8C
Figure 8D

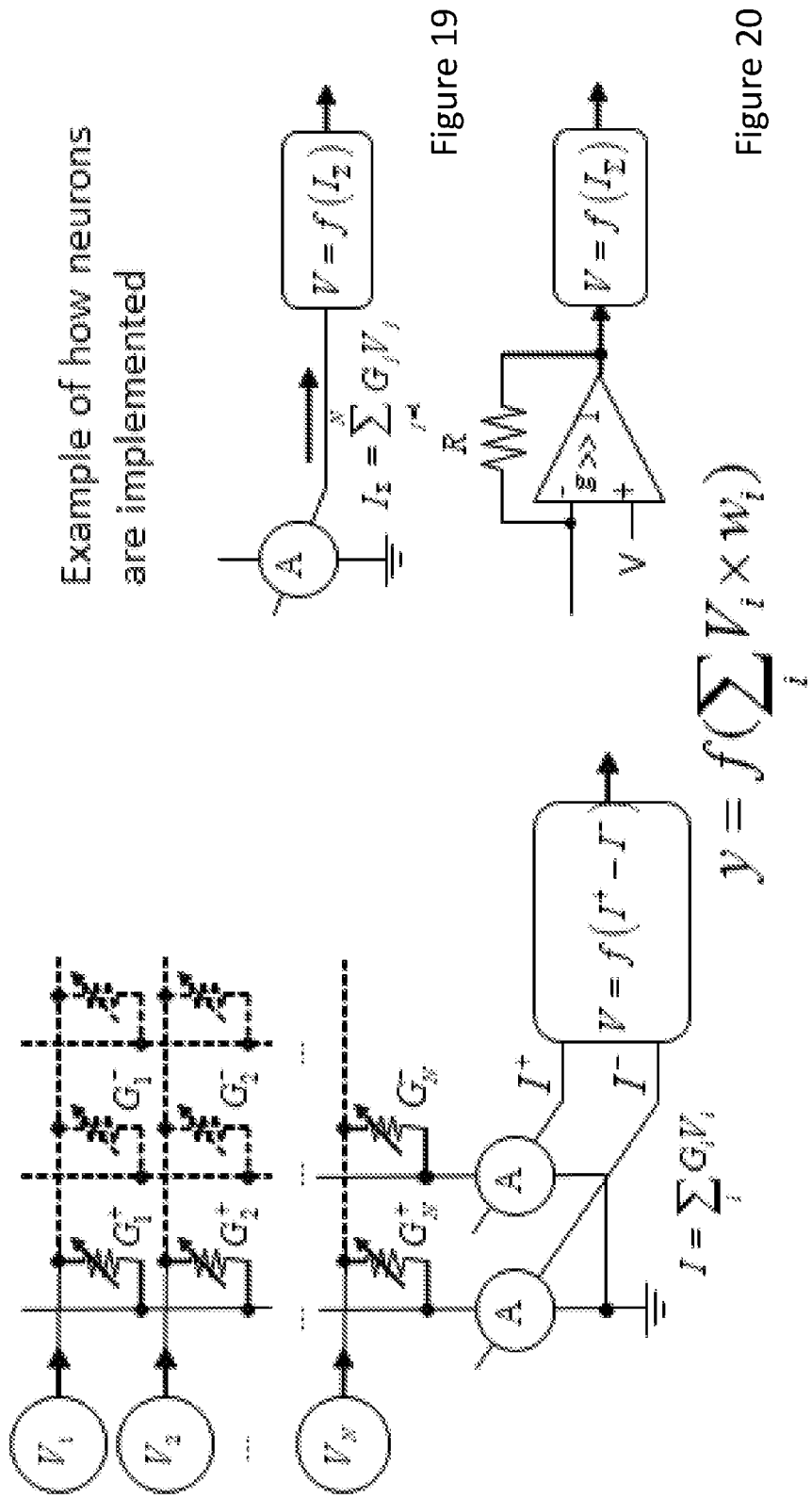

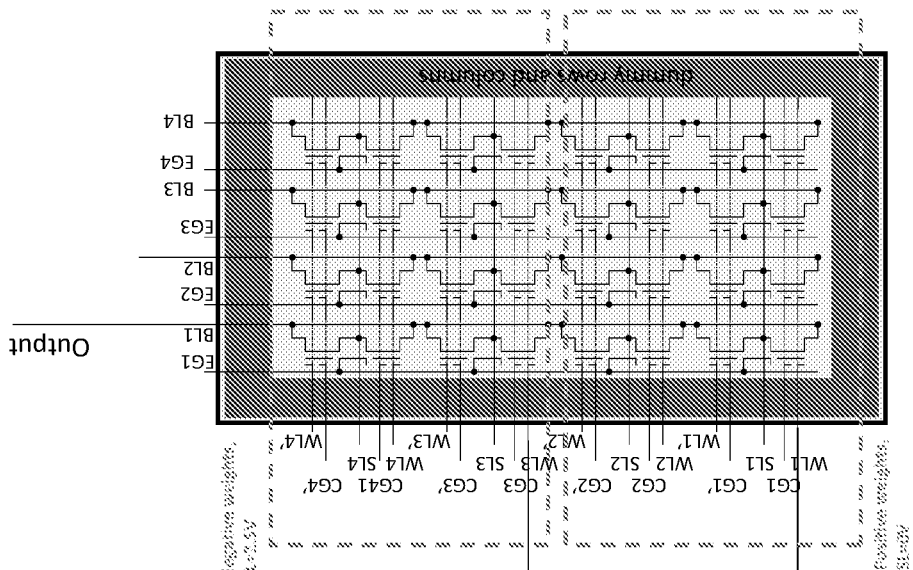
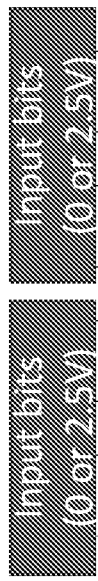
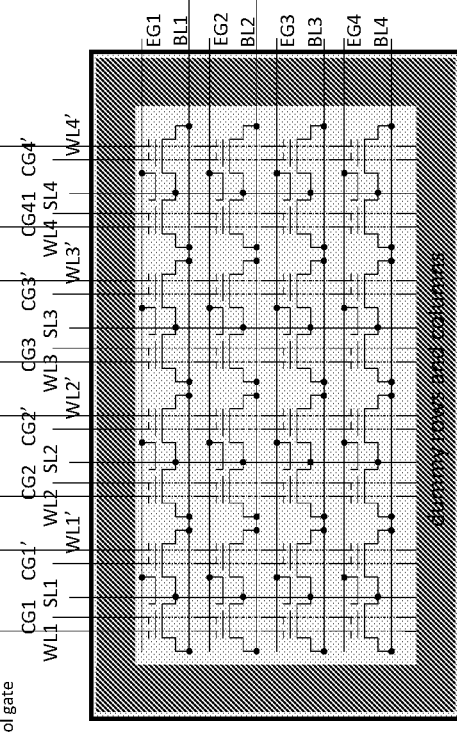
Figure 42

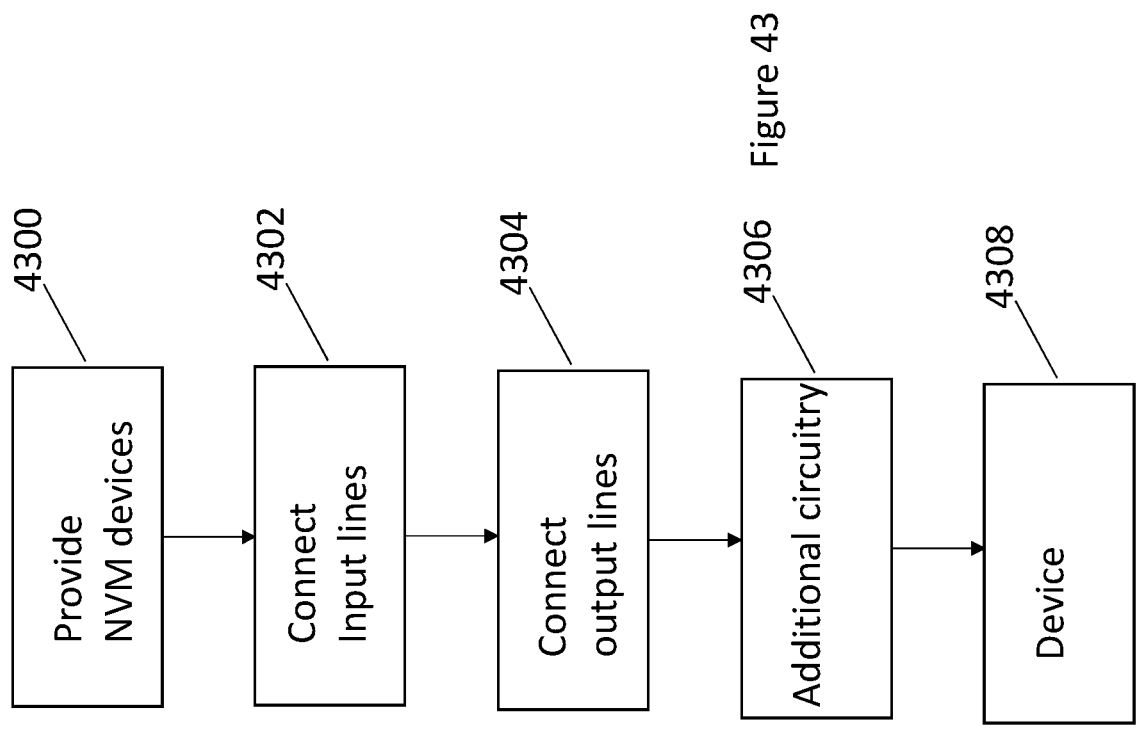

MIXED SIGNAL NEUROMORPHIC COMPUTING WITH NONVOLATILE MEMORY DEVICES

CROSS REFERENCE TO RELATED APPLICATIONS

This application claims the benefit under 35 U.S.C. Section 119(e) of and commonly-assigned U.S. Provisional Patent Application Ser. No. 62/491,020, tiled on Apr. 27, 2017, by Dmitri Strukov, Farnood Merrikh Bayat, Michael Klachko, Mohammad Bavandpour, Mohammad Reza Mahtnoodi, and Xinjie Guo et. al, entitled "MIXED SIGNAL NEUROMORPHIC COMPUTING WITH NONVOLATILE MEMORY DEVICES," client reference number 2017-597, which application is incorporated by reference herein.

STATEMENT REGARDING FEDERALLY SPONSORED RESEARCH AND DEVELOPMENT

This invention was made with Government support under Contract 10542471 awarded by Air Force Office of Scientific Research, Contract 1528305 awarded by the National Science Foundation, and Contract 846660 awarded by Defense Advanced Research Projects Agency. The Government has certain rights in the invention.

BACKGROUND OF THE INVENTION

1. Field of the Invention

This disclosure relates to neuromorphic computing, which is to say computing devices that mimic, to at least some extent, neuro-biological architectures present in the human nervous system.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Because of their high computational complexity, implementing Machine Learning or Deep Neural Networks (DNN) in real-world applications is a challenging problem. Although the main computation done in these systems is very basic (e.g. multiplication and addition), digital hardware accelerators like CPUs and even GPUs are unable to achieve acceptable performance when implementing these systems due to the large size of these systems and the large number of operations needed to be executed to process each input.

SUMMARY OF THE INVENTION

To overcome the limitations in the prior art described above, and to overcome other limitations that will become apparent upon reading and understanding the present specification, the present disclosure describes architectures for implementing Vector-by-Matrix Multiplication (VMM) with analog circuitry including non-volatile memory devices (flash transistors) and implementing in-memory computation.

In one example, improved performance and more accurate VMM is achieved in arrays including multi-gate flash transistors when computation uses a control gate or the combination of control gate and word line instead of using the word-line alone.

In another example, very fast weight programming of the arrays is achieved using a novel programming protocol.

In yet another example, higher density and faster array programming is achieved when the gate(s) responsible for erasing devices, or the source lines, are re-routed across different rows, e.g., in a zigzag form.

In yet a further example, a neural network with nonlinear synaptic weights is implemented with nonvolatile memory devices.

The circuits described herein may be embodied in many ways, including the following embodiments:

1. A VMM circuit to implement larger neural networks, comprising first cells of field effect transistors (FETs) each of the first cells comprising a first FET and a second FET; second cells of FETs each connected to one of the first cells, each of the second cells comprising a third FET and a fourth FET. and each of the FETs comprising: a source (S), a drain (D), and a channel between the source and the drain; a first gate disposed over a first portion of the channel and insulated from the first portion of the channel, the first gate controlling a first conductivity of the first portion in response to a first voltage applied to the first gate; a second gate comprising a floating gate disposed over a second portion of the channel, the floating gate controlling a second conductivity of the second portion in response to an amount of charge (electrons or holes) stored on the floating gate; and a third gate comprising a gate coupled to the floating gate so as to control the amount of charge transferred to the floating gate during programming. The circuit further includes a first line electrically connecting the first gate in the first FET and the first gate in the third FET; a second line electrically connecting the first gate in the second FET and the first gate in the fourth FET; a third line electrically connecting the third gate in the first FET and the third gate in the third FET; a fourth line electrically connecting the third gate in the second FET and the third gate in the fourth FET; a fifth line electrically connecting the sources of the first and second FETs with the sources of the third and fourth FETs when the FETs are n-type FETs, or electrically connecting the drains of the first and second FETs with the drains of the third and fourth FETs when the FETs are p-type FETs; and a sixth line electrically connecting the drains of the third and fourth FETs when the FETs are n-type FETs, or electrically connecting the sources of the third and fourth FETs when the FETs are p-type FETs. The circuit further includes a first pass gate connecting the third gate in the first FET to the drain in the first FET when the FETs are n-type FETs or connecting the third gate in the first FET to the source in the first FET when the FETs are p-type FETs, and a second pass gate connecting the third gate in the second FET to the drain in the second FET when the FETs are n-type FETs or connecting the third gate in the second FET to the source in the second FET when the FETs are p-type FETs. The input current to the first FET is inputted to the drain of the first FET when the FETs are n-type FETs or the input current to the first FET is inputted to the source of the first FET when the FETs are p-type FETs, The input current to the second FET is inputted to the drain of the second FET when the FETs are n-type FETs or the input current to the second FET is inputted to the source of the second FET when the FETs are p-type FETs. The output current from the third FET is a dot product multiplication of the input current to the first FET and a weight determined by the amount of charge stored on the floating gates of the first FET and the third FET, The output current from the fourth FET is a dot product multiplication of the input current to the second FET and a weight determined by the amount of charge stored on the floating gates of the second FET and the fourth FET. The FETs are operated in a subthreshold regime.

2. The circuit of embodiment 1, further comprising a third pass gate connecting the first gate in the first FET to the third gate in the first FET; and a fourth pass gate connecting the first gate in the second FET to the third gate in the second FET.

3. The circuit of one or any of the previous embodiments, wherein the current in the sixth line comprises an addition and/or subtraction of the output currents outputted from each of the third and fourth FETs whose drains or sources are connected by the sixth line.

4. The circuit of one or any combination of the previous embodiments, further comprising a plurality of synapses between a first layer of first neurons and a second layer comprising at least one second neuron, the synapses each comprising a plurality of the first cells and the second cells, wherein the plurality of synapses receive a plurality of inputs from the first layer of first neurons and output a plurality of outputs to the at least one second neuron in response thereto, the plurality of inputs are inputted onto the sources or drains of the first cells and the plurality of outputs comprise the current in the sixth line, and the at least one second neuron is configured to generate a decision based on the current in the fourth line.

5. The circuit of one or any combination of the previous embodiments wherein the FETs each further comprise a fourth gate comprising a gate coupled to the floating gate so as to erase charge from the floating gate; the circuit further includes a seventh line electrically connecting the fourth gate in the first FET to the fourth gate in the third FET; the circuit further includes an eighth line electrically connecting the fourth gate in the second FET to the fourth gate in the fourth FET, 6. The circuit of one or any combination of embodiments having seventh and eighth lines, wherein the seventh and eighth lines are on one line (so the first FETS and second FEES are sharing the same erase gate EG).

7. The circuit of one or any of the preceding embodiments, wherein the pass gates each have an input and an output, when the pass gates are on, the input voltage to the input is the same as the output voltage from the output, and when the pass gate is off, the inputs and outputs are isolated.

8. The circuit of one or any of the preceding embodiments, wherein the fifth line, the seventh line, and the eighth line are each biased at a fixed voltage, each of the input currents are inputted to the drains of the first cell when the FETs are n-type FETs or the sources of the first cell when the FETs are p-type and the pass gates are on, each of the input currents are converted to voltage on the third gates of the first cell, the voltage is shared with third gates of the second cells, the second cells convert the voltage to current with different gains proportional to the amount of charge stored on the floating gates in the first cell and the second cell, and the currents outputted from each of the third and fourth FETs are summed on the sixth line.

9. An array of flash transistors, comprising a plurality of transistors disposed in an array of rows and columns, each of the transistors including a source (S), a drain (D), a channel between the source and the drain; a floating gate disposed over a portion of the channel, the floating gate controlling a conductivity of the portion in response to an amount of charge (electrons or holes) stored on the floating gate; and an erase gate comprising a gate coupled to the floating gate so as to fully or partially erase the amount of charge stored on the floating gate. Each row comprises a plurality of blocks each including a plurality of the transistors in the row. The array further includes a set of blocks, the set comprising a block in each of a plurality of different rows; and a first line moving across the rows so as to electrically connect together: the erase gates in the set of blocks, so that all the erase gates in the set of blocks are at a same voltage potential, or the sources (or drains) in the set of blocks, so that all the sources (or drains) in the set of blocks are at a same voltage potential.

10. The array of embodiment 9, wherein each block comprises at least 3 transistors or between 3 and 32 transistors in a same row.

11. The array of embodiments 9 or 10 combined with one or any combination of embodiments 1-8.

12. A method for tuning a circuit including flash transistors having floating gates, comprising: (a) applying one or more programming voltage pulses to each of the flash transistors in an erased state, the voltage pulses each having width in a range of 100 nanoseconds to 5 microseconds and an amplitude in a range of 2.5 to 9 volts so as to control the amount of the charge programmed on the floating gate; (b) calculating a slope of change in the output current outputted from each of the flash transistors in a log-log plot as a function of a number and/or width of the programming voltage pulses; and (c) from the slope, estimating the number of programming voltage pulses (or the width of a single one of the programming voltage pulse) required for each of the flash transistors to enter a subthreshold regime or be programmed to a target state to within a predetermined accuracy.

13. The method of embodiment 12, further comprising (d) after entering the subthreshold operation regime, applying several additional voltage pulses to the flash transistors and calculating a slope of change in the output current in the subthreshold region; (e) estimating a width of the additional voltage pulses (or a number of the additional voltage pulses) required for the flash transistor to be programmed to the target state within a predetermined accuracy; and (f) applying the number of additional voltage pulses, or applying the additional voltages pulses having a width shorter than the measured width in (e), or applying the additional voltages pulses having an amplitude less than the estimated amplitude in (e), so as to gradually approach the target state of the flash transistors to avoid erasing the flash transistors and having to repeat the method of steps (a)-(f).

14. The method of embodiments 12 or 13 combined with one or any combination of embodiments 1-11.
15. A method for tuning a circuit including flash transistors having floating gates, comprising (a) applying one or more erase voltage pulses to each of the flash transistors in a programmed state, the voltage pulses each having a width in a range of 100 nanoseconds to 10 milliseconds and an amplitude in a range of 4 to 15 volts so as to at least partially erase the charge programmed on the floating gate; (b) calculating a slope of change in the output current outputted from each of the flash transistors in a log-log plot as a function of a number and/or width of the erase voltage pulses; and (c) from the slope, estimating the number of erase voltage pulses (or the width of a single one of the erase voltage pulses) required for each of the flash transistors to be tuned to the target state within a predetermined accuracy.
16. The method of embodiment 15, further comprising (d) applying several additional erase voltage pulses to the flash transistors and calculating a slope of change in the output current in the subthreshold region; (e) estimating a width of the additional erase voltage pulses (or a number of the additional erase voltage pulses) required for the flash transistor to be tuned to the target state within a predetermined accuracy; and (f) applying the number of additional erase voltage pulses; or applying the additional erase voltages pulses having a width shorter than the measured width in (e), or applying the additional erase voltages pulses having an amplitude less than the estimated amplitude in (e), so as to gradually approach a target state of the flash transistors to avoid programming the flash transistors and having to repeat the method of steps (a)-(f).
17. The method of embodiments 15 or 16 combined with one or any combination of the embodiments 1-14.
18. A circuit useful for implementing a neural network, comprising a plurality of Non-Volatile Memory (NVM devices each having an NVM input for receiving an input x and an NVM output, wherein each of the NVM outputs outputs a signal comprising a nonlinear function g(x, w) of the input x and an internal state w of the NVM, the internal state corresponding to a weight assigned to the input x; a plurality of input lines, each of the plurality of input lines connected to a first plurality of the NVM inputs so as to transmit the input x to the NVMs; and a plurality of output lines, each of the plurality output lines connected to a plurality of the outputs so as to receive the signals from the NVMs.
19. The circuit of embodiment 18, further comprising circuitry combining a pair of the output lines so that the signals in the output lines in the pair are combined to form a combined output.
20. The circuit of one or any combination of embodiments 18-19, further comprising: the input lines including pairs of associated input lines, each of the pairs including an input line $I_a$ transmitting the input x comprising input $x_a$ to the NVM devices connected to the input line $I_a$, and input lines $I_b$ transmitting the input x comprising input $x_b$ that is a function of the input $x_a$.
21. The circuit of one or any combination of embodiments 18-20, wherein the output lines are left floating and the device further comprises circuitry applying a nonlinear activation function to a voltage in each of the output lines or in a combination of the output lines.
22. The circuit of one or any combination of embodiments 18-21, further comprising: pairs of the input lines each comprising a first input line and a second input line, wherein the first input line is connected to the NVM devices comprising first NVM devices that are each a current source in response to the input x comprising a first input x transmitted on the first input line, and the second input line is connected to the NVM devices comprising second NVM devices that are each a current sink in response to the input x comprising a second input x transmitted on the second input lines, and the NVM outputs of the first NVM devices in the pair and the NVM outputs of the second NVM devices in the pair are connected to a same one of the output lines.
23. The circuit of one or any combination of embodiments 18-22, wherein the NVM devices comprise memristors or flash transistors.
24. The circuit of one or any combination of embodiments 18-23, further including a plurality of synapses each receiving a plurality of synapse inputs and generating a synapse output in response to the plurality of synapse inputs, each of the synapses comprising the plurality of the WM devices, wherein each of the plurality of synapses receive a plurality of voltages from a first layer of first neurons, wherein each of the voltages are inputted to one of the input lines, output a synapse signal comprising a combination of the signals received on one of the output lines or a combination of the output lines; and at least one second neuron connected to one or more of the synapses, wherein the at least one second neuron is configured to generate a decision based on the synapse signal.
25. The circuit of one or any combination of embodiments 18-24 combined with one or any combination of embodiments 1-17.

BRIEF DESCRIPTION OF THE DRAWINGS

Referring now to the drawings in which like reference numbers represent corresponding parts throughout:

FIGS. 1A-1B. Implementing Neural Networks with non-volatile memory devices.

FIG. 4A shows NOR memory architecture based on multi-gate flash transistors and FIG. 4B shows a method of using the array to perform the VMM multiplication using WLs and fixing the voltage on the CGs. Specifically, by connecting and opening pass transistors, and applying inputs as currents, the output currents will be the dot product between the weights and input current.

FIG. 8A plots Ids-Vgs of a multi-gate flash transistor when voltage sweep is applied to the CG while WL is biased with large fixed voltage (EG=0 or read condition).

FIG. 8B plots ids-Vgs of a multi-gate flash transistor when voltage sweep is applied to both CG and WL (EG=0 or read condition).

FIG. 8C plots the measurements of the slope of the curves shown in FIG. 8A in a subthreshold region showing the negligible change in the slope.

FIG. 8D plots the measurements of the slope of the curves shown in FIG. 8B in a subthreshold region showing a small change in the slope.

FIGS. 18-20 illustrate how the network of FIG. 17 performing VMM is conventionally implemented in analog with NVM devices, wherein FIG. 18 illustrates the circuit implementing VMM, FIGS. 19 and 20, illustrate the circuits performing a summation and applying the activation function to the summation using operational amplifier. f" is the activation function, that can be any nonlinear function such as "tanh". The summation operation and activation function represent the "neuron" in the neural network. Because conductance of memristors or NVM devices is non-negative, we need to represent each weight with two devices in order to be able to build negative weights as well (the reason of why we are subtracting the currents of two columns).

FIG. 22-29 illustrate circuit examples for implementing a neural network according to embodiments of the present invention, wherein, FIG. 22 illustrates a circuit example wherein inputs are applied directly to devices, output currents are added together and an activation function is applied to the sum, FIG. 23 illustrates a circuit example wherein inputs are applied directly to devices and weights are implemented differentially by subtracting measured currents, FIG. 24 illustrates a circuit example wherein inputs are applied directly to devices, columns are left floating, their voltages are measured, and the output is a function of these voltages, FIG. 25 illustrates a circuit example wherein inputs are applied directly but differentially to devices, and output currents are also measured differentially, FIG. 26 illustrates a circuit example wherein only inputs are applied directly to devices differentially, so each weight is implemented with two devices. A nonlinear function is applied to the measured current, FIG. 27 illustrates a circuit example wherein inputs are applied directly as voltage, columns are left floating, and the nonlinear activation function is applied to the measured voltage of the column, FIG. 28 illustrates an example wherein the inputs are applied directly as voltage but differentially, columns are left floating, and the nonlinear activation function is applied to the measured voltage of the column, and FIG. 29 illustrates an example wherein inputs are applied directly as voltage but differentially, columns are left floating, and the nonlinear activation function is applied to the measured voltages of the columns differentially.

FIG. 42 illustrates a circuit example comprising multi-gate flash devices used as nonlineari binary weights and a neuron-less network.

FIG. 43 is a flowchart illustrating a process for fabricating a circuit.

DETAILED DESCRIPTION OF THE INVENTION

Figure 2A:
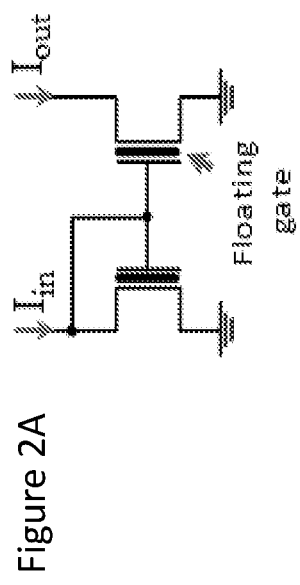
FIGS. 2A-2C. Implementing VMM modules using flash transistors using gate-coupled architecture.

In the following description of the preferred embodiment, reference is made to a specific embodiment in which the invention may be practiced. It is to be understood that other embodiments may be utilized and structural changes may be made without departing from the scope of the present invention.

Technical Description

Introduction

FIG. 1A illustrates a neural network 100 and shows how each output neuron 102 is connected to a set of input neurons 104 in the neural network 100 through adjustable parameters called synaptic weights $w_{ij}$ (or "weights" for short). In this configuration, the output of each synapse 106 is written as a dot-product between the output $y_j$ of input neurons 104 and the weights $w_{ij}$ connecting the input neurons 104 to the output neuron 102. The output of several of the synapses 106 can be expressed with a VMM operation where inputs $x_i$ to a next layer 108 of neurons 102 are obtained from outputs $y_j$ of neurons 104 in previous layer 110 and a weight matrix keeps or stores the weights $w_{ij}$ connecting input neurons 104 to all output neurons 102. However, with the increase in the size of these VMM and the DNNs, it becomes harder and harder (and less efficient) to implement such large VMMs with digital hardware.

For applications such as DNN, these VMMs do not need to be executed with high precision. In such applications, one possible solution for achieving higher efficiency is to use an in-memory computation concept, as shown in FIG. 1B. In this architecture, each synaptic weight is implemented with one or several non-volatile memory elements acting as a variable resistor whose resistance can be tuned. If the input is applied as a voltage signal to rows of the crossbar, and the columns of these crossbar-like architectures are virtually biased (e.g. grounded), the current on each column will be the dot product between the conductance of the devices and the inputs applied as voltage signals (according to Ohm's and Kirchhoff's current laws). The efficiency of computation can be much higher than other digital counterparts because the inherent property of the memory devices is used for the dot-product operation while all the network parameters are stored in the circuit. Moreover, the currents of all vertical columns can be assembled so as to obtain a module capable of performing VMM. For this purpose, we only need to adjust the conductance of devices with corresponding synaptic weights, decode the inputs as voltage signals and apply the voltage signals to the output neuron 104.

Figure 2B:
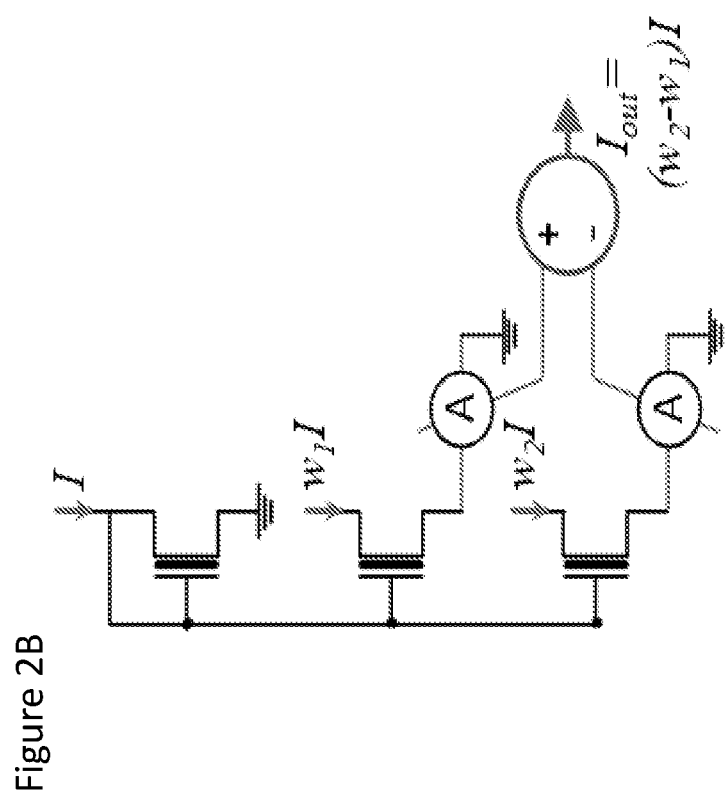

In FIG. 2A, showing how the architecture of FIG. 1B is implemented with flash or floating-gate transistors, the input is applied in the form of current and the first transistor logarithmically converts the input current into a voltage shared by the output transistor (when operating in the subthreshold regime). This transistor exponentially converts the voltage back to current with a gain proportional to the states of these two flash transistors. The whole process can be written as:

$$\frac{I_{out}}{I_{in}} = w = \frac{I_0 e^{\left(\frac{V_g - V_{th}^{out}}{nV_T}\right)}}{I_0 e^{\left(\frac{V_g - V_{th}^{in}}{nV_T}\right)}} = \frac{e^{\left(\frac{-V_{th}^{out}}{nV_T}\right)}}{e^{\left(\frac{-V_{th}^{in}}{nV_T}\right)}} = e^{\left(\frac{V_{th}^{in} - V_{th}^{out}}{nV_T}\right)}$$

where $V_{th}^{in}$ and $V_{th}^{out}$ are the adjustable threshold voltages of input and output floating-gate transistors, respectively. Therefore, a simple multiplier can be constructed by programming the states of two floating-gate transistors and configuring them in the current mirror form. This one-quadrant multiplier (since it can only produce positive weights) can be easily extended to a two-quadrant multiplier (with both positive or negative weights) by subtracting the output currents of two of these one-quadrant multipliers as shown in FIG. 2B. In this structure, by proper programming of $w_2$ and $w_1$, any positive or negative weight (i.e. $w=w_2-w_1$) can be implemented. These two-quadrant multipliers can be combined together and create a vector-by-matrix multiplier similar to that shown in FIG. 2C.

Figure 2C:
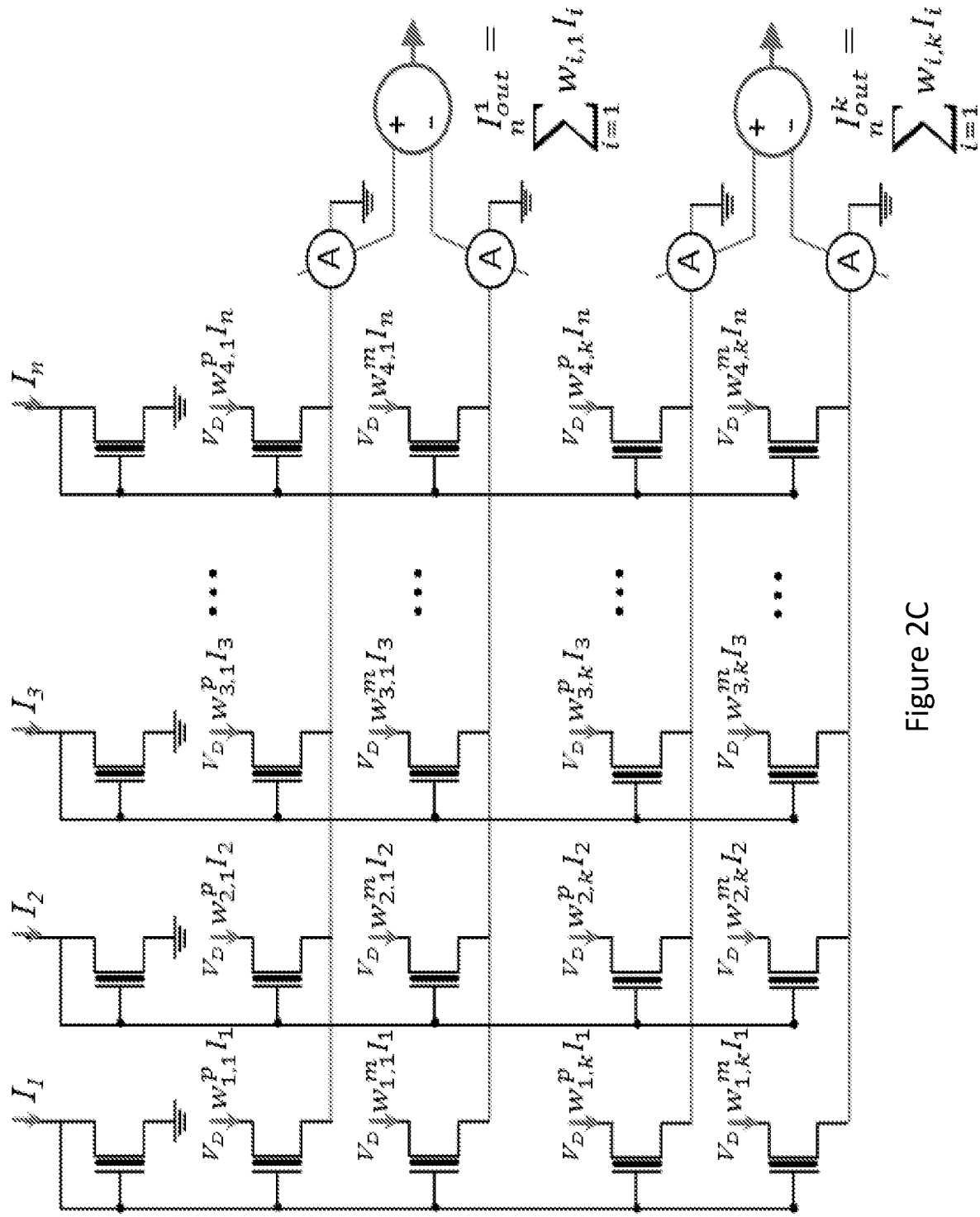
Figure 3:
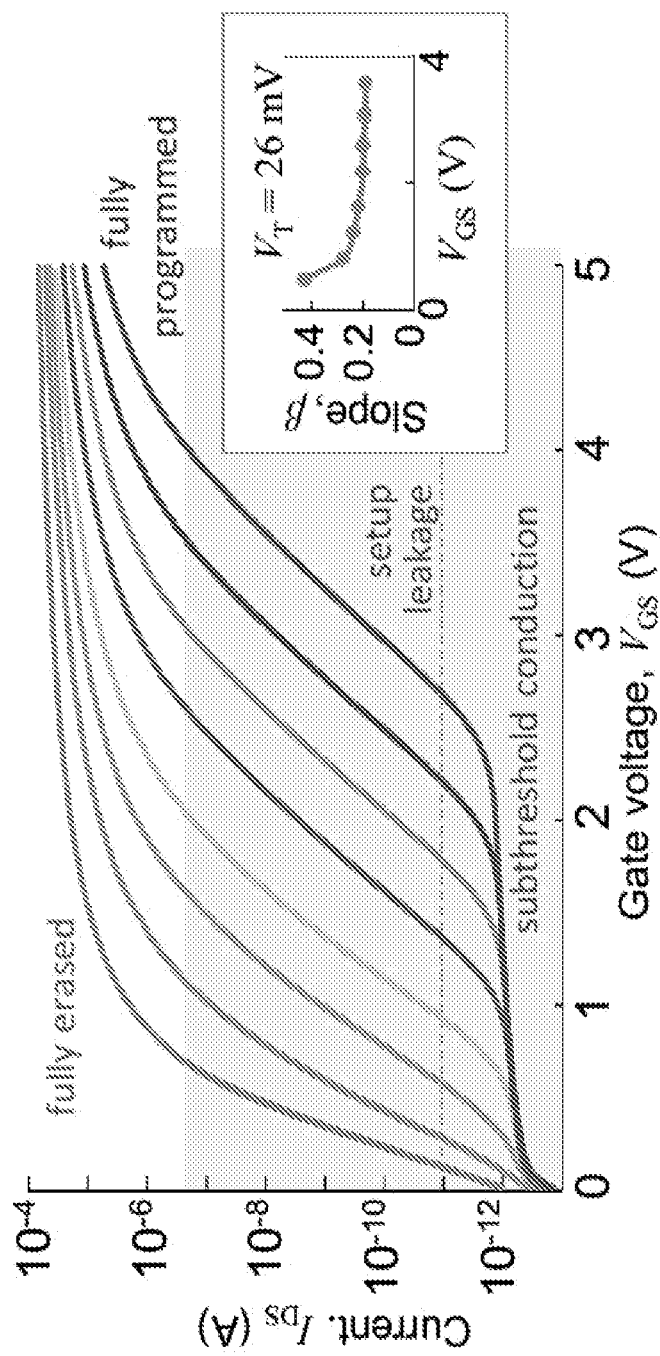
FIG. 3. Id-Vgs curves of a flash transistor programmed to different states (Vds=1). This figure shows that the slope of the curves in subthreshold region depends on the state of the transistor which can reduce the accuracy of the computation done with these devices.

One important point to note about the configurations in FIGS. 2A-2C is that the accuracy and the linearity of the implemented VMM operation depends completely on the similarity of the two transistors used for implementing the multiplication (the one logarithmically converting the current into voltage and the other one exponentially converting the voltage back into current, see FIG. 2A). Since these devices can be in any state and they are operating in a subthreshold regime, their Id-Vgs curves in subthreshold should match (as much as possible) for all intermediate states. For example, FIG. 3 shows the Id-Vgs characteristic of one flash transistor when programmed to a different intermediate state. The inset shows the change in the slope of the curve in the subthreshold region when moving from a fully erased state to fully programmed state. Unfortunately, a change in the slope of Id-Vgs curves is observed in most flash transistors (especially when the device is fully or partially erased). This creates a problem in the circuit of FIG. 2A implementing the multiplier and reduces the linearity of the multiplier (because if one transistor is close to a fully erased state and the other one is in any intermediate state or close to a fully programmed state, a difference in the slope of their Id-Vgs curves will be observed in the subthreshold region that can affect the performance of the multiplier). One possible solution to this problem is to prevent any of the devices from getting close to the fully erased state. However, the problem with this solution is that the operational range of these devices (not using the full range) is limited and higher voltages need to be applied on gate terminals (larger Vgs in FIG. 3).

Although the aforementioned suggestion is the only solution for flash technologies using floating-gate transistors with only one gate (usually called WL or word line), there are more options for other technologies using flash transistors with more than one gate.

To above mentioned problems can be more precisely described as follows. If the slopes of the Ids-Vgs curves of the two devices connected in FIG. 2A are different in the subthreshold region (for the states they are programmed into ($n1$ and $n2$)), the relationship between the input and output currents can be roughly written as:

$$\frac{I_{out}}{I_{in}} = W = \frac{I_0 e^{\left(\frac{V_g - V_{th}^{out}}{n_1 V_T}\right)}}{I_0 e^{\left(\frac{V_g - V_{th}^{in}}{n_2 V_T}\right)}} =$$

$$e^{\left(\frac{V_{gs} - V_{th}^{out}}{n_1 V_T} - \frac{V_{gs} - V_{th}^{in}}{n_2 V_T}\right)} = e^{\left(\frac{(n_2 - n_1) V_{gs}}{n_1 n_2 V_T} - \frac{n_2 V_{th}^{out} - n_1 V_{th}^{in}}{n_1 n_2 V_T}\right)} = f(V_{gs})$$

These relationships clearly show that, in this case, the weight will not be fixed and the weight will change with a change of Vgs (or equivalently with a change of input current). In other words, there will be different weights for different inputs (represented by input current).

II. Multiplication in Flash Transistors with More Than One Gate

Figure 4A:
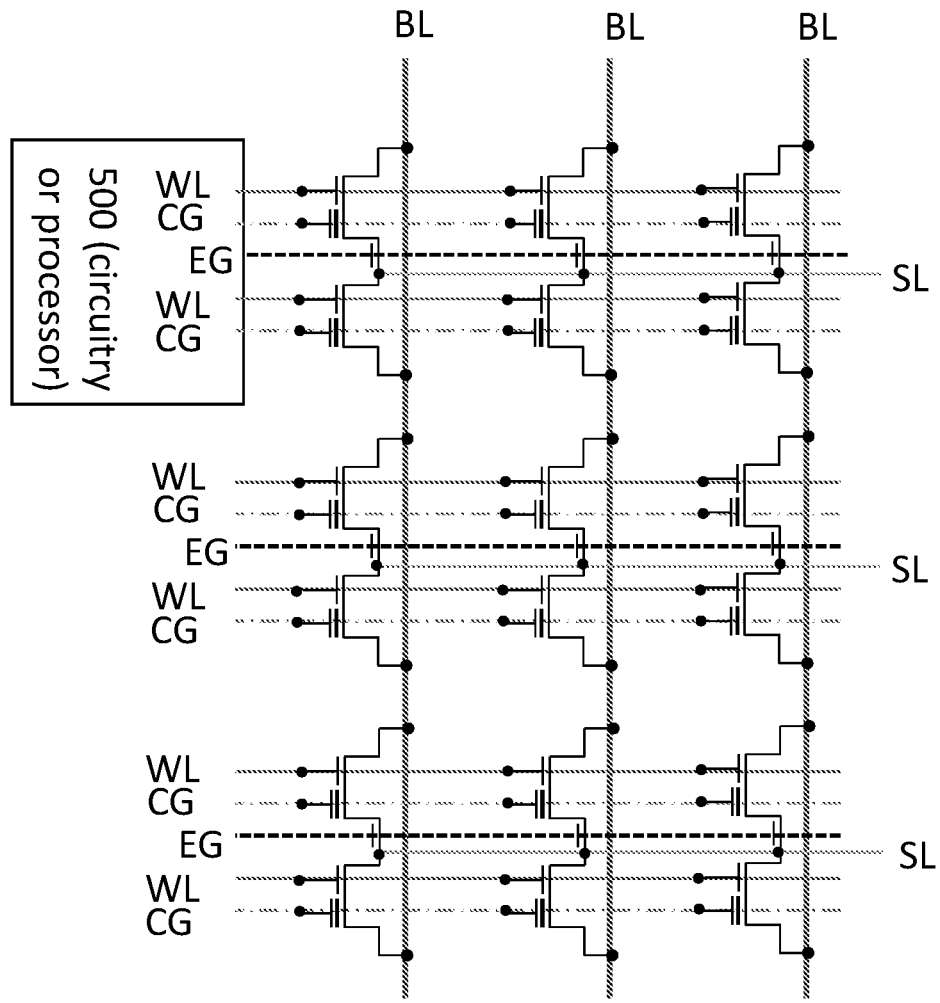

The most common method for implementing multiplication using flash transistors with more than one gate uses the word line (WL) as the main gate involved in computation, while biasing other gates (used for erasure or controlling the programming) to a fixed voltage. This is mainly because, in digital memory modules such as NOR memories, the reading operation is mainly performed using the WL (to reach the fastest reading state) while the remainder of the gates are biased with fixed voltages (see FIG. 4A for an example of NOR memory array with flash transistors with three gate terminals, i.e., EG, CG and WL), FIG. 4B illustrates an example of using the WL, to implement an analog multiplier similar to FIG. 2C.

Figure 5A:
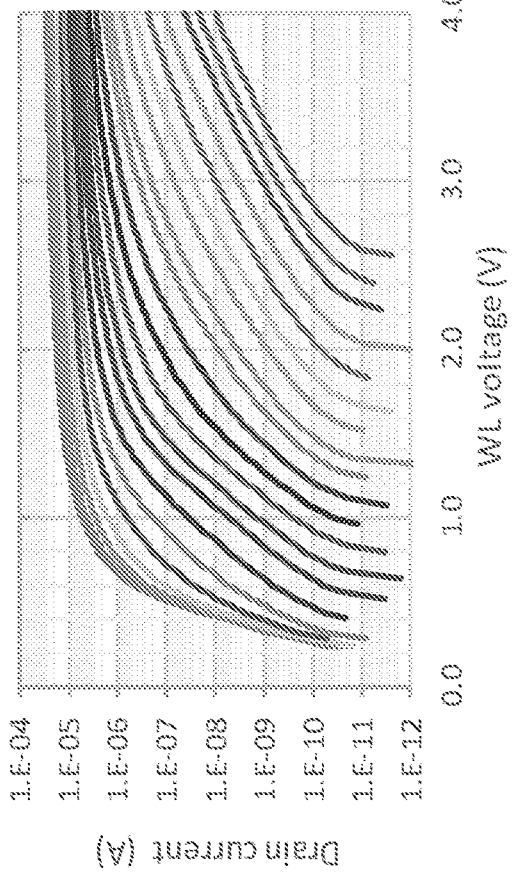
FIG. 5A shows Ids-Vgs of a multi-gate flash transistor when voltage sweep is applied to the WL and. CG is biased with large fixed voltage (EG=0 or read condition).
Figure 5B:
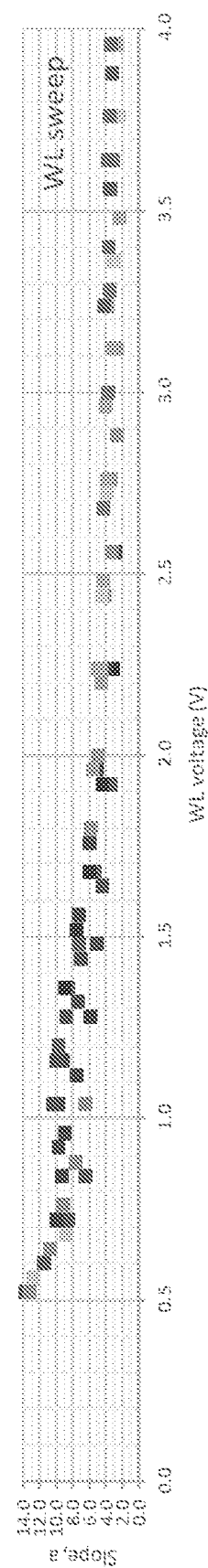
FIG. 5B shows the measurements of the slope of the curves shown in FIG. 5A in the subthreshold region, illustrating the change in these curves.

Note that the selection of devices, programming and erasure of the arrays can be achieved as before [1-2] and is not the focus of the present disclosure. One or more embodiments of the present invention are rather concerned with overcoming the problems (discussed above) resulting from use of the WL to perform analog computation. Specifically, the VMM operation shown in FIG. 4B does not result in accurate computation as shown in FIGS. 5A-5B (presenting the experimental results of testing a flash transistor having three gates when the device is programmed at different states, a voltage sweep is applied to its WL, and its channel current is measured while the rest of gates are biased with fixed voltage). FIG. 5B plots calculations of the slope of Id-Vw1 curves in a log scale using the data in FIG. 5A. FIGS. 5A-5B clearly show that the characteristics of the device in the subthreshold regime changes as the device state changes (or when the device is programmed into different states). This variation in device characteristics as a function of device state degrades the performance of the analog signal processing modules implemented based on these devices. FIGS. 5A-5B also show that operating the device in those states where the slope does not change that much avoids this problem (although with the cost of losing almost half of the working range of these devices (also requiring a larger voltage applied to the word line, Vw1)).

III. Example: Higher Computing Accuracy by Using Gates Other Than the Word Line

In this example, improved computing accuracy is achieved using a surprising and unexpected connection of other gates in the multi-gate flash transistors.

Figure 6:
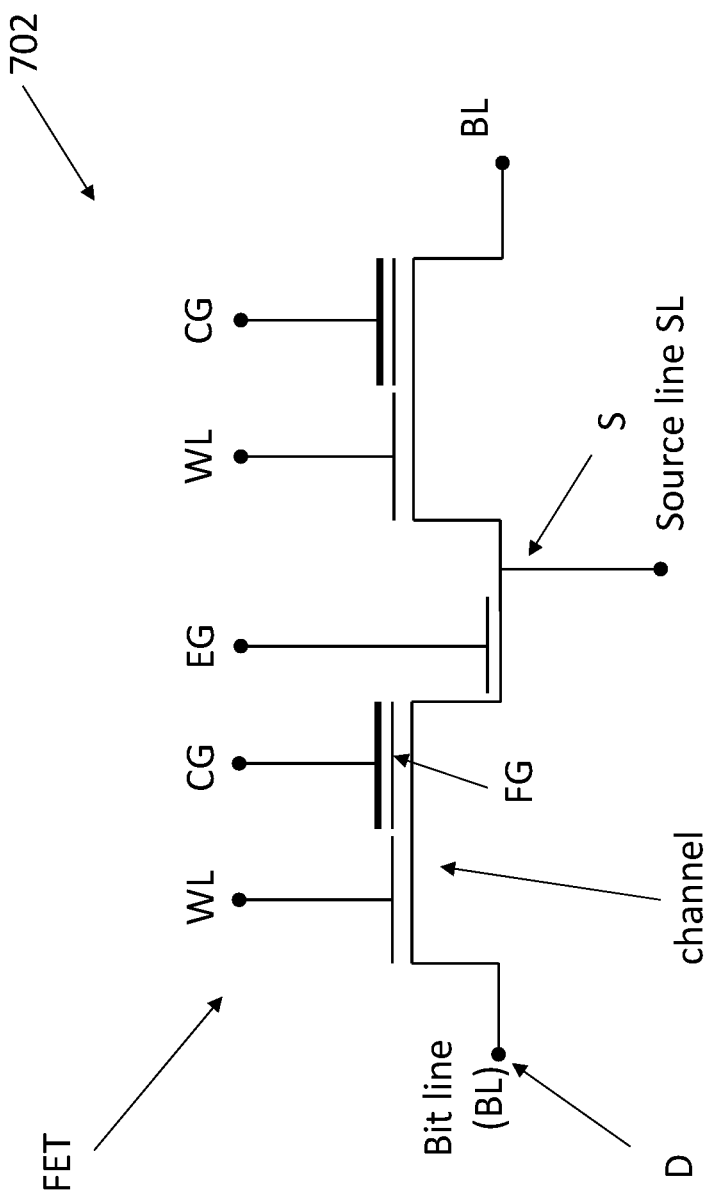
FIG. 6 illustrates a NOR flash memory two cell (super cell) equivalent circuit according to one or more embodiments of the present invention.

FIG. 6 illustrates a memory cell comprising a set of field effect floating-gate transistors (a first FET and a second FET) connected in a supercell configuration, where two FET transistors are sharing the source terminal, that can be used in the implementations according to embodiments of the present invention. Each of the first FET and the second FET comprise a shared source (S), a drain (D), a channel between the source and the drain; a floating gate (FG) disposed over and insulated from (e.g., using an oxide or dielectric) a first portion of the channel; and a control gate (CG) disposed over and insulated from (e.g. using an oxide or dielectric) a second portion of the channel so as to control a second conductivity of the second portion through a field effect when a voltage is applied to the control gate. The floating gate controls a first conductivity of the first portion in response to an amount of charge (electrons or holes) stored on the floating gate. The control gate is coupled to (but insulated from) the floating gate so as to control the amount of charge transferred to the floating gate during device programming. The CG may be disposed over the FG so controlling the conductivity of the first portion of the channel. In one or more embodiments, the FETs each further comprise a word line gate (WL) disposed over and insulated from (e.g. using an oxide or dielectric) a second portion of the channel so as to control a third conductivity of the third portion through a field effect when a voltage is applied to the word line; and an erase gate (EG) disposed over and insulated from (e.g. using an oxide or dielectric) a fourth portion of the channel and/or the source so as to control a fourth conductivity of the fourth portion or the source and erase the charge from the floating gate through a field effect when a voltage is applied to the EG.

Figure 7A:
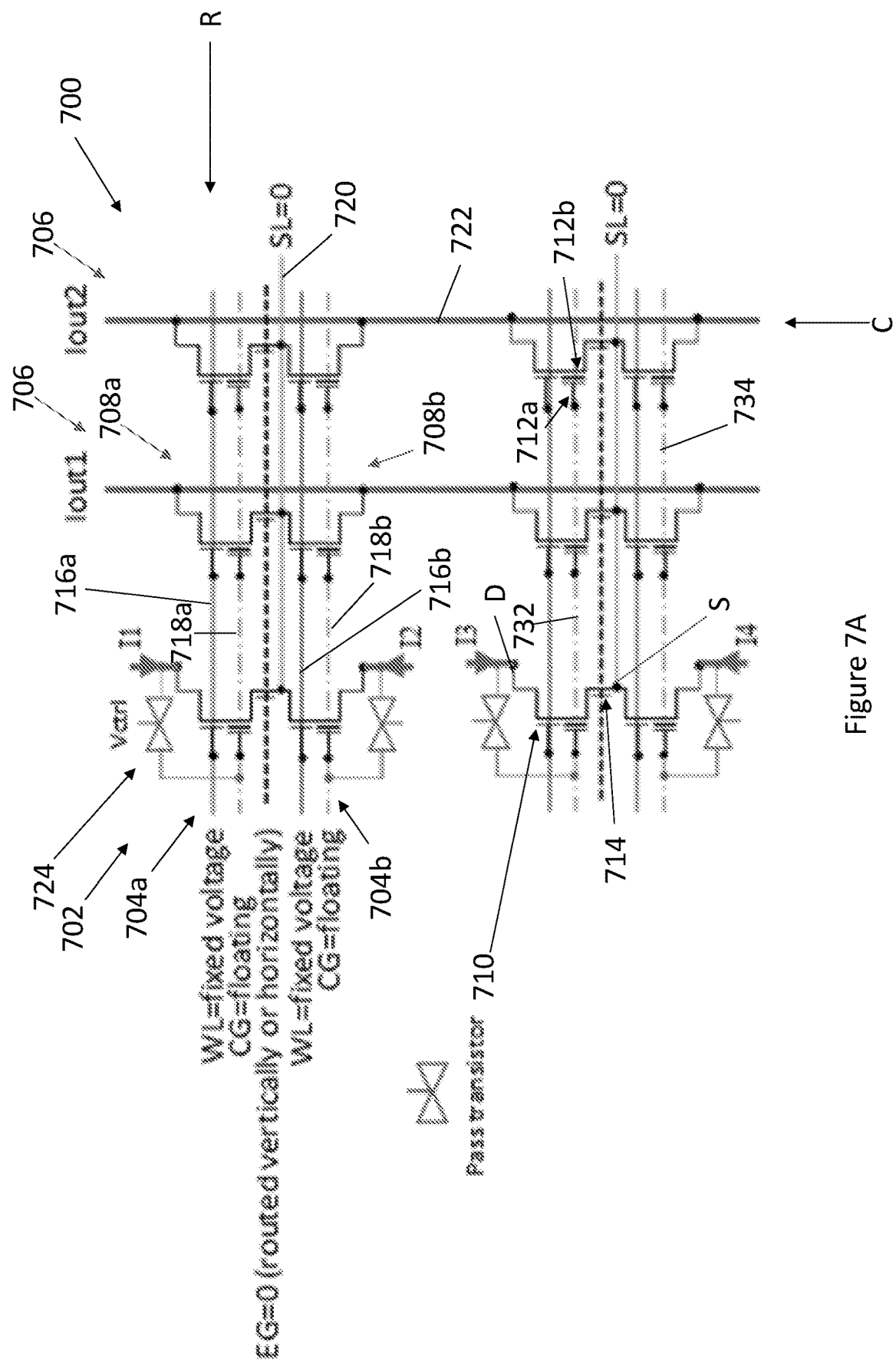
FIG. 7A illustrates a method using the array to perform the VMM multiplication using CGs and fixing the voltage on WLs (CG instead of WL is used to perform computation, passgates are connected to the CG instead of the WL). By connecting pass transistors, and applying inputs as currents, the output currents will be the result of VMM between the weights and input currents.
Figure 7B:
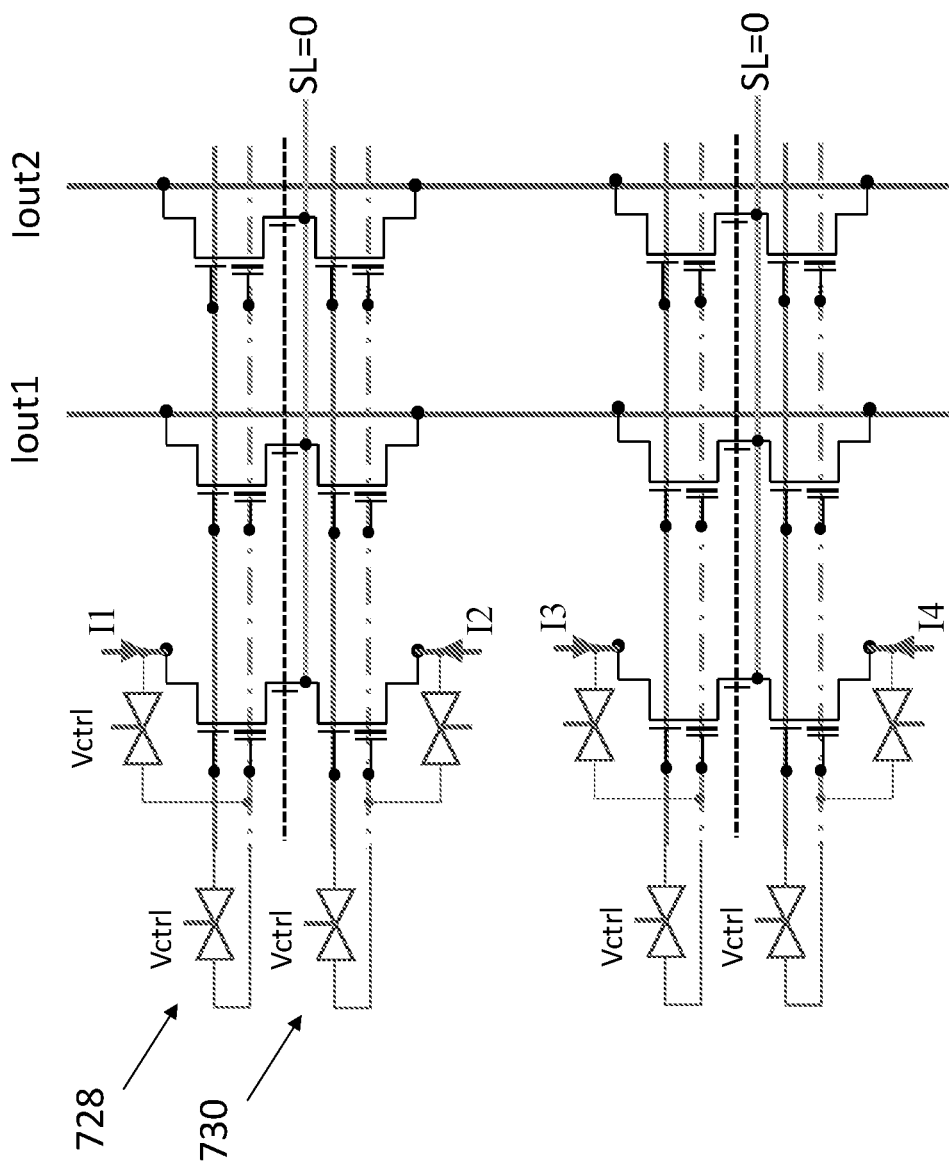
FIG. 7B illustrates using both WL and CG together (instead of WL only) to do computation. Pass gates are connecting bit lines to both the CG and the WL. By connecting pass transistors, and applying inputs as currents, the output currents will be the result of VMM between the weights and input currents.

FIGS. 7A-7B illustrate a modification of the architecture FIG. 4B where other gates of the flash transistors such as Control Gates (CG) are also used for computation (instead of the WL alone, as illustrated in FIG. 4B).

Specifically, FIGS. 7A and 7B illustrate a VMM circuit 700 to implement larger neural networks, comprising first cells 702 of field effect transistors (FETs) each of the first cells comprising a first FET 704a and a second FET 704b; and second cells 706 of FETs each connected to one of the first cells 702, each of the second cells 706 comprising a third FET 708a and a fourth FET 708b. The cells may be as illustrated in FIG. 6. Each of the FETs 704a, 704b in the first cells accepts different input current I1, I2 and converts the input current I1, I2, into voltage. The FETs 704a, 704b, 708a, 708b are disposed in rows R and columns C so that, each of the FETs in a cell 702, 706 are disposed in a same column C, the third FET 708a is in the same row as first FET 704a, and the fourth FET 708b is in the same row as second FET 704b.

Each of the FETs 704a, 704b, 708a, 708b comprise a source (S), a drain (D), and a channel between the source and the drain, wherein the source can be shared or common, a first gate 710 (e.g., a word line gate) disposed over a first portion of the channel and insulated from the first portion of the channel, the first gate controlling a first conductivity of the first portion in response to a first voltage applied to the first gate; a second gate 712*a* comprising a floating gate (FG) disposed over a second portion of the channel, the floating gate controlling a second conductivity of the second portion in response to an amount of charge (electrons or holes) stored on the floating gate; and a third gate 712*b* (e.g. CG) comprising a gate coupled to the floating gate so as to control the amount of charge transferred to the floating gate during programming.

The circuit further comprises a first line 716*a* electrically connecting the first gate 710 in the first FET 704*a* and the first gate 710 in the third FET 708*a*; a second line 716*b* electrically connecting the first gate 710 in the second FET 704*b* and the first gate 710 in the fourth FET 708*b*; a third line 718*a* electrically connecting the third gate 712*b* in the first FET 704*a* and the third gate 712*b* in the third FET 708*b*; a fourth line 718*b* electrically connecting the third gate 712*b* in the second FET 704*b* and the third gate 718*b* in the fourth FET 708*b*; a fifth line 720 electrically connecting the sources of the first FET 704*a* and second FET 704*b* with the sources of the third FET 708*a* and fourth FET 708*b* when the FETs are n-type FETs (or electrically connecting the drains of the first and second FETs with the drains of the third and fourth FETs when the FETs are p-type FETs); and a sixth line 722 electrically connecting the drains of the third FET 708*a* and the fourth FET 708*b* when the FETs are n-type FETs (or electrically connecting the sources of the third and fourth FETs when the FETs are p-type FETs).

The circuit further comprises a first pass gate 724 connecting the third gate 712*b* in the first FET 704*a* to the drain D in the first FET 704*a* when the FETs are n-type FETs (or connecting the third gate in the first FET to the source in the first FET when the FETs are p-type FETs); and a second pass gate 726 connecting the third gate 712*b* in the second FET 704*b* to the drain in the second FET when the FETs are n-type FETs (or connecting the third gate in the second FET to the source in the second FET when the FETs are p-type FETs).

In the embodiment of FIG. 713, the circuit 700 further comprises a third pass gate 728 connecting the first gate 710 in the first FET 704*a* to the third gate 712*b* in the first FET; and a fourth pass gate 730 connecting the first gate 710 in the second FET 704*b* to the third gate 712*b* in the second FET 708*b*.

The pass gates each have an input and an output, so that when the pass gates are on, the input voltage to the input is the same as the output voltage from the output, and when the pass gate is off, the inputs and outputs are isolated.

The input current I1 to the first FET 704*a* is inputted to the drain of the first FET when the FETs are n-type FETs (or the input current to the first FET is inputted to the source of the first FET when the FETs are p-type FETs). The input current I2 to the second FET 704*b* is inputted to the drain of the second FET when the FETs are n-type FETs (or the input current to the second FET is inputted to the source of the second FET when the FETs are p-type FETs).

The output current from the third FET 708*a* is a dot product multiplication of the input current I1 to the first FET and a weight determined by the amount of charge stored on the floating gates of the first FET 704*a* and the third FET 708*a*. The output current from the fourth FET 708*b* is a dot product multiplication of the input current I2 to the second FET 704*b* and a weight determined by the amount of charge stored on the floating gates of the second FET 704*b* and the fourth FET 708*b*. The FETs are operated in a subthreshold regime.

In one or more examples, the current Iout1 in the sixth line 722 comprises an addition and/or subtraction of the output currents outputted from each of the third FET 708*a* and the fourth FET 708*b* whose drains or sources are connected by the sixth line 722.

In the embodiments of FIGS. 7A and 7B, the FETs each further comprise a fourth gate 714 (e.g., erase gate) comprising a gate coupled to the floating gate so as to erase charge from the floating gate. This gate is optional. In this example, the circuit further includes a seventh line 732 electrically connecting the fourth gate in the first FET to the fourth gate in the third FET and an eighth line 734 electrically connecting the fourth gate in the second FET to the fourth gate in the fourth FET. In one or more examples, seventh lines 732 and eighth line 734 are one line, (shared between the two rows, i.e. one EG per each cell which is shared between cells located in that row).

In one or more examples, the first line 716*a* (only in Example 7A), the second line 716*b* (only in Example 7A), the fifth line 720 (and optionally also the seventh line 732 and the eighth line 734) are each biased at a fixed voltage, each of the input currents I1, I2, I3, I4 are inputted to the drains of the first cell 702 when the FETs are n-type FETs (or the sources of the first cell when the FETs are p-type and the pass gates are on), each of the input currents are converted to voltage on the third gates 712*b* of the first cell 702, the voltage is shared with third gates 712*b* of the second cells 706, the second cells 706 convert the voltage to current with different gains proportional to the amount of charge stored on the floating gates in the first cell 702 and the second cell 706, and the currents outputted from each of the third and fourth FEI's are summed on the sixth line 722. In the examples of FIGS. 7A and 7B, the common source (S) in each cell 702, 706 is connected to a source line (SL, 720) so that the voltage is shared through the source line with the third and fourth FEI's 708*a*, 708*b*.

However, the architectures illustrated in FIGS. 7A-7B are merely provided as examples and the array can be used in different architectures as well.

FIG. 8A presents experimental results of testing a flash transistor 704*a* or 704*b* having three gates 710 712, 714 when the device is programmed at different states, a voltage sweep is applied to the device's CG, and the device's 704*a* or 704*b* channel current is measured while the rest of gates 710, 714 are biased with fixed voltage. FIG. 8C illustrates a calculation of the slope of Id-$V_{CG}$ curves ($V_{CG}$ is voltage applied to CG) in log scale using the data in FIG. 8A. FIG. 8C clearly shows that the characteristics of the device 704*a* or 704*b* in the subthreshold regime does not change that much as the state of the device is changed (or when programming it into different states), thereby increasing the accuracy of computation in analog signal processing modules implemented based on floating gate transistors connected in current-mirror form, as compared to the case where the WL is used (as illustrated in FIG. 4B). The same is true if, instead of using WL only, the CG and WL are connected together and both are used for computation. The experimental results shown in FIGS. 8B and 8D also illustrate that the configuration connecting CG and WL also achieves improved performance as compared to a configuration that only uses WL for computation.

In one or more examples, deciding which gate to use for computation in devices with several gate terminals depends on the internal structure of the device and the coupling between externally accessible gates and the floating gate. In some examples, the gate with highest coupling with the floating gate has the least change in slope in the subthreshold region and can be selected for computation.

The circuits 700 illustrated in FIGS. 7A-7B may be implemented in a neural network 100 including a plurality of synapses 106 between a first layer 110 of first neurons 104 and a second layer 108 comprising at least one second neuron 102, as illustrated in FIG. 1A. One or more of the plurality of synapses 108 receive a plurality of inputs (derived from from the first layer of first neurons 104 and output one or more of a plurality of outputs $x_i$ to the at least one second neuron 102 in response thereto. One or more of the synapses 106 each comprise one or more of the first cells 702 and one or more of the second cells 706, so that one or more of the plurality of inputs $y_j$ are inputted onto the sources or drains of the first cells and one or more of the plurality of outputs $x_i$ comprise the current in the sixth line 722. In typical examples, the at least one second neuron 102 is configured to generate a decision based on the current in the fourth line 722.

IV. Ultra-Fast Weight Programming of Flash Transistors in the Subthreshold Regime In this embodiment, flash memory cells are programmed with analog values at very high speed. The programming or erasure of the devices inside the array can be achieved conventionally as before [1-2]:

Erasure: applying a large voltage to the erase gate while grounding the other terminals.

Programming: applying a narrow pulse to the source-line while the other gates are at a fixed potential, e.g., WL~1V, BL~0V, CG~10V, EG~4.5V.

If the states of these transistors to be precisely programmed to some intermediate states only in the subthreshold region, a question arises as to how the erasure and programming pulses should be applied (i.e. how many pulses, with which amplitudes and/or widths) to reach the target state as fast as possible with a minimum number of pulses or within the shortest period of time.

The following solutions are provided:

Since operation is only in the subthreshold regime, the floating gate device need only be modeled in this region.

Programming pulses are usually shorter, so it is preferred to use the programming pulses more frequently than erasure pulses.

Our measurements show that the amount of programming is an exponential function of the programming pulse width (while it is also an exponential function of pulse amplitude).

Our measurements show that the amount of erasure is an exponential function of the erasure pulse width (while it is also an exponential function of pulse amplitude).

(1) First Method

Figure 9:
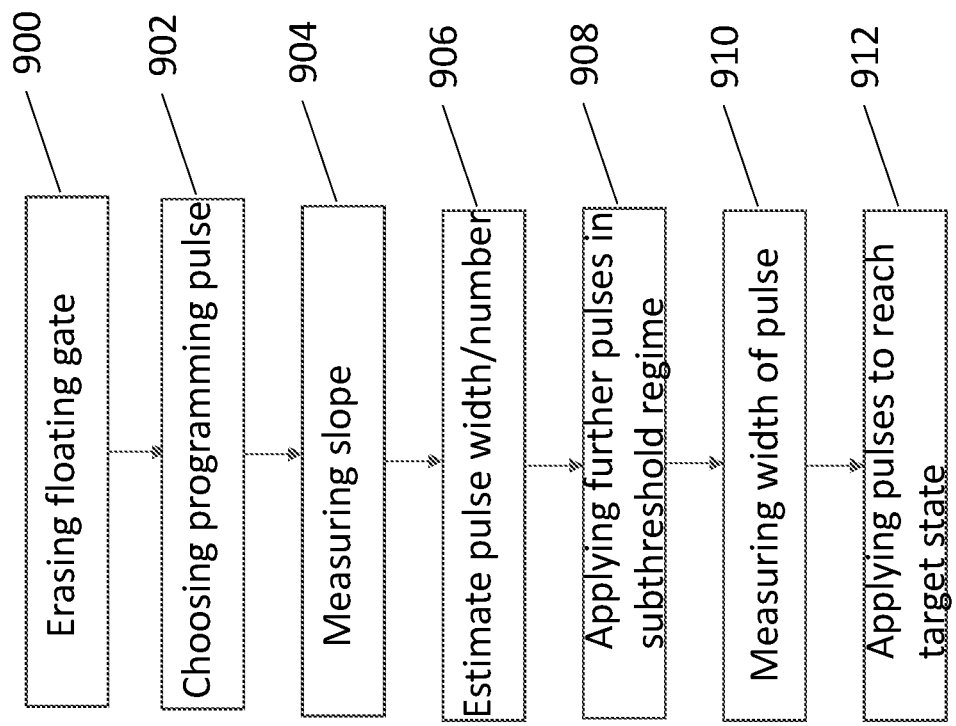
FIG. 9 is a flowchart illustrating a method of programming a memory cell used for VMM.

FIG. 9 illustrates a first method (e.g., algorithm) for programming a memory cell like the cell 702 comprising FETs 704a or 704b.

Block 900 represents a first step, erasing charge from the floating gate so as to start from a fully or partially erased state.

Block 902 represents the second step: choosing a narrow base programming pulse (100 nanoseconds to 5 microseconds in width) with small amplitude (2.5 to 9 volt amplitude), applying the pulse, and measuring the change in the device state in response thereto. If the change is not big enough, the step further comprises increasing the amplitude of the base pulse.

Figure 10:
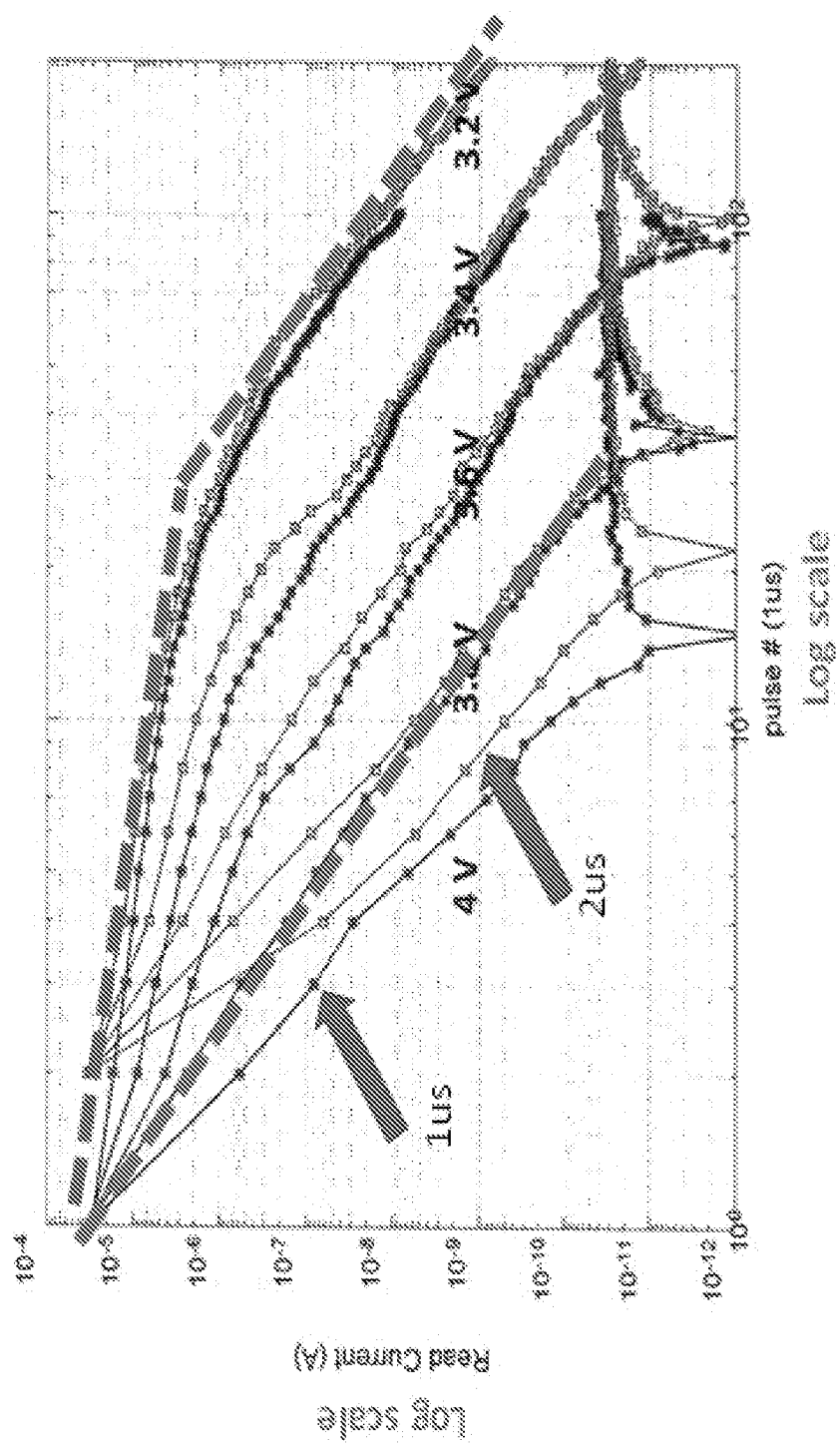
FIG. 10 illustrates measuring the slope of change in current (or state of the device) in a log-log plot where the y-axis is the log of current and the x-axis is the log of number of pulse (or pulse width).

Block 904 represents the third step—from the measured currents, measuring the slope of change in current (or state of the device) in a log-log plot where the y-axis is the log of current and the x-axis is the log of the number of pulses (or pulse width) (see FIG. 10).

Block 906 represents the fourth step- from the measured slope, estimating the number of pulses (or the width of a single pulse) needed to be applied to the device to either reach the final state or enter the subthreshold region.

Block 908 represents the fifth (optional) step- for the second case in block 906 (entering subthreshold), after entering subthreshold, applying several pulses and measuring the slope of change in the subthreshold region (as above, see FIG. 10).

FIG. 10 shows how the number of pulses or pulse width needed to reach the desired state can be determined from the slope, For some pulse widths and amplitudes, the change in the current of the device per each applied pulse is larger but the device still exhibits a single slope in all regions of operation. These pulses can be used to program the device into a vicinity of the target state(s) with a smaller number of pulses. Other pulse widths and amplitudes (with two slopes) can be used from this point to program the device into the precise target state. In some embodiments, 10 pulses can program the device into a reasonable vicinity of the target state. Therefore, one big contribution here is to observe the linear relation between device current and number of pulses or pulse width in log-log plot in subthreshold region (as shown in FIG. 10) and use this behavior to estimate the number of pulses or pulse width required to tune the state of the device with the target value.

Block 910 represents the sixth step- from the newly calculated slope, measuring the width of the pulse (or the number of fixed pulses) that need to be applied to the device to reach the final state.

Block 912 represents the seventh step- either applying the pulse calculated in Block 910 hoping to reach to the vicinity of the target state, or applying a slightly shorter or smaller pulse to program slightly above the target state and from there applying several short or smaller programming pulses to reach the final target state.

(2) Second Method:

A second method (e.g., algorithm) comprises repeating the first method but with erasure pulses, i.e. starting from the fully or partially programmed device and applying several erasure pulses and then observe the resulting change in the device state. From the changes, the slopes in the log-log plot may be calculated. From the slopes, the second method then estimates the width of the pulse that needs to be applied to program the pulse to the target state.

The second method is useful only in architectures that allow individual erasure. However, since usually erasure pulses require much wider pulses, in some embodiments the second method is not as fast as the first method.

The circuit of FIGS. 4A-4B, 7A and 7B can be programmed using the programming methods described herein. In this regard, programming circuitry and/or one or more processors 500 are connected to the circuit of FIG. 4A-4B, 7A or 7B (e.g., to one or more the transistors 704a, 704b, 708a, 708b in the array). In this embodiment, each of the transistors 704a, 704b, 708a, 708b in the cell 702 include at least a floating gate FG, 710 and a programming gate (e.g., CG, 712) coupled to the floating gate FG so as to control an amount of charge transferred to the floating gate during programming.

The methods can be implemented using programming circuitry and/or processors 500 connected to the circuit (e.g., circuit 700).

In one example, the programming circuitry implements a method for tuning a circuit including flash transistors having floating gates, comprising:

(a) applying one or more programming voltage pulses to each of the flash transistors in an erased state (Block 902), the voltage pulses each having width in a range of 100 nanoseconds to 5 microseconds and an amplitude in a range of 2.5 to 9 volts so as to control the amount of the charge programmed on the floating gate;

(b) measuring a slope of change in the output current outputted from each of the flash transistors in a log-log plot as a function of a number and/or width of the programming voltage pulses (Block 904); and (c) from the slope, estimating the number of programming voltage pulses (or the width of a single one of the programming voltage pulses) required for each of the flash transistors to enter a subthreshold regime or be programmed to a target state to within a predetermined accuracy (Block 906).

The method may further comprise:

(d) after entering the subthreshold operation regime, applying several additional voltage pulses to the flash transistors and measuring a slope of change in the output current in the subthreshold region (Block 908);

(e) measuring a width of the additional voltage pulses (or a number of the additional voltage pulses) required for the flash transistor to be programmed to the target state within a predetermined accuracy (Block 910); and (f) applying the number of additional voltage pulses, or applying the additional voltages pulses having a width shorter than the measured width in (e), or applying the additional voltages pulses having an amplitude less than the measured width in (e), so as to gradually approach the target state of the flash transistors to avoid erasing the flash transistors and having to repeat the method of steps (a)-(f) (Block 912).

In another example, the circuitry implements a method for tuning a circuit including flash transistors having floating gates, comprising:

(a) applying one or more erase voltage pulses to each of the flash transistors in a programmed state, the voltage pulses each having a width in a range of 100 nanoseconds to 10 milliseconds and an amplitude in a range of 4 to 15 volts so as to at least partially erase the charge programmed on the floating gate (Block 902);

(b) measuring a slope of change in the output current outputted from each of the flash transistors in a log-log plot as a function of a number and/or width of the erase voltage pulses (Block 904); and (c) from the slope, estimating the number of erase voltage pulses (or the width of a single one of the erase voltage pulses) required for each of the flash transistors to be erased to within a predetermined accuracy (Block 906).

In one or more examples, the method further includes:

(d) applying several additional voltage pulses to the flash transistors and measuring a slope of change in the output current in the subthreshold region (block 908);

(e) measuring a width of the additional voltage pulses (or a number of the additional voltage pulses) required for the flash transistor to be erased to within a. predetermined accuracy (Block 910); and applying the number of additional voltage pulses, or applying the additional voltages pulses having a width shorter than the measured width in (e), or applying the additional voltages pulses having an amplitude less than the measured width in (e), so as to gradually approach a target state of the flash transistors to avoid programming the flash transistors and having to repeat the method of steps (a)-(f) (Block 912).

In various examples, a target state is a state to which the flash transistors should be programmed for a particular application and is usually defined by the channel current at particular read conditions.

The programming and/or erase methods are generally applicable to any circuit, including but not limited to the circuits described herein.

Figure 11:
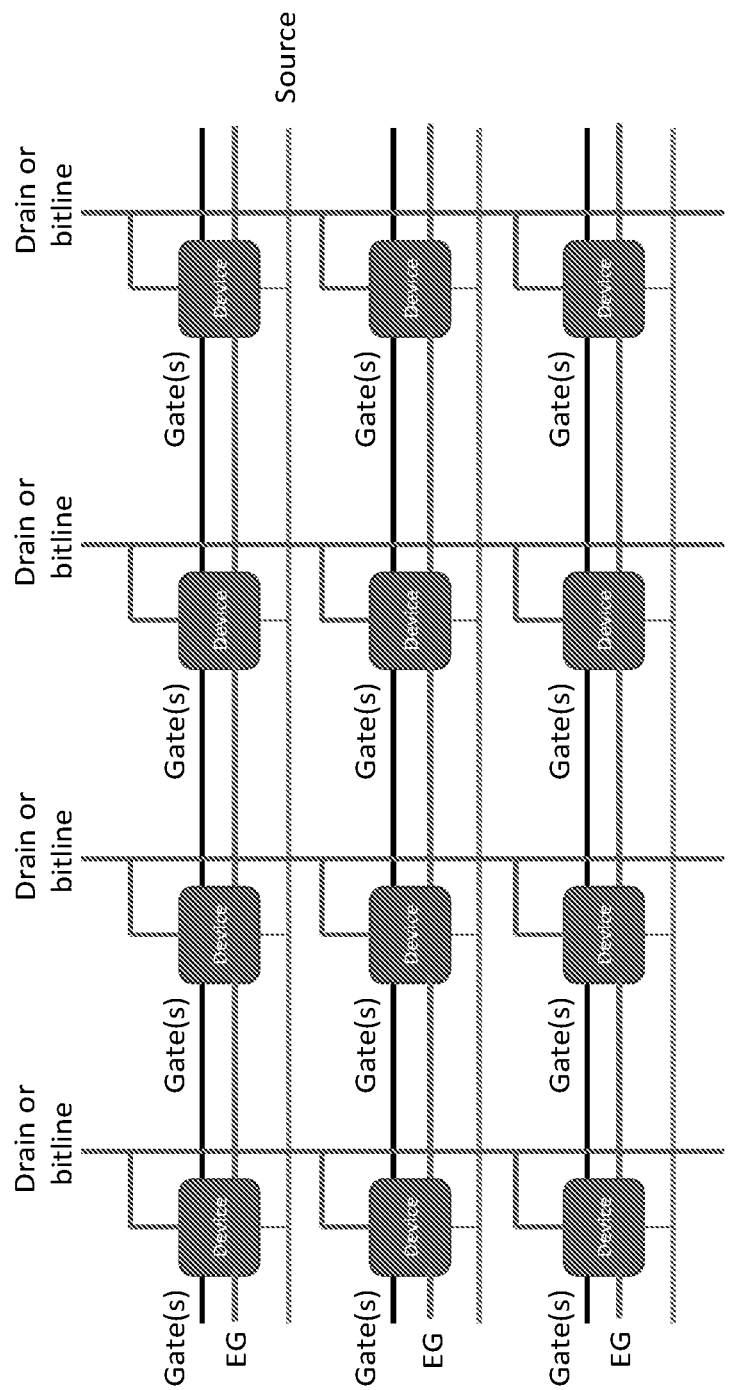
FIG. 11, Typical NOR memory array (excluding the row and column decoders, read circuitry, etc.)

V. ZigZag Routing of NOR Memory Arrays to Speed-Up Analog Programming While Maximizing the Area Density One simple way of implementing the arrays shown in FIG. 2C is by using commercially available NOR memory arrays such as the one shown in FIG. 11. In FIG. 11, Erase Gate (EG) and other gates can be a single or separate gates based on conventional technology. In some examples, the array comprises a supercell structure in which flash transistors are sharing the source line to increase density. However, a major problem resulting from use of this array to perform analog computation (such as VMM) is that all flash transistors need to be programmed with analog values (their channel current at read condition). While this can be performed by individually selecting devices and applying programming pulses to reach the target channel current for reading, if there is a programming error in the device in the array, all devices located in one row or block of the array need to be erased together and reprogrammed again while hoping that this time all devices will be reprogrammed correctly. For this reason, and because the erase gate is shared between all devices in a row (while the important figure of merit, erase gate voltage with respect to source, is also shared between all devices located in each row) NOR memory arrays are erased block by block. However, this block by block erasure can significantly increase the programming time of the array, especially when dealing with very large arrays used in analog applications (such as VMM) and when high weight accuracy is required.

Figure 12:
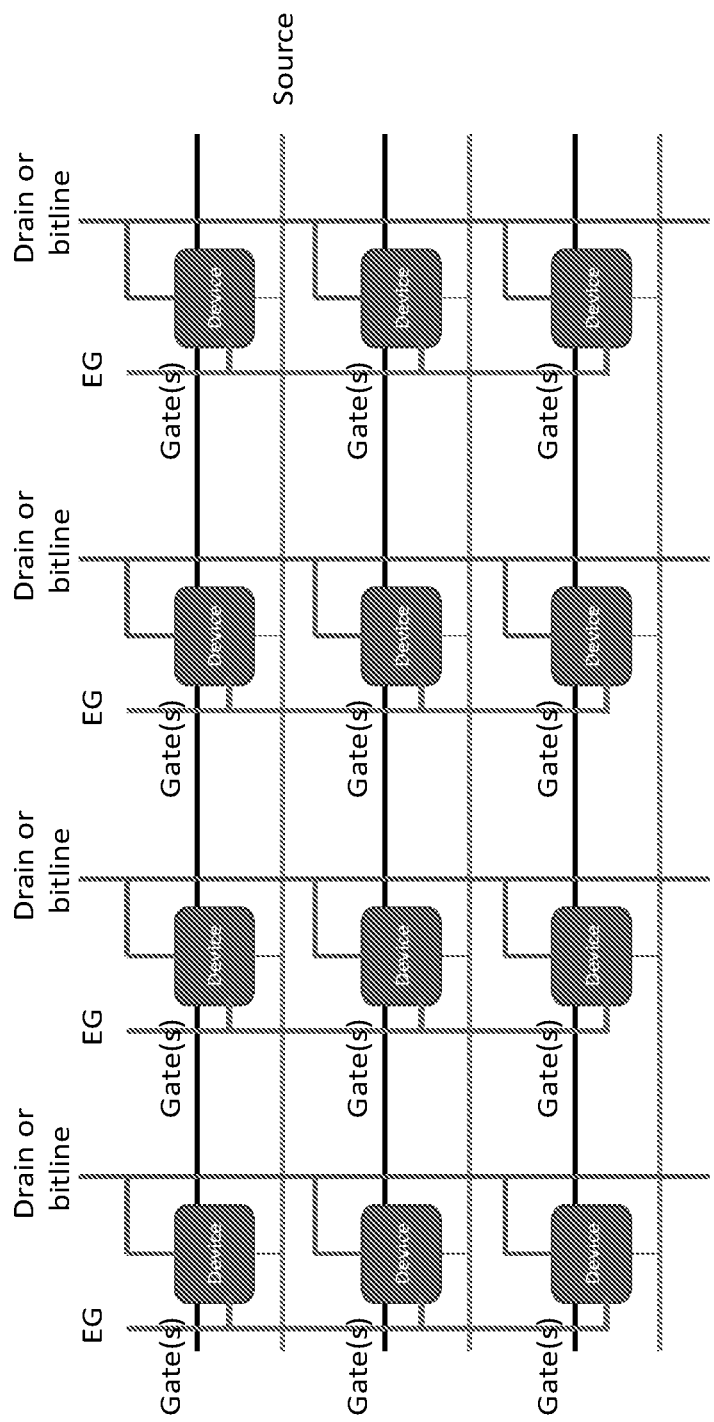
FIG. 12. Rotating erase gates to allow individual programming and erasure of devices.

One possible solution to this problem is to rotate erase gates and route them vertically rather than horizontally, as shown in FIG. 12. In this case, each device can be individually accessed and erased by applying proper voltages to the appropriate rows and columns of the array (although the voltage applied between EG and the source can be different for the selected device with respect to other devices, and other devices sharing the same erase gate can avoid erasure by raising their source voltage and applying appropriate voltages to their gates). The problem with this modification is that it remarkably reduces the area density of the array, because the erase gates (which were routed horizontally before with single poly layer) should be routed vertically with metal lines requiring much more area (particularly in embodiments using super cells).

Figure 13:
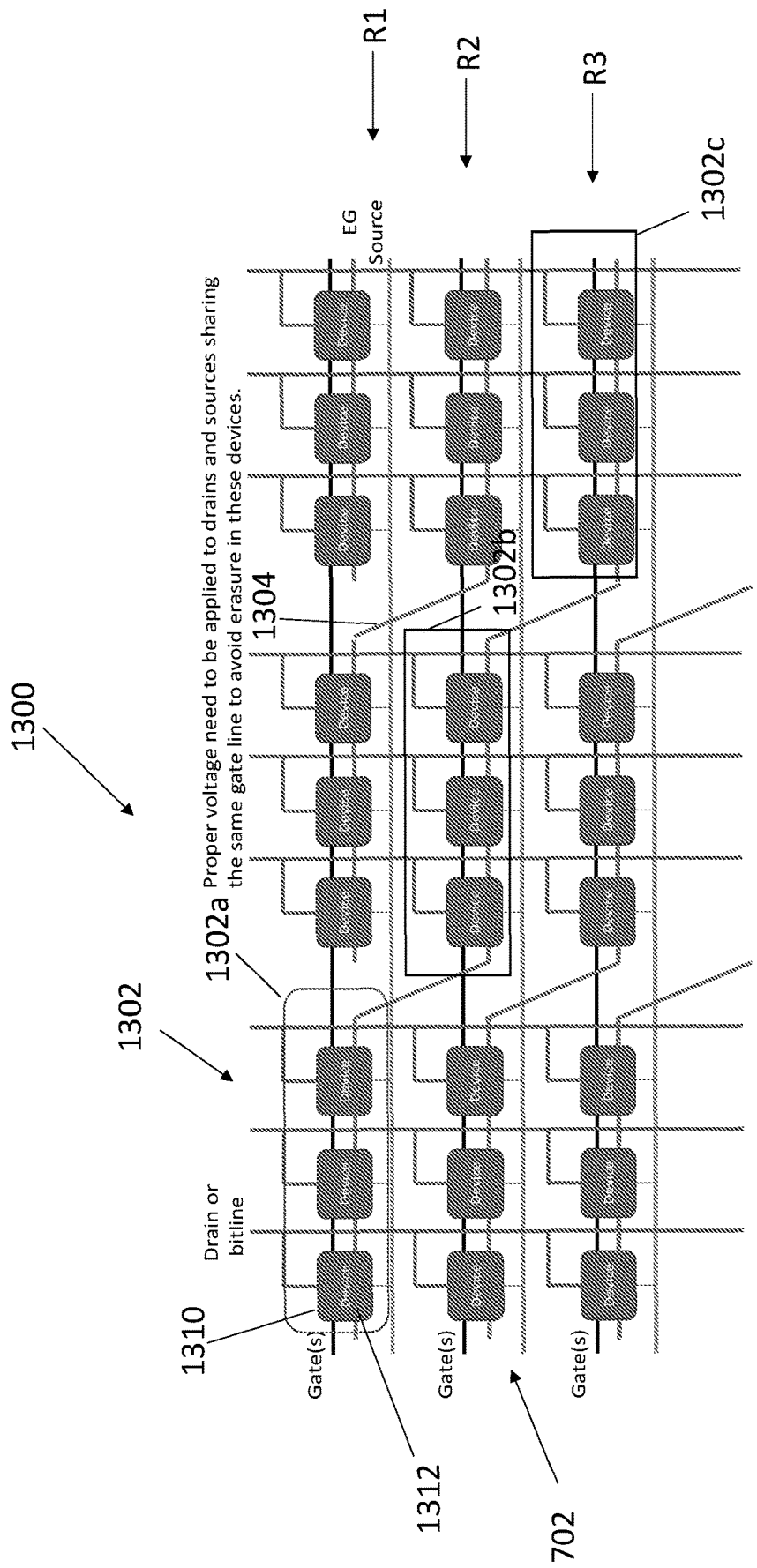
FIG. 13, Re-routing the shared gates responsible to erase the devices across different rows to allow faster programming of devices.

FIG. 13 shows a solution according to one or more embodiments of the present invention, wherein each large NOR memory array 1300 is divided into smaller blocks 1302 of NOR memory arrays and the routing of the erase gate (the gate responsible of erasing the device) is changed or moved or shifted after every block or every several columns of devices (e.g., transistors 704a). In one or more examples, the configuration of FIG. 13 includes the memory cells (e.g., 702, 706, 1310) or a plurality of transistors 1312 disposed in an array of rows R1, R2, R3 and columns, each of the transistors including a source (S), a drain (D), a channel between the source and the drain; a floating gate disposed over a portion of the channel, the floating gate controlling a conductivity of the portion in response to an amount of charge (electrons or holes) stored on the floating gate; and an erase gate comprising a gate coupled to the floating gate so as to fully or partially erase the amount of charge stored on the floating gate. Each row comprises a plurality of blocks 1302a, 1302b, 1302c each including a plurality of the transistors in the row. The array further includes a set of the blocks 1302a, 1302b, 1302c, the set comprising a block 1302a, 1302b, 1302c in each of a plurality of different rows R1, R2, R3; and a first line 1304 moving across the rows so as to electrically connect together the erase gates in the set of blocks, so that all the erase gates in the set of blocks are at a same voltage potential.

The advantage of this architecture is that the devices can be programmed one device at a time like regular NOR memory array (since EG routed in zigzag form is not used for programming). However, if there is a need to erase a device in the array, only several devices in one row building a block (highlighted, or those in a given block 1302a) need to be erased together (i.e., devices sharing the same source line and erase gate). This does not alter the state of the other devices and only those highlighted devices (in a given block 1302a) need to be reprogrammed again. The other devices outside the block 1302a sharing the same EG may avoid erasure if appropriate voltages are applied to the bit lines, their other gates, and source lines, because these terminals in the other devices are not shared with devices that were selected for erasure.

Moreover, for erasing, the most significant parameter is the voltage difference between the erase gate and one or two other terminals of the device. Therefore, when implementing cross row routing (e.g., zigzag routing), the erase gate should be rerouted (with respect to the one or more terminals that impact erasure) so that voltages applied for erasure are not shared with other non-intended devices.

Figure 14:
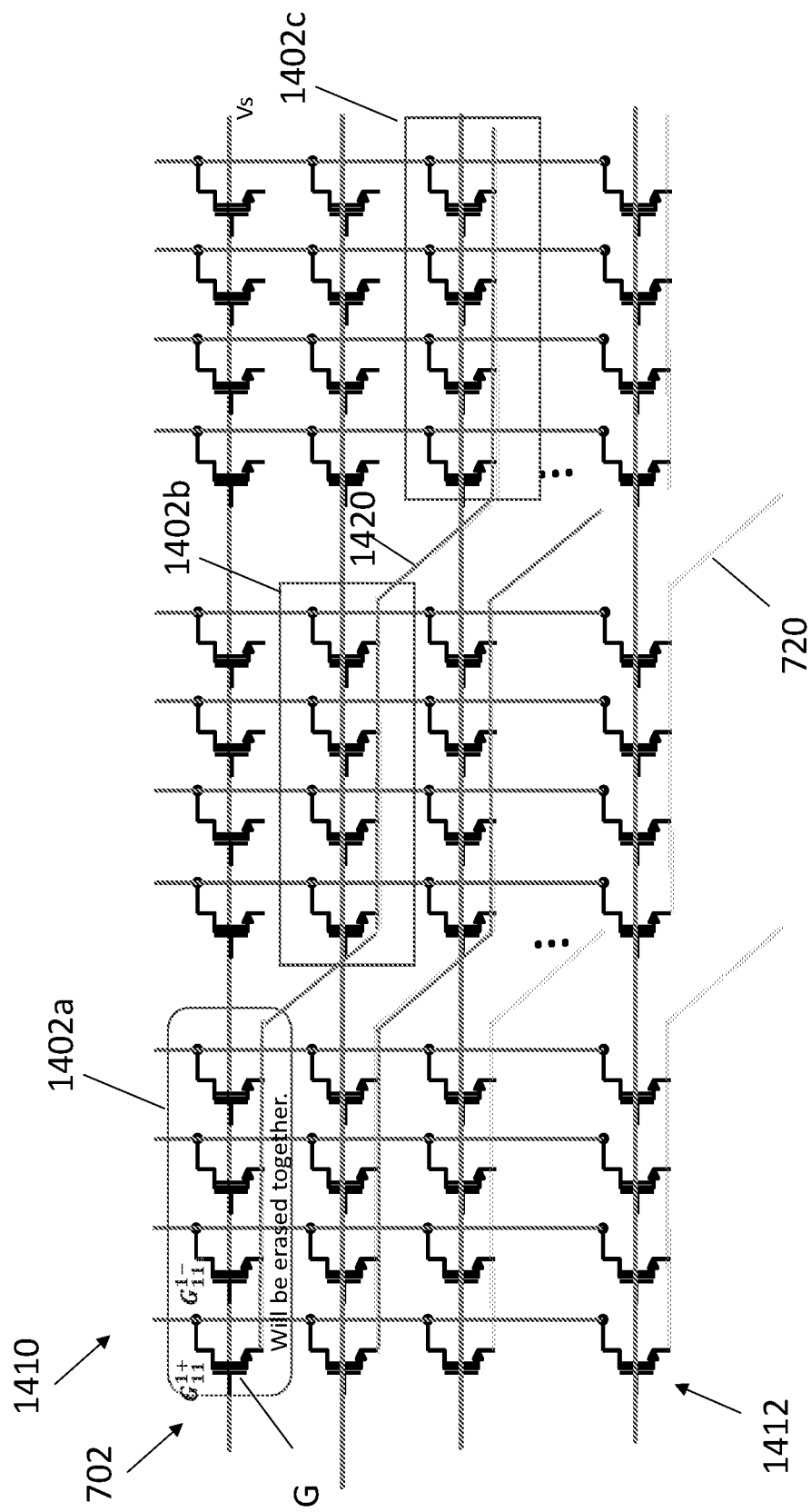
FIG. 14, rotating or re-routing the shared source lines across different rows to allow faster programming of devices.

In another example illustrated in FIG. 14, the source line 720 is rerouted across multiple rows instead of the line connecting the erase gates, resulting in the same functionality achieved using the architecture in FIG. 13. Specifically, FIG. 14 illustrates memory cells (e.g., 702, 1410) or a plurality of transistors 1412 disposed in an array of rows R1, R2, R3 and columns, each of the transistors including a source (S), a drain (D), a channel between the source and the drain; a floating gate disposed over a portion of the channel, the floating gate controlling a conductivity of the portion in response to an amount of charge (electrons or holes) stored on the floating gate; and an erase gate comprising a gate coupled to the floating gate so as to erase the amount of charge stored on the floating gate. The array includes a first line 720, 1420 electrically connecting together the sources in the set of blocks 1402a, 1402b, 1402c comprising one block in each of the plurality of different adjacent rows, so that all the sources in the set of blocks 1402a, 1402b, 1402c are at a same voltage potential. Although the example is illustrated for n-type transistors, a similar concept may be applied for p-type transistors (in which case the first line electrically connects the drains.

Moreover, in one or more examples, the rerouting (e.g., moving or shifting) of the EG or SL is independent of how other gates or BL are routed.

Similarly, the rerouting concepts illustrated herein may be applied to flash technologies having only one gate terminal. In this case, since the erasing of the device is achieved using the WL (the only gate of the transistor), the WL terminal is routed across multiple rows (e.g., routed to an adjacent row after a plurality of columns, e.g., in a zigzag fashion).

Figure 15:
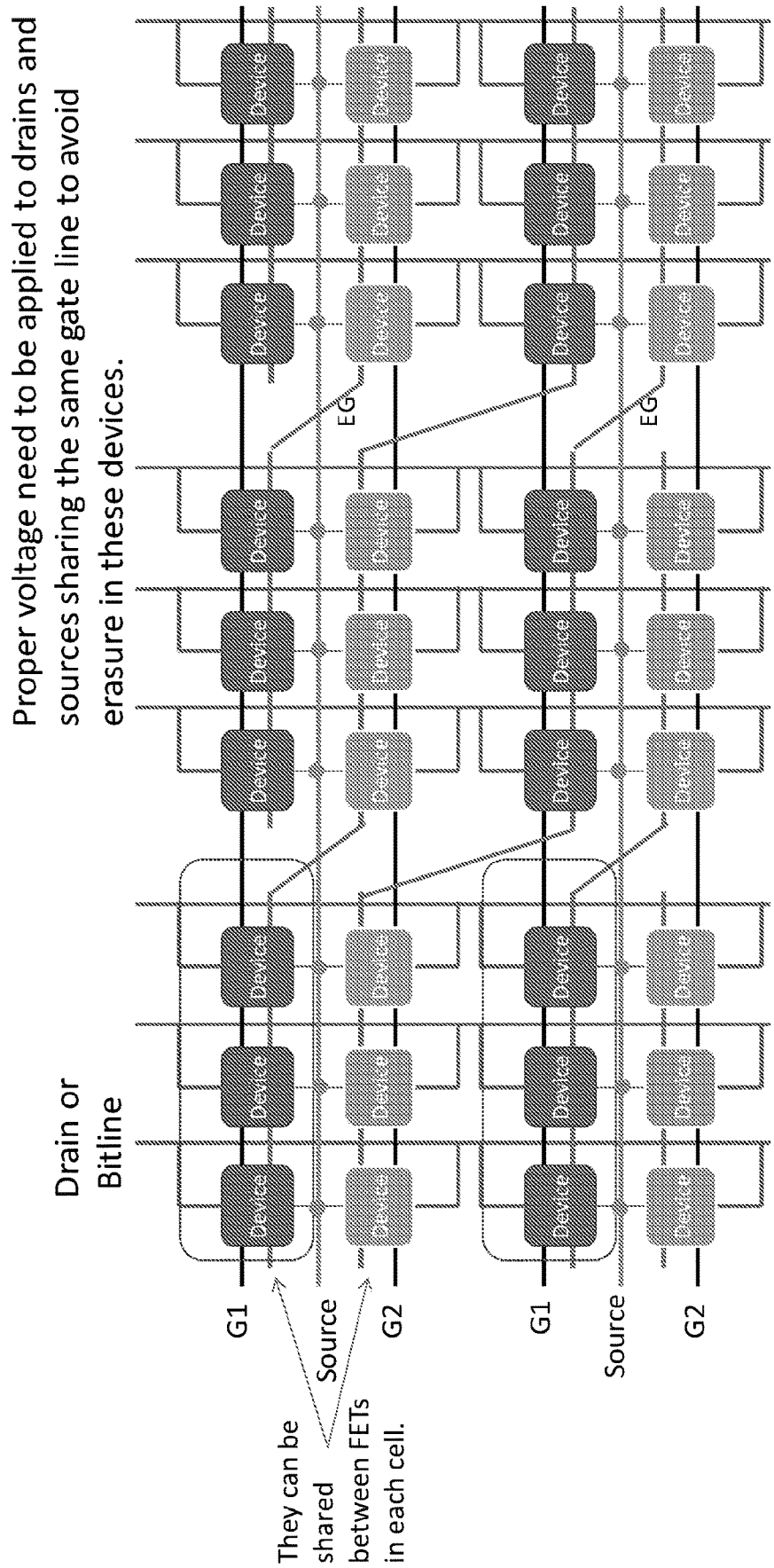
FIG. 15. Re-routing or rotating erase gates in architectures using supercells (devices sharing source and bit lines) to allow faster programming of devices.

As discussed above, some flash technologies utilize two transistors sharing the source line and bit line to increase the density of the array (as shown in FIG. 15). Such an architecture is called supercell. However, rerouting following a concept similar to that discussed in this section may also be applied to this array, even when the erase gate is shared between the devices forming the supercell (one erase gate for every two cells). In this case, the erase gate for every two cells can be routed to the next row, e.g., in a zigzag format. Furthermore, this cross-row (e.g., zigzag) routing on the EG has no impact on the performance or functionality of the array since it is used only for erasing the cells (therefore, these arrays can be used as they were used before the re-routing). Moreover, the zig zag rerouting has no effect on the method for programming the devices (because the EG is not used for device programming or the voltage on the EG is kept fixed). If the voltage on the EG is kept fixed, it is not important how the EG is routed because the same voltage is being applied to all EGs during programming or operation.

Moreover, only a very small area is wasted when implementing the cross row (e.g., zigzag) routing of the EGs and the remainder of the array can, in one or more embodiments, retain a maximum density (close to the density of the original NOR memory array).

Figure 16:
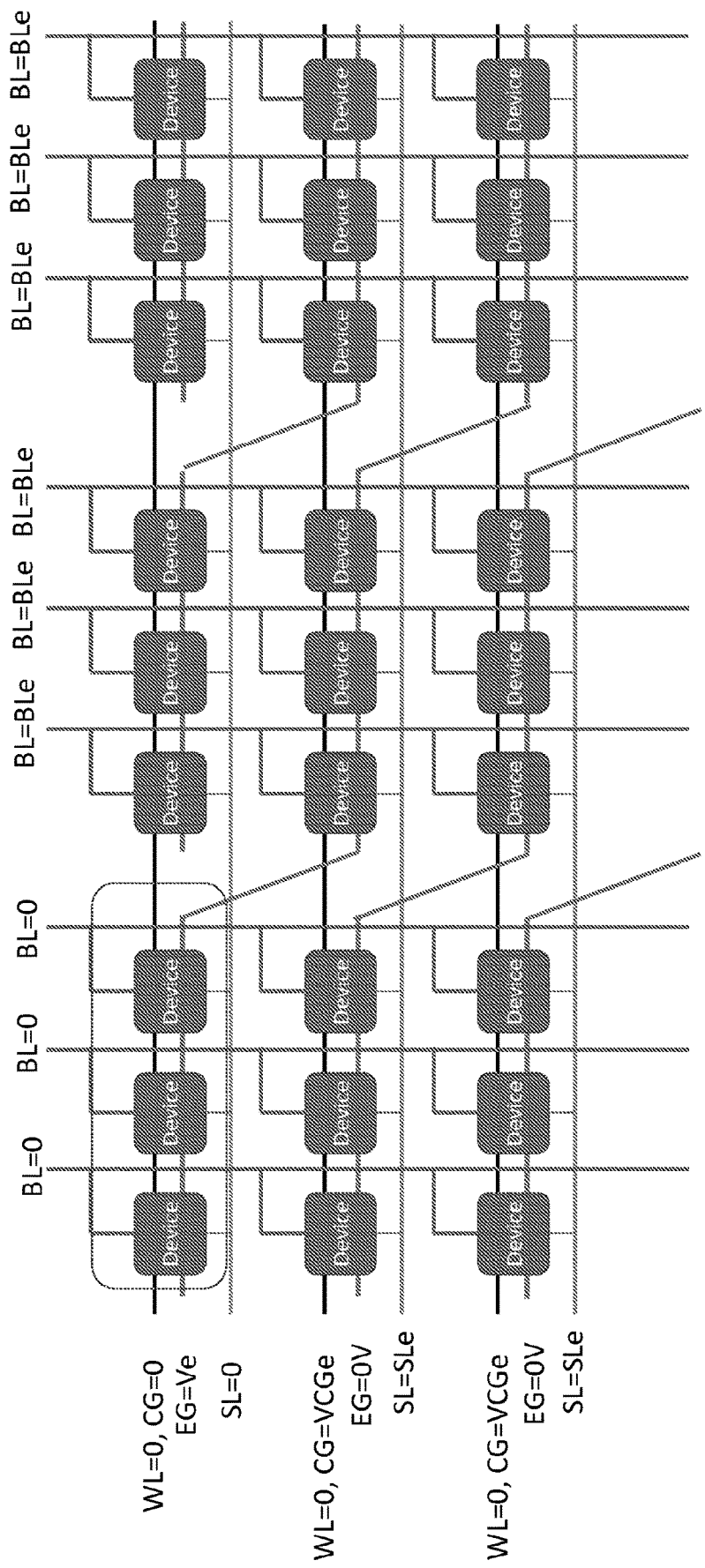
FIG. 16. A nonlimiting example of how a small number of devices can be erased in the array without altering the state of other devices, thereby avoiding erasure of other devices sharing the same EG.

FIG. 16 shows a non-limiting example of a method in which several devices can be erased without altering the state of the other devices.

The re-routing techniques are generally applicable to any circuit, including but not limited to the circuits described herein.

VI. Neural Network with Nonlinear Synaptic Weights Implemented with Nonvolatile Memory Devices 1. Introduction Usually neural networks are implemented using linear weights which implement the linear operation of multiplication between the input and synaptic weight i.e. y=x*w (by which the Vector-by-Matrix Multiplication (VMM) modules used frequently in neural networks are implemented).

Implementation of this operation in hardware (digital or even analog) is time consuming, slow, power hungry and takes lots of area on chip, even when implemented in the analog domain using Non-volatile Memory (NVM) devices (such as a memristor or flash transistor), because the circuits need to be designed such a way that the whole circuit and devices are operating in a linear region to implement linear multiplication.

This section of the present disclosure describes new sets of analog networks implemented with nonvolatile memory devices that use nonlinear weights performing complex operations rather than a simple multiplication and show that the network can be implemented more efficiency using emerging nanoelectronic memory devices (e.g., memristors, flash transistors, etc.) when the device's inherent nonlinear properties are being used. Also illustrated herein is how these networks have an advantage that their neuron circuitry can be implemented much more efficiently.

In a conventional NN (FIG. 17), each synaptic weight acts as a gain so when the signal passes through a weight, its amplitude is multiplied by the weight (linear multiplication of x*w). These values are then added together in the neuron circuitry (another linear operation, i.e. addition). Therefore, each layer of neural networks is a simple VMM. Although the operation is simple, its implementation is not that easy.

Figure 17:
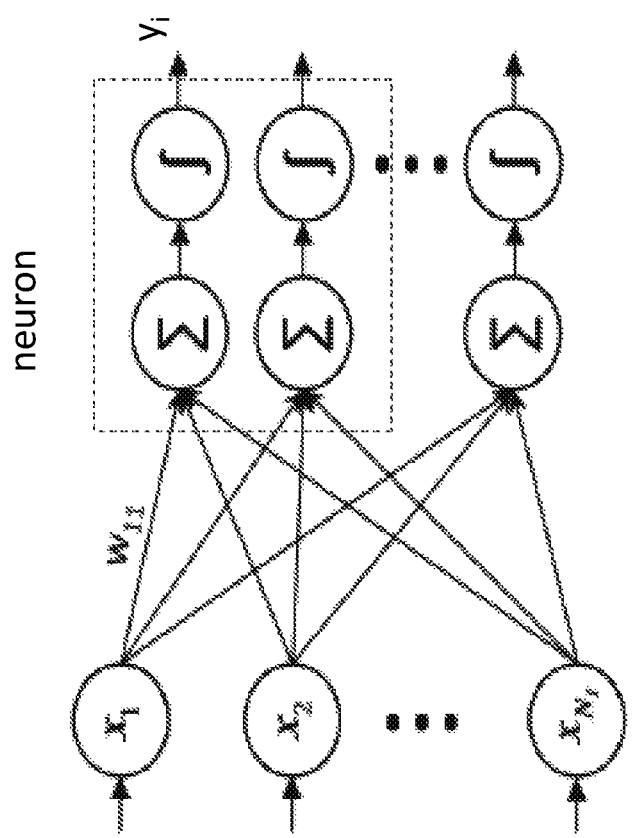
FIG. 17 illustrates conventional neural networks with linear weights.

FIGS. 18-20 illustrate how the network of FIG. 17 performing VMM is conventionally implemented in analog with NVM devices. Inputs are applied as a voltage so that each device is doing a linear multiplication between the applied input and its weight (which is usually a conductance of a device). Summation of multiplication results are performed in current mode usually by using an operational amplifier (FIG. 20) and then the activation function (FIG. 19) is applied to the result. Each weight is represented by two positive weights so their subtraction (for example) can generate negative weight ($G=G^+-G^-$). In other words, in neuron circuitry, the incoming current is subtracted to obtain $G=G^+-G^-$ and then the activation function is applied to the output of the neuron. In a similar way, the linear VMM module can be implemented using floating-gate or flash transistors in which synaptic weights are stored in these NVM devices.

Figure 21:
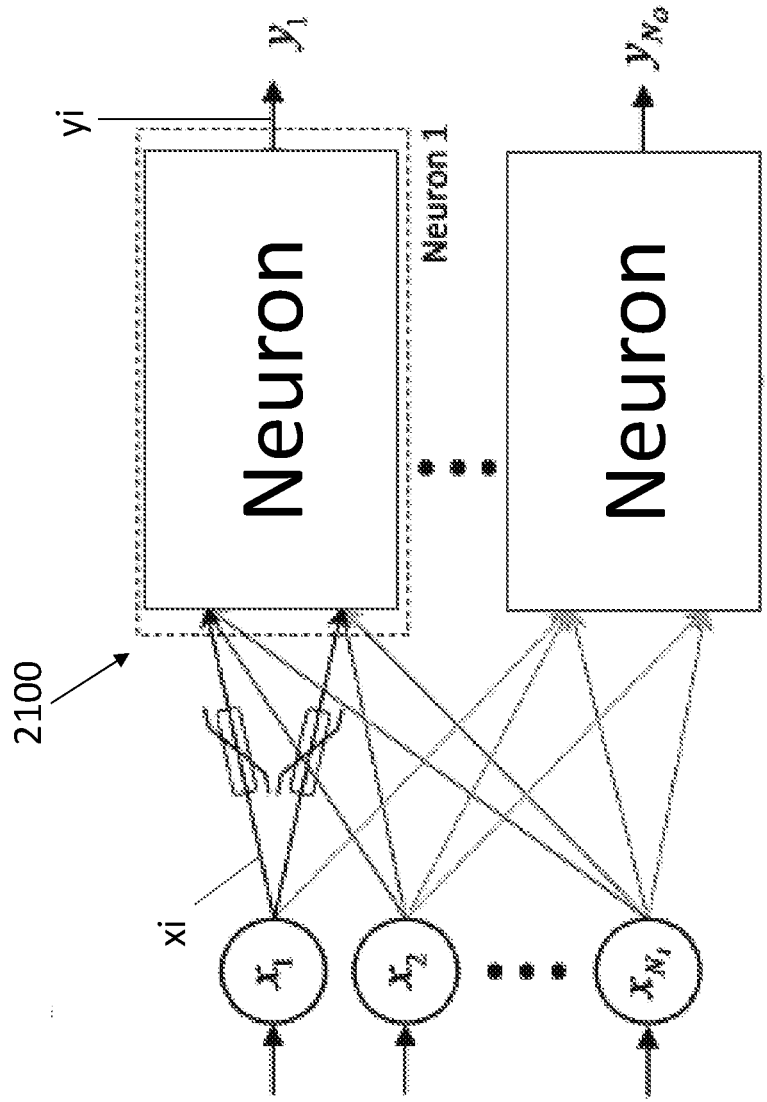
FIG. 21 illustrates a neural network according to one or more embodiments of the present invention.

FIG. 21 illustrates a neural network according to one or more embodiments of the present invention. In the most general case, the following assumptions are made.

- First assumption. The synaptic function is any nonlinear function, i.e. $g_1(x_1, w_{1i})$ depending on the input and its internal state w, where for the linear synaptic weight the function is $x_1*w_{1i}$.
- Second assumption. The neuron circuitry doesn't need to only do the summation of the inputs. Instead the neuron circuitry can do complex operations i.e. h(coming inputs).
- Third assumption. The activation function may or may not add nonlinearity to the network. In one or more examples, allowing the neuron circuitry to be nonlinear enables removal of the activation function provided that the neuron circuitry adds sufficient nonlinearity to the network.

Figure 22:
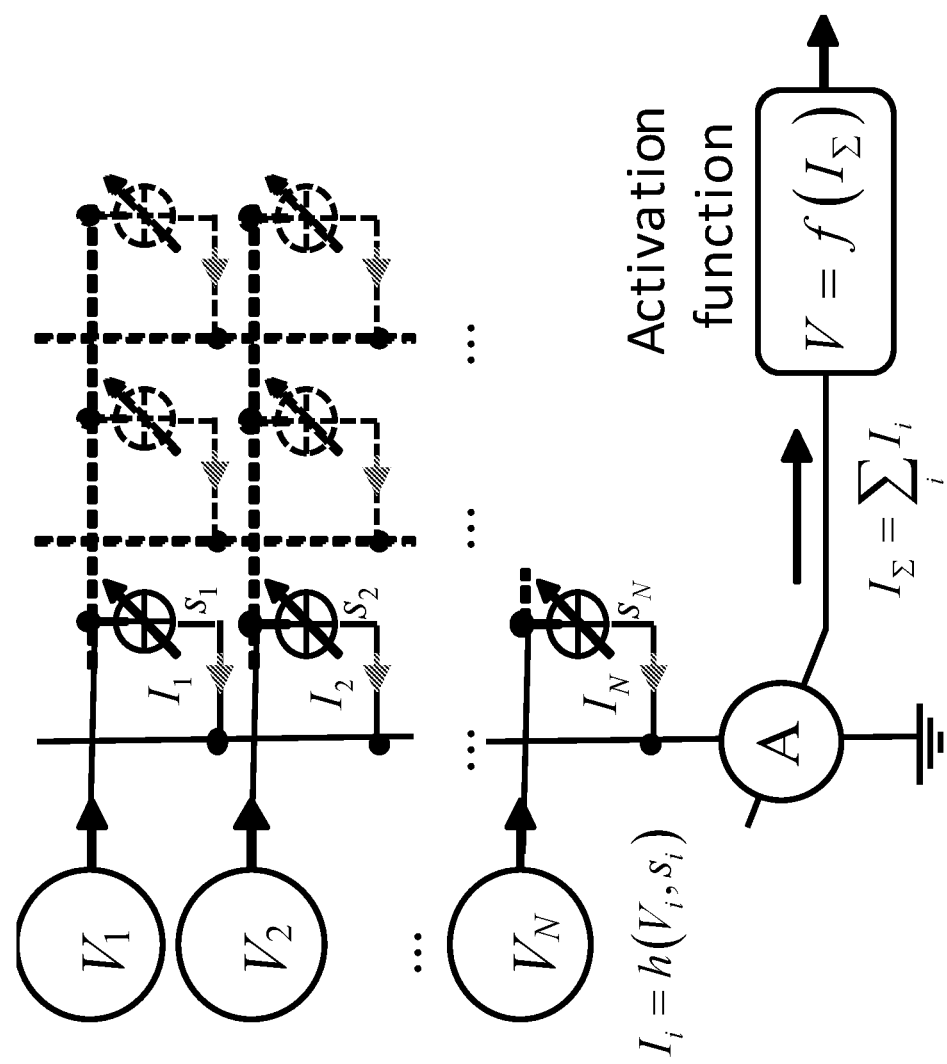

2. Example Architectures Creating Neural Networks with Linear and/or Nonlinear Devices and Neurons FIG. 22 illustrates a circuit example wherein inputs are applied directly to devices and the neuron circuitry adds input currents and applies activation function.

Figure 23:
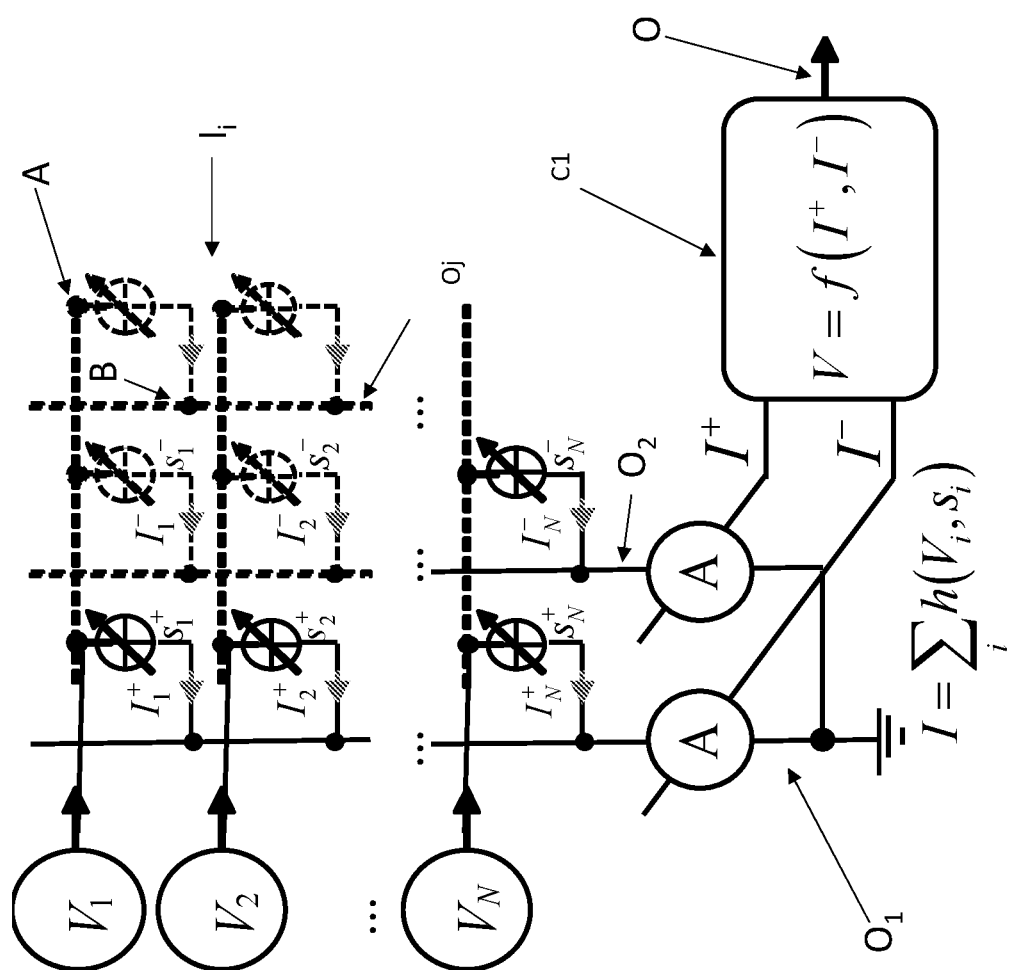
Figure 24:
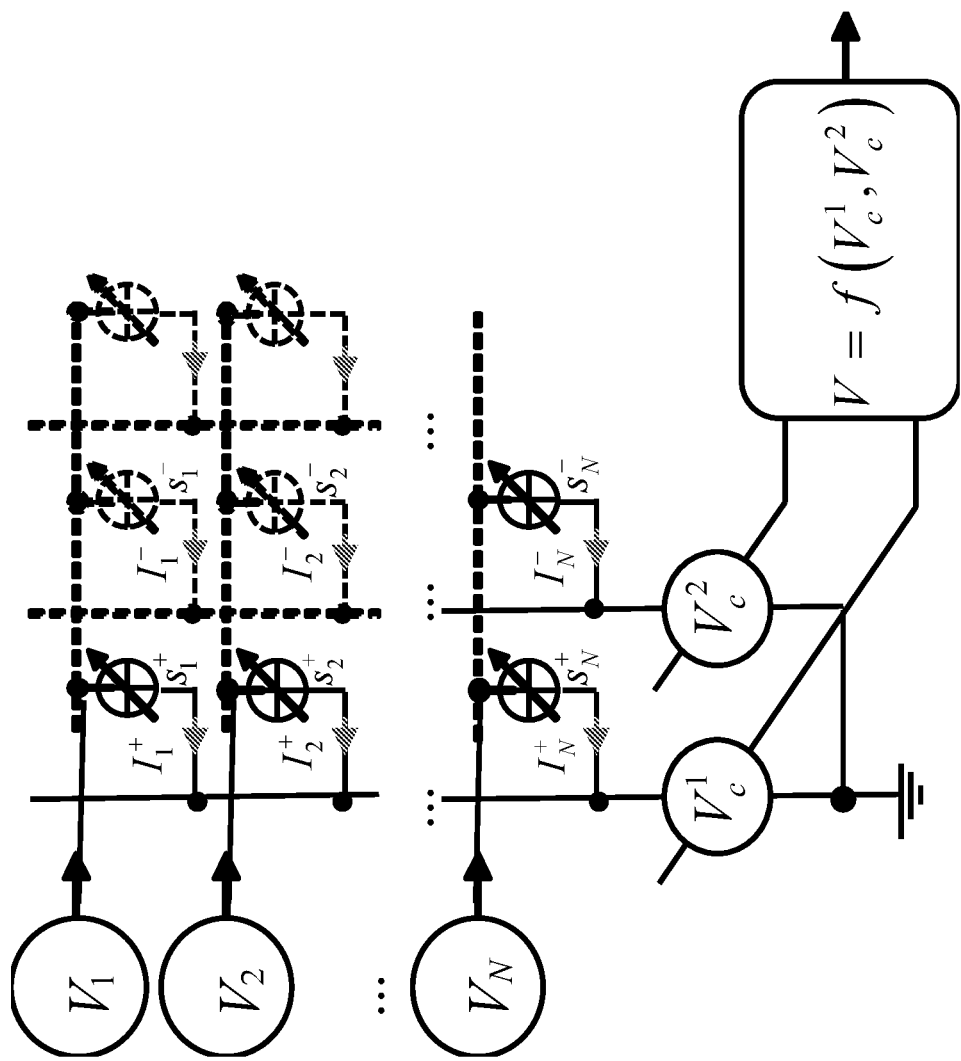

FIG. 23 illustrates a circuit example wherein inputs are applied directly to devices and weights are implemented differentially by subtracting measured currents FIG. 24 illustrates a circuit example wherein inputs are applied directly to devices, columns are left floating, their voltages are measured, and the output is a function of these voltages.

Figure 25:
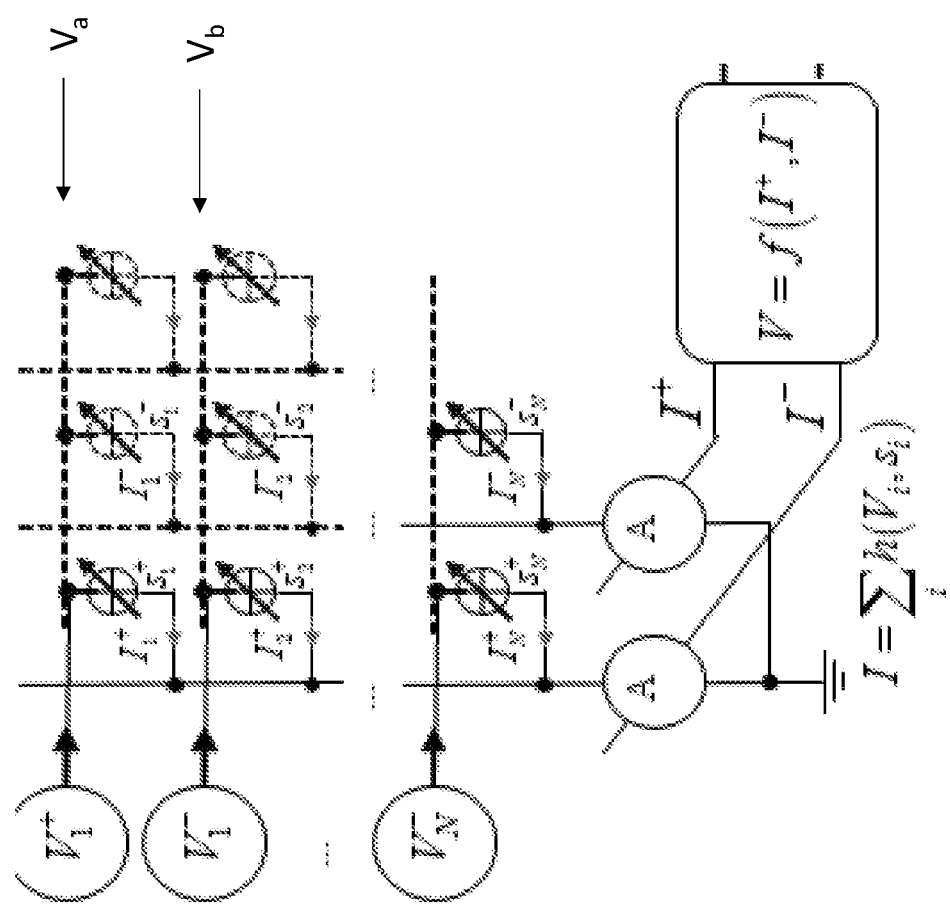

FIG. 25 illustrates a circuit example wherein inputs are applied directly but differentially to devices, and output currents are also measured differentially.

Figure 26:
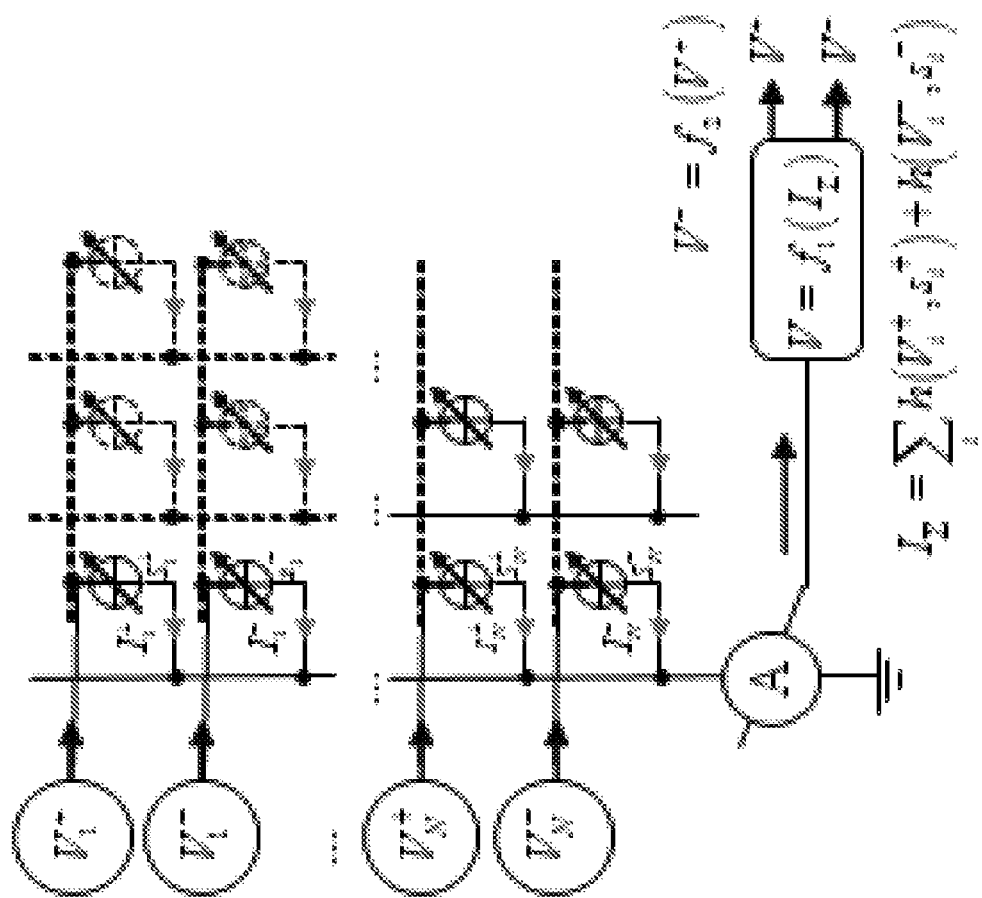

FIG. 26 illustrates a circuit example wherein only inputs are applied directly to devices differentially, so each weight is implemented with two devices. A nonlinear function is applied to the measured current.

Figure 27:
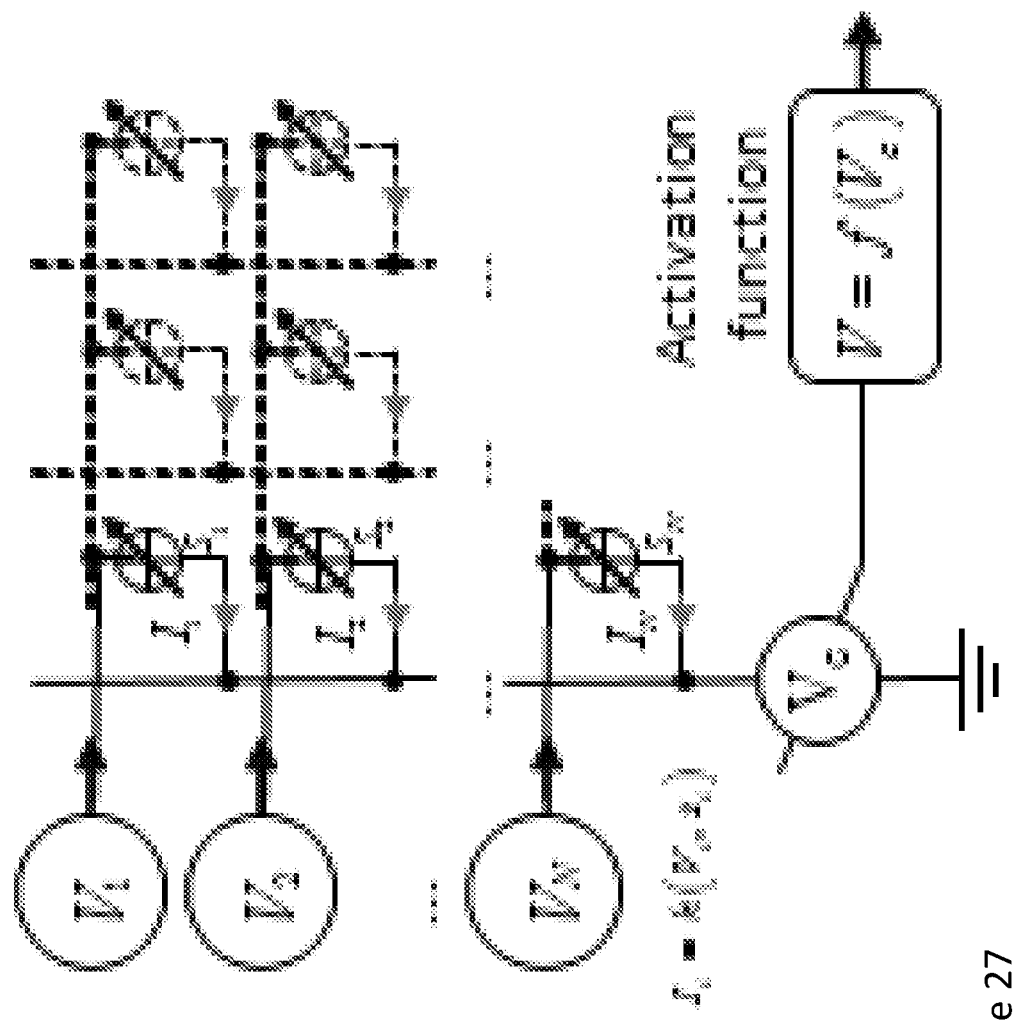

FIG. 27 illustrates a circuit example wherein inputs are applied directly as voltage, columns are left floating, and the nonlinear activation function is applied to the measured voltage of the column.

Figure 28:
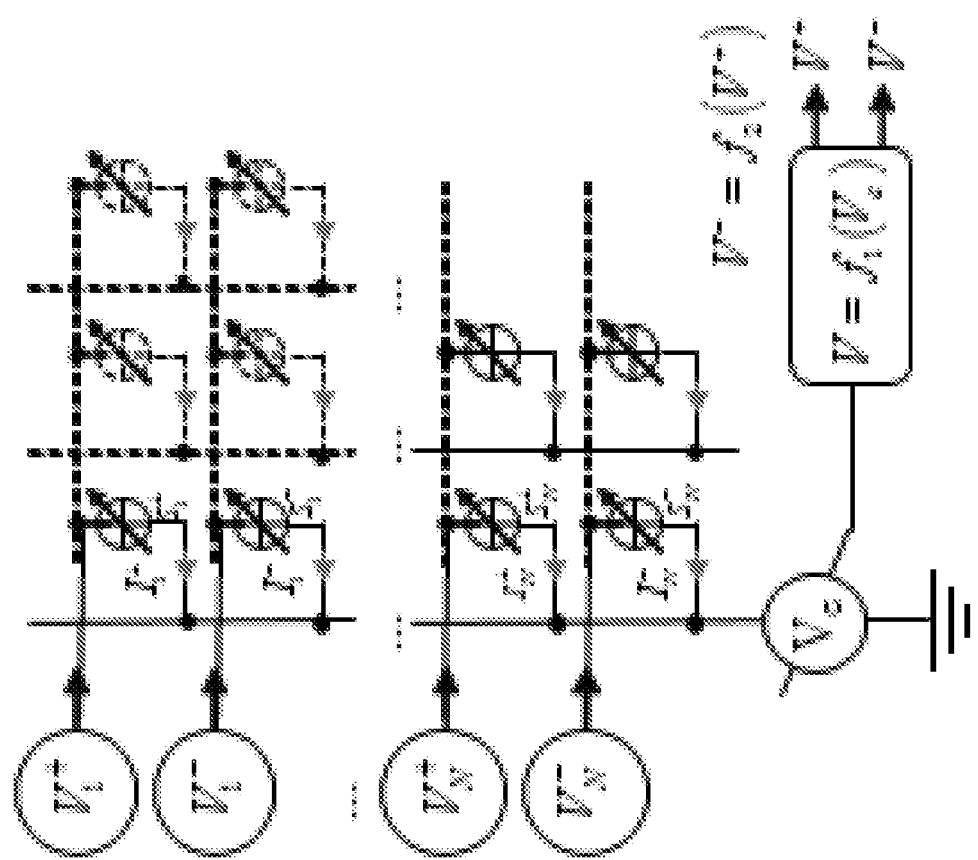

FIG. 28 illustrates an example wherein the inputs are applied directly as voltage but differentially, columns are left floating, and the nonlinear activation function is applied to the measured voltage of the column.

Figure 29:
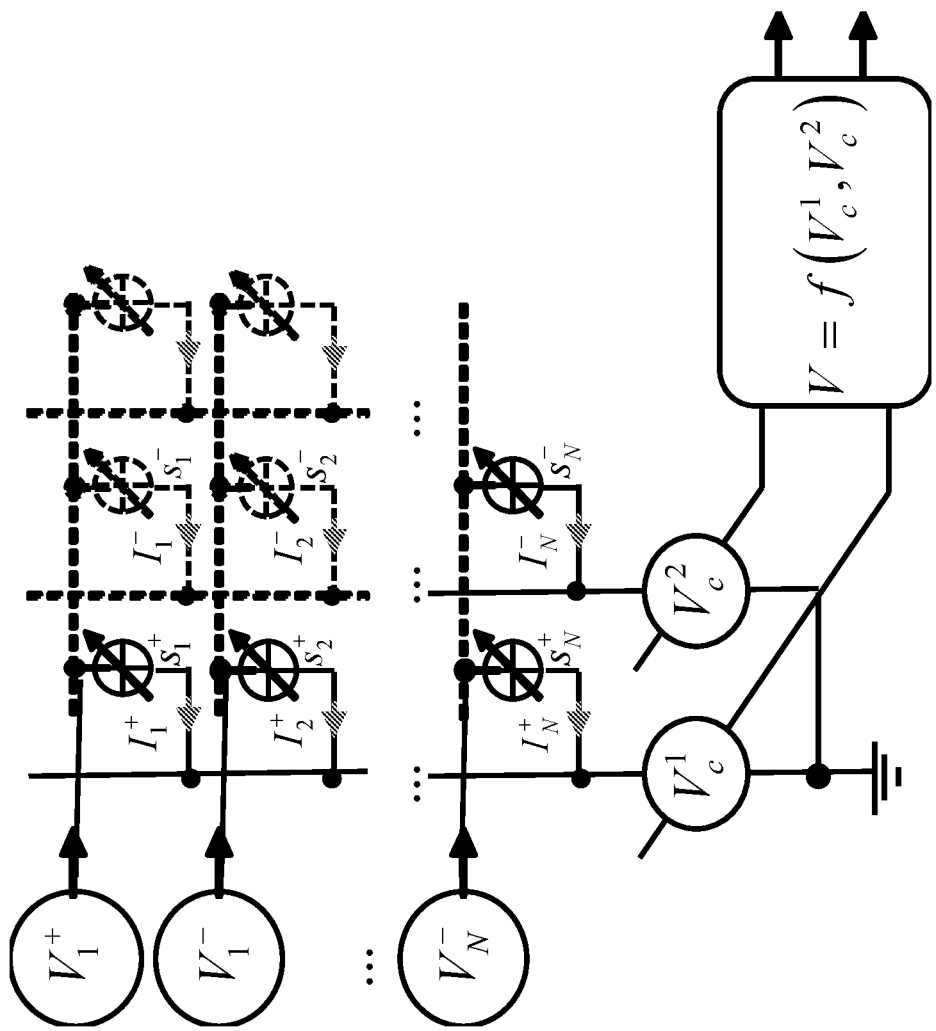
Figure 30A:
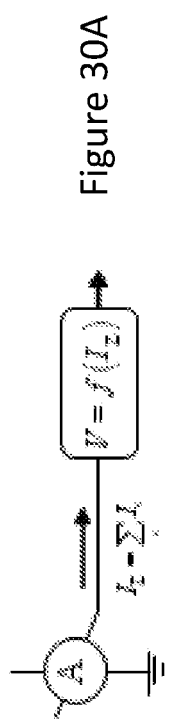
FIG. 30A shows an element measuring the current going to the virtually generated voltage (low impedance input). A nonlinear activation function can then be applied to the measured current.
Figure 30B:
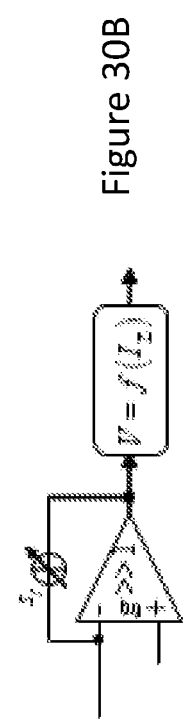
FIG. 30B illustrates an example of how the above circuit of FIG. 30A can be implemented with an operational amplifier (opamp) using a linear or nonlinear feedback element.
Figure 30C:
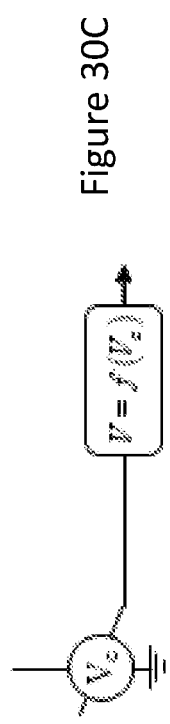
FIG. 30C illustrates an element measuring the voltage of a node (high impedance input). A nonlinear activation function can then be applied to the measured voltage.
Figure 30D:
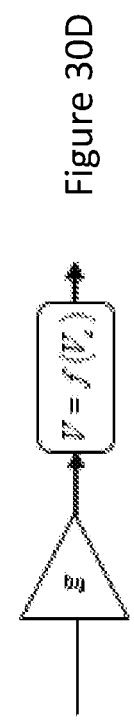
FIG. 30D illustrates an example of how the above element of FIG. 30C can be implemented by using the buffer to isolate the output impact on the input. The activation function can then be applied.
Figure 30E:
FIG. 30E illustrates the Nonlinear or linear nonvolatile memory (NVM) device storing network parameters and performing computation in exemplary circuits described herein.

FIG. 29 illustrates an example wherein inputs are applied directly as voltage but differentially, columns are left floating, and the nonlinear activation function is applied to measured voltage of the column differentially.

In all the circuits illustrated in FIGS. 22-29, inputs are applied as voltages either directly or in differential mode. However, the differential input can be in the form of x and −x or in the form of x and f(x), for example. Moreover, for all of these networks, larger networks can be created by concatenating these single-layer networks (connecting the output of one layer to the input of another layer).

FIGS. 30A-30E illustrate further details of the circuits illustrated in FIGS. 22-29 showing examples of how the current or voltage sensing circuits can be implemented.

3. General Nonlinear Neural Networks with NVM Devices a. Case Example 1

Figure 31:
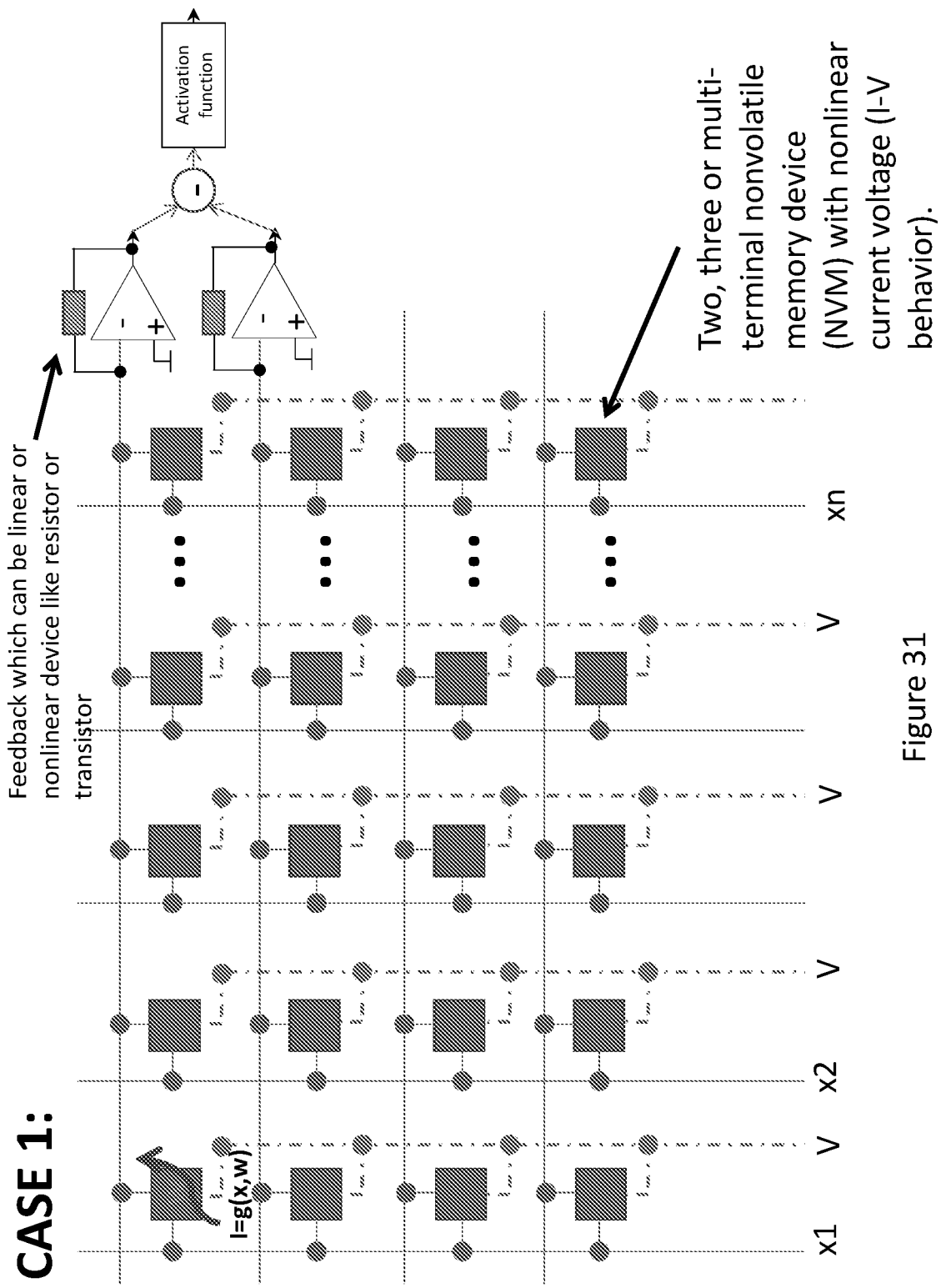
FIG. 31 illustrates a nonlinear neural network circuit including NVM devices and operational amplifiers (opamps), according to one or more embodiments, the NVM devices having two, three or multi-terminal and nonlinear current voltage (I-V) behavior and the opamps having linear or nonlinear feedback.

In the case example architecture illustrated in FIG. 31, each weight is implemented with a two or multi-terminal NVM devices in such a way that when the input is applied as a voltage to the device terminal, the current generated by a device will be a nonlinear function of input and their internal tuned state. Sine the currents of the NVM devices are unidirectional, in order to generate both positive and negative weights, each weight is implemented with two devices and the outputs are produced based on the currents of two adjacent rows.

The synaptic weights are nonlinear but neuron circuitry performs the linear operation of adding all currents. The feedback element of the opamp can be a linear (like a simple resistor) device and/or a nonlinear device (like a transistor). Application of the activation function after the neuron circuitry is optional since nonlinearity is achieved in the system through nonlinear weights and possibly using the nonlinear device as a feedback element of opamps.

For the case where the WM is a memristor, the input voltages are applied to the other terminal of the device but the voltage is high enough (still below the threshold of the device) to put the devices in their nonlinear operating region. For three terminal flash devices, the input can be directly applied to the gate while the drain is connected to a fixed bias. For multi-gate flash transistors, the input can be applied to either of the gates (or to all) while a fixed voltage is applied to drain and/or other terminals.

b. Case Example 2

Figure 32:
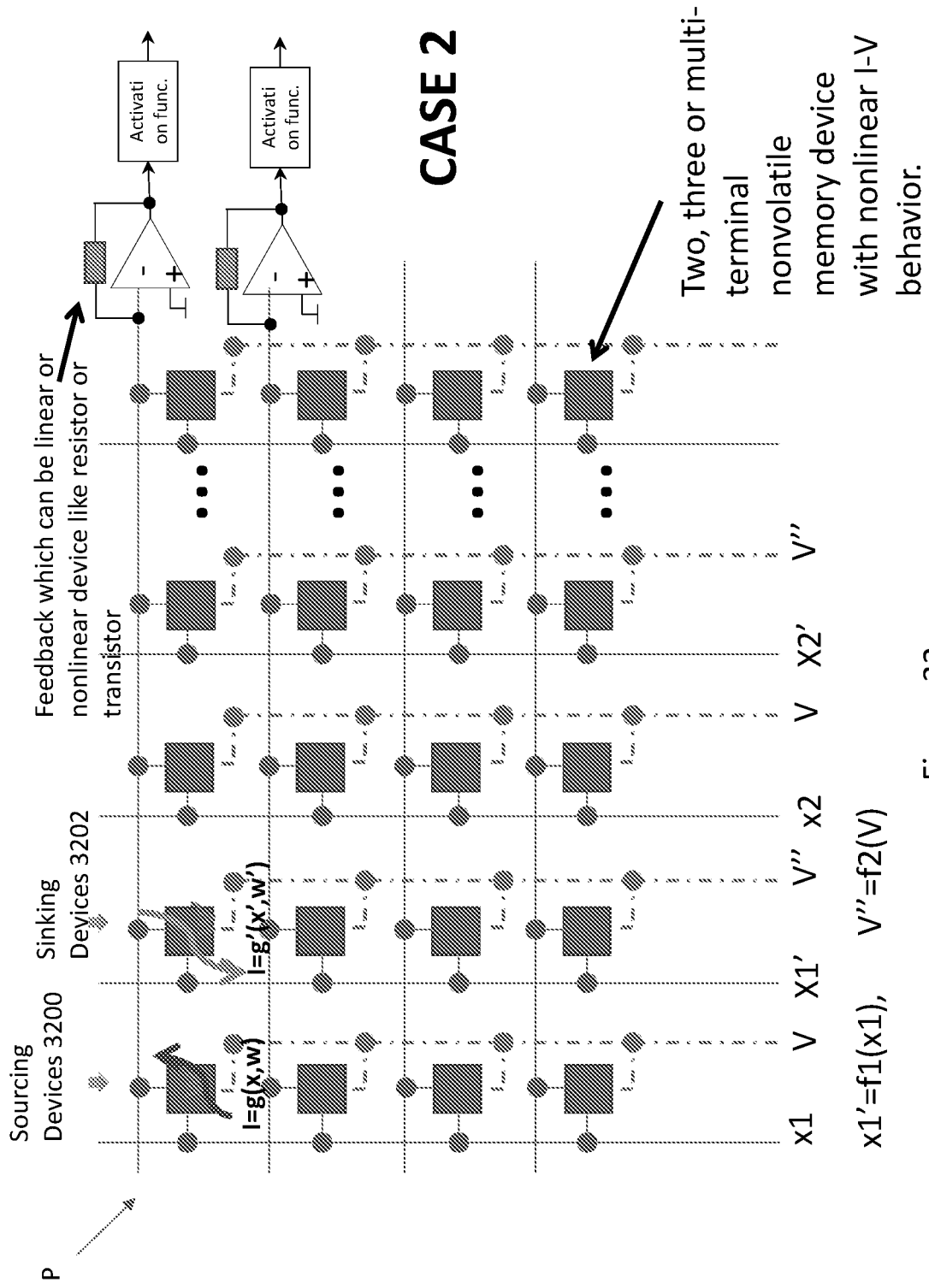
FIG. 32 illustrates a nonlinear neural network circuit including NVM devices and operational amplifiers (opamps), sourcing devices, and sinking devices, according to one or more embodiments.

FIG. 32 illustrates an example circuit wherein, in order to avoid implementing synaptic weights differentially by subtracting currents at neuron circuitry, the circuit also includes NVM devices in a configuration that sinks current instead of sourcing current. In other words, inputs are applied differentially rather than computing output differentially. In this case, each weight is again implemented differentially with two devices but one is biased in such a way that it will source current to the shared row, while the other device is biased to sink current from the shared row. Again, the neuron adds up the current and then transfers it linearly or nonlinearly (based on the used feedback element: resistor for linear and transistor for nonlinear) to voltage to be directly used as an input in the next layer of the neural network. The feedback element should be implemented such that it can handle both positive and negative currents.

For the case where the NVM devices are resistive switching devices, differential inputs means applying x to one column and -x to another column. However, the amplitude of x is large (below the threshold on these devices) so the devices will operate in a nonlinear region.

For the case where the NVM devices are flash transistors:
- for current sourcing devices, n-type metal-oxide semiconductor (NMOS) flash transistors can be used (applying input to one or all of the gates as in case 1) and
- for current sinking devices there are a plurality (e.g. two) choices:
  (i) use the NMOS flash transistor and apply voltages to the NMOS transistor's drain and gates in such a way that the NMOS transistor sinks current rather than sourcing current or
  (ii) we use PMOS flash transistors and bias them properly. In both cases, the input to these current sinking devices might be different from x but will be a function of x which can be determined by simulation.

c. Case Example 3

Figure 33:
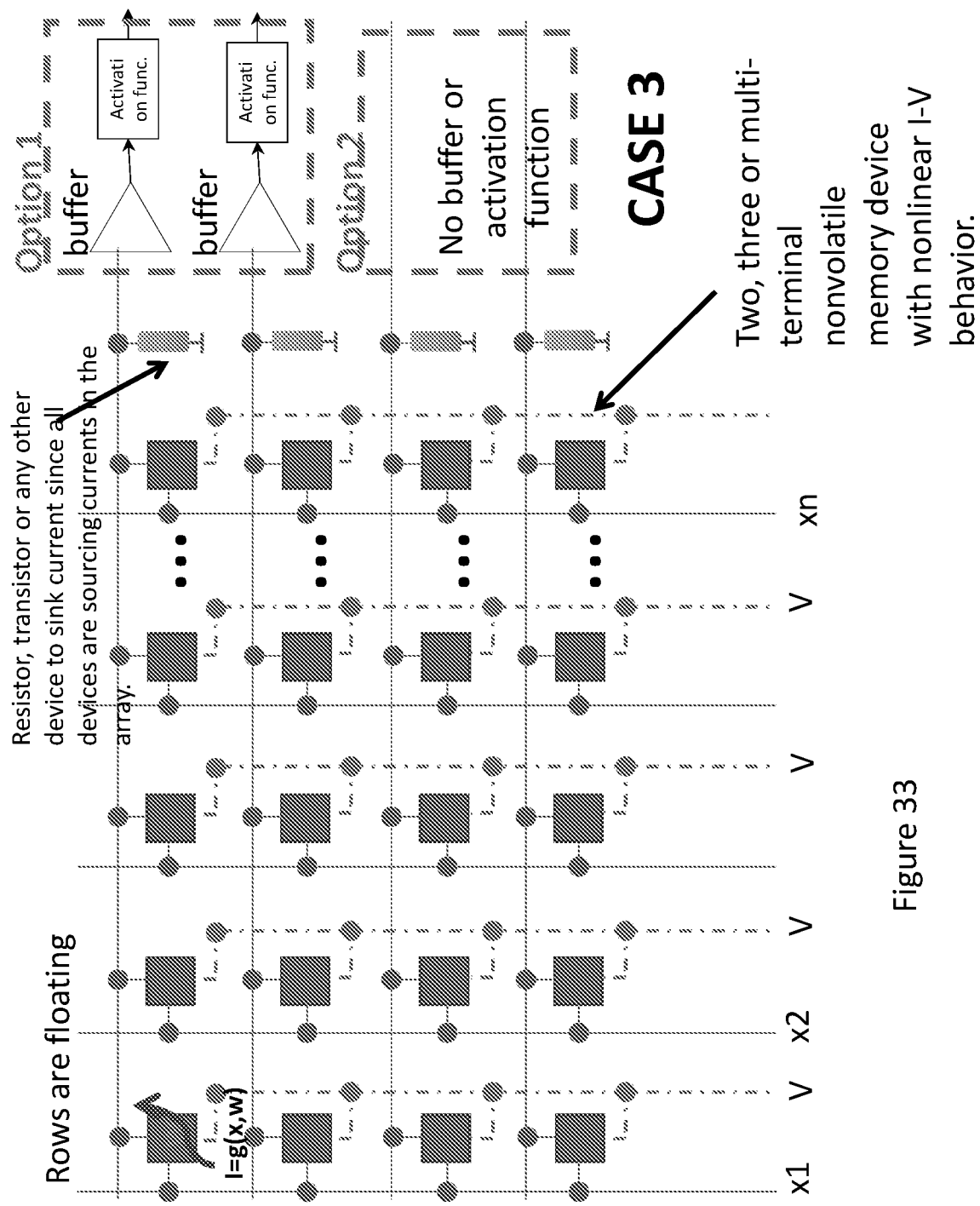
FIG. 33 illustrates a circuit variation of the example of FIG. 31 but with a different neuron circuitry (the neuron is not adding up input currents anymore and it applies function to the measured voltage).

FIG. 33 illustrates a circuit variation of Example 1 but with a different neuron circuitry (the neuron is not adding up input currents anymore). In this architecture, neuron circuitry doesn't have any effect on the operation of the array and doesn't force any voltages to rows of the array (isolated). Instead, the neuron circuitry monitors the voltage on the rows and produces output proportional to that voltage (hence the rows of the array are somewhat left floating and their voltages will be determined only by the array). In this case, nonlinear synaptic weights are implemented with NVM devices operating in the nonlinear region all sourcing current proportional to their input and internal state and this current is routed to the ground or VSS through a pulling down resistor or another device like a transistor. In this case, flash transistors are trying to pull the voltage of the row up while the pull down device will try to pull the voltage down. Eventually, the final voltage of the rows will be a nonlinear function of inputs applied to the array and the states of NVM devices connected to each row. For this circuit, the neuron circuitry can be implemented in a plurality (e.g., two) of ways. In a first case, to isolate the neuron circuitry from the array and remove the loading effect of the next layer, the voltage on each row is first monitored with a buffer and then an optional activation function is applied. In a second case, if the next layer has a high impedance (like the gate of the transistor), and if the first array has enough driving capability, the rows of the first array can be directly used as an output to drive the next layer.

In a memristive array (NVMs are memristors), since the memristors don't have a driving capability, a buffer is needed at the neuron circuitry to isolate the next layer. Also since memristive devices can both source or sink currents, the pulling down element can be removed in or more examples.

For flash devices, because inputs are applied to the gates of transistors (which has very high impedance), and flash transistors are active devices, the buffer can be removed (since the driving capability is not required) and the rows can be directly connected to the gates of transistors in the next layer.

d. Case Example 4

Figure 34:
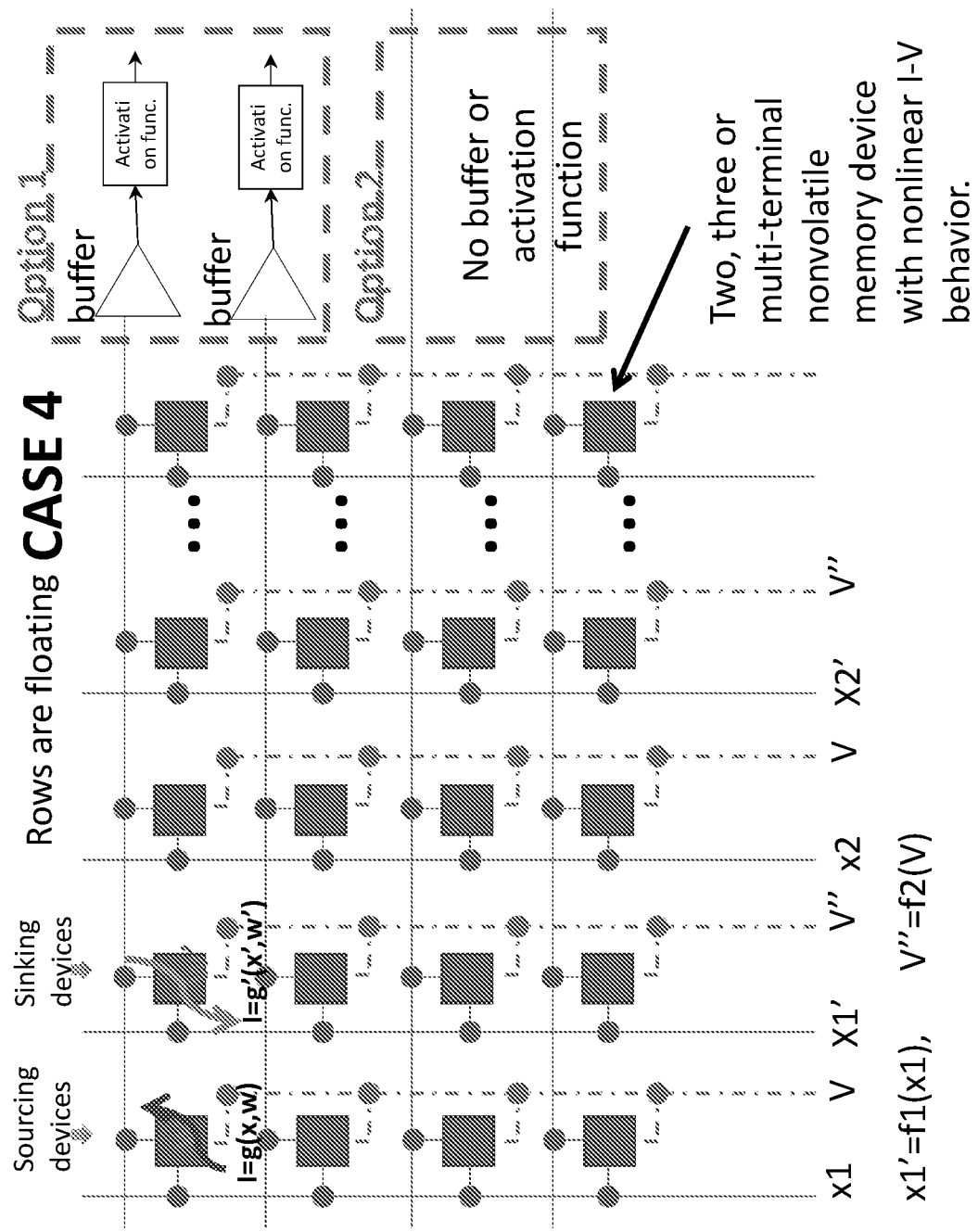
FIG. 34 illustrates an example circuit which is a variation of the example circuit in FIG. 32 that includes sinking and sourcing devices in the array with a different neuron circuitry (the neuron is not adding up input currents anymore and it applies function to the measured voltage).

FIG. 34 illustrates an example circuit which is a variation of Case example 3 that includes sinking and sourcing devices in the array. Again, the output voltage depends only on the voltage of the floating rows, Since the circuit includes current sinking devices, a pull down device is not needed and the voltage of each row will be somewhere between VDD and VSS. This voltage will be proportional to the state of NVM devices and inputs. For example, for the case of flash array where the NVMs are flash transistors, NMOS flash transistors will try to pull the voltage of the row towards VDD and PHOS flash transistors want to pull the voltage down toward VSS.

For the case where the NVM devices are metnristive devices, a large voltage is applied to achieve nonlinearity of memristive devices.

Note that since the activation function is applied to the row voltage, any function can be used here for this purpose (even digital gates such as NOT or NAND gates and using two rows of the array). Further examples of the above cases based on memristors and flash devices are provided below.

e. Case Example 5: Network with Nonlinear Weights and Virtually Biased Neurons (Linear Neurons).

Figure 35:
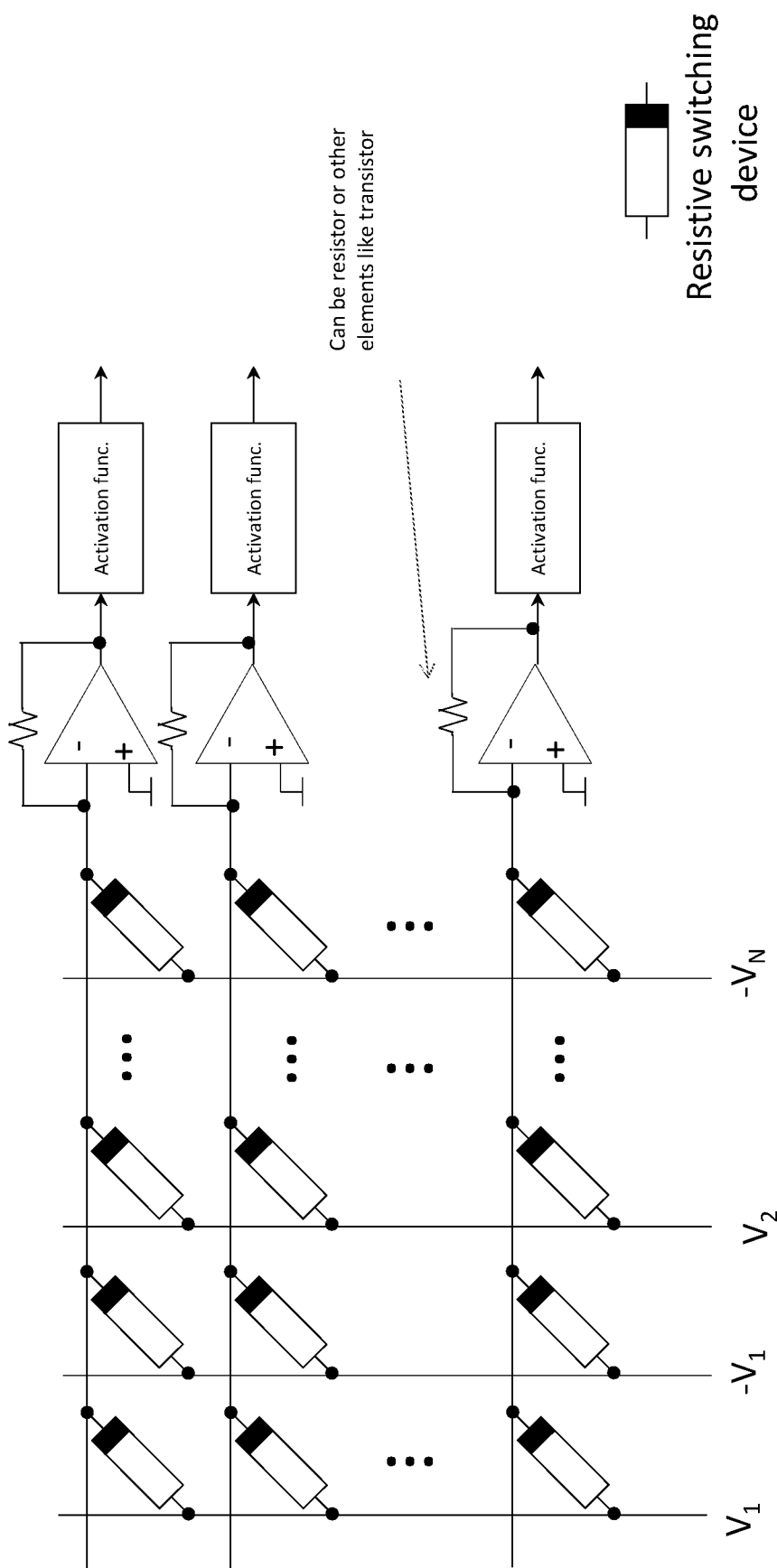
FIG. 35 illustrates an example wherein the NVMs are resistive switching devices (e.g., memristors) used in nonlinear region of operation and inputs can be applied in a differential mode.

FIG. 35 illustrates an example wherein the NVMs are resistive switching devices (e.g., memristors) wherein inputs can be applied in a differential mode or positive and negative weights can be implemented using conventional differential neuron. If the applied voltage to memristor is low, it will behave linearly. However, if larger voltages as input are applied to the memristors, the current of each device will be a nonlinear function of the applied voltage and the device state. Thus, applying larger voltages may be beneficial because of the higher Signal-to-noise (SNR) ratios that are achieved, higher processing speed and because nonlinear synapses may increase network capacity by increasing the complexity of operation.

f. Case Example 6: Network with Floating Neurons (Rows of the Crossbar are Floating).

Figure 36:
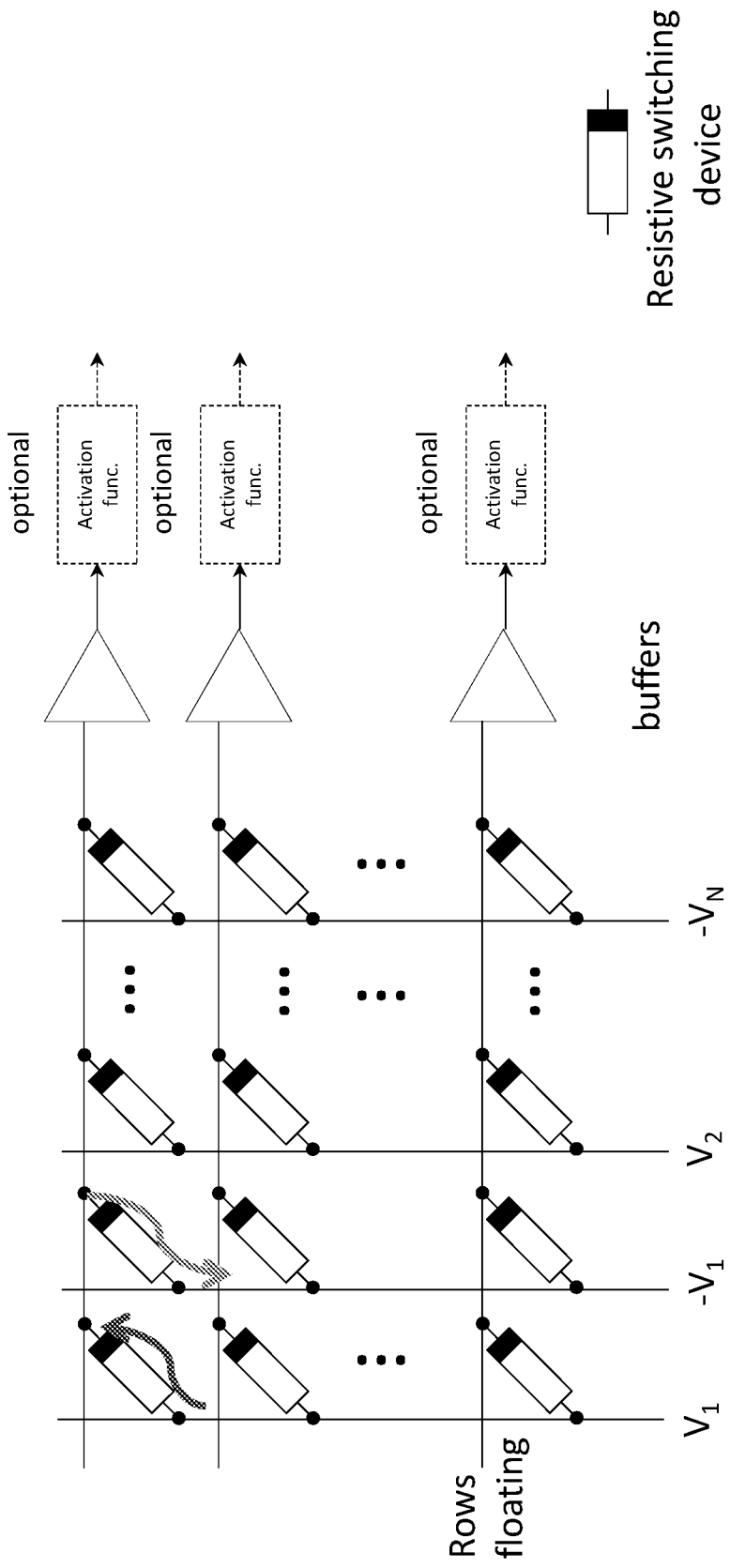
FIG. 36 illustrates another example wherein the NVMs are resistive switching devices (e.g., memristors) and neurons are applying a function to the measured voltage of the floating rows. The inputs can be applied in a differential mode.

FIG. 36 illustrates an example wherein the NVMs are resistive switching devices (e.g., memristors) and the inputs can be applied in a differential mode. Moreover, in this architecture, large voltages (still below threshold) are applied to the columns of a resistive switching crossbar but rows are left floating. In this case the voltage on the rows will depend (in a complex and nonlinear way) on all inputs and the conductance of the resistive switching devices. Therefore, the neuron circuitry can include a very simple and low-power buffer or even a digital gate and an activation function.

g. Case Example 7: NVMs Including Single-Gate Flash Transistors

Figure 37:
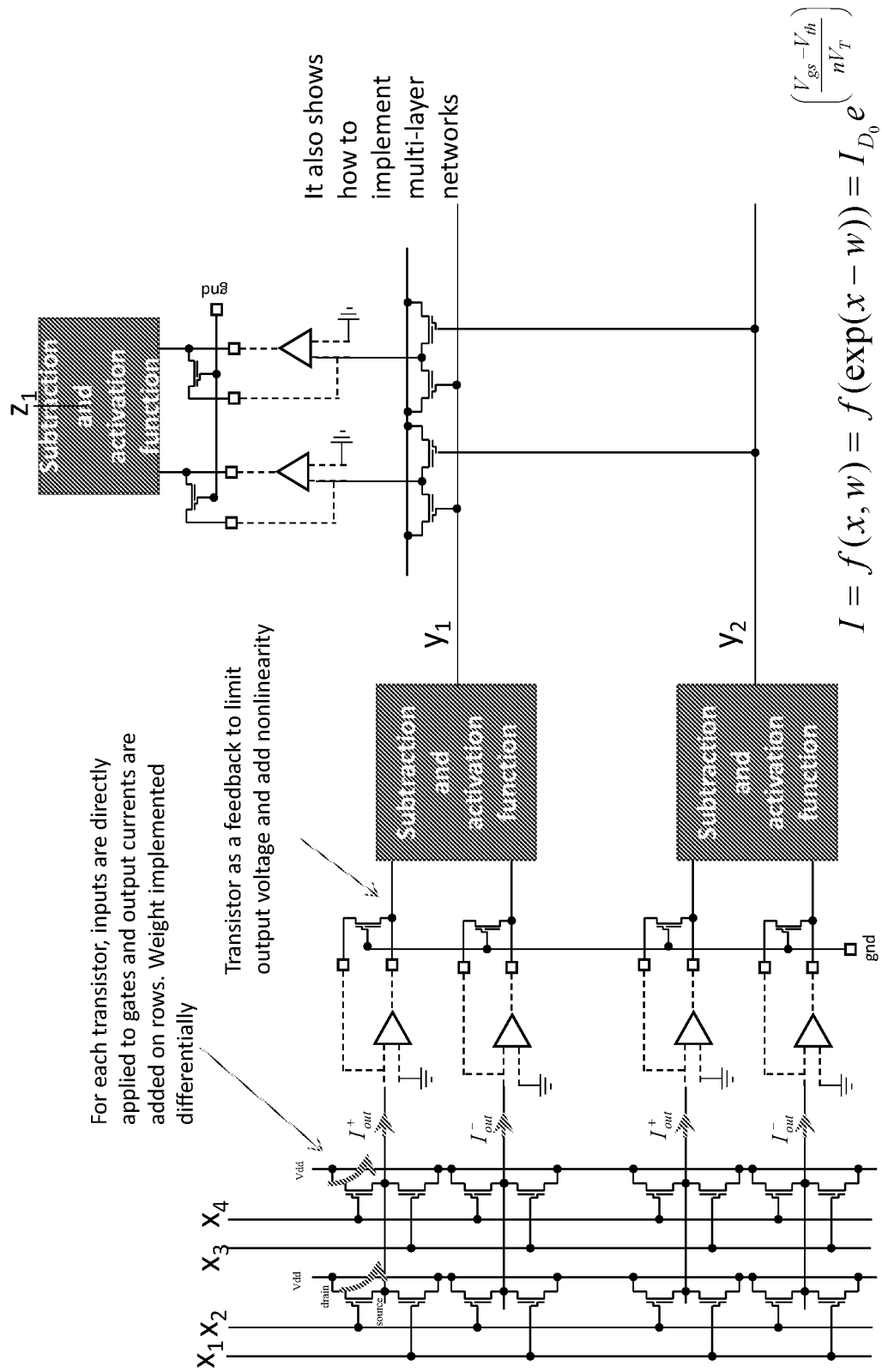
FIG. 37 includes an example wherein single-gate flash transistors are used as nonlinear weights, linear neurons are implemented with opamps creating virtual voltages on rows of the flash arrays, and outputs of two rows are subtracted to generate negative and positive weights.

FIG. 37 includes an example wherein single-gate flash transistors are used as nonlinear weights, linear neurons are implemented with opamps creating virtual voltages on rows of the flash arrays, and outputs of two rows are subtracted to generate negative and positive weights.

For each transistor, inputs are directly applied to gates and output currents are added on rows. Weight is implemented differentially. A Transistor is provided as feedback to limit output voltage and add nonlinearity.

FIG. 37 also illustrates how to implement multi-layer networks. The current of each transistor used in subthreshold region is given as (Vgs represents input and Vth is the weight programmed in the flash transistor)

$$I = f(x, w) = f(\exp(x - w)) = I_{D_0} e^{\left(\frac{V_{gs} - V_{th}}{nV_T}\right)}$$

h. Case Example 8: NMOS and PMOS Transistors

Figure 38:
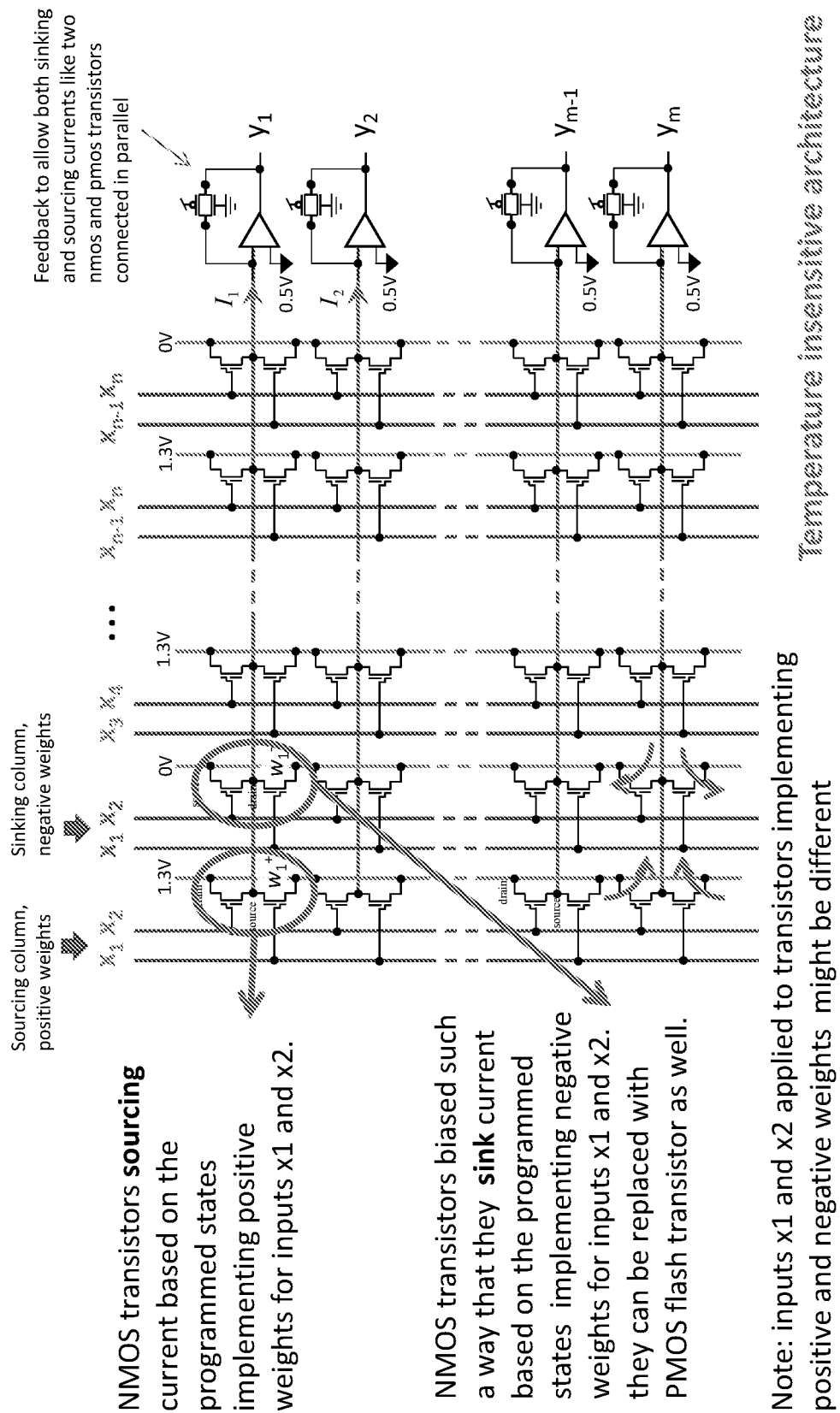
FIG. 38 is a variation of FIG. 37 using both pmos (or nmos biased to sink current) and nmos (to source current) flash transistors so as to generate both positive and negative weights on each row of the array. Feedback of the opamps should allow both sinking and sourcing currents.

FIG. 38 is a variation of FIG. 37 using both pmos (or nmos biased to sink current) and nmos (to source current) flash transistors so as to generate both positive and negative nonlinear weights on each row of the array. Feedback of the opamps should allow both sinking and sourcing currents.

Some NMOS transistors source current based on the programmed states implementing positive weights for inputs x1 and x2. Other NMOS transistors are biased in such a way that they sink current based on the programmed states, implementing negative weights for inputs x1 and x2 (these NMOS transistors can be replaced with PMOS flash transistor as well). proper programming of the flash devices, meaningful nonlinear function or network can be constructed.

Feedback is provided to allow both sinking and sourcing currents two Nmos and Pmos transistors connected in parallel).

Figure 39:
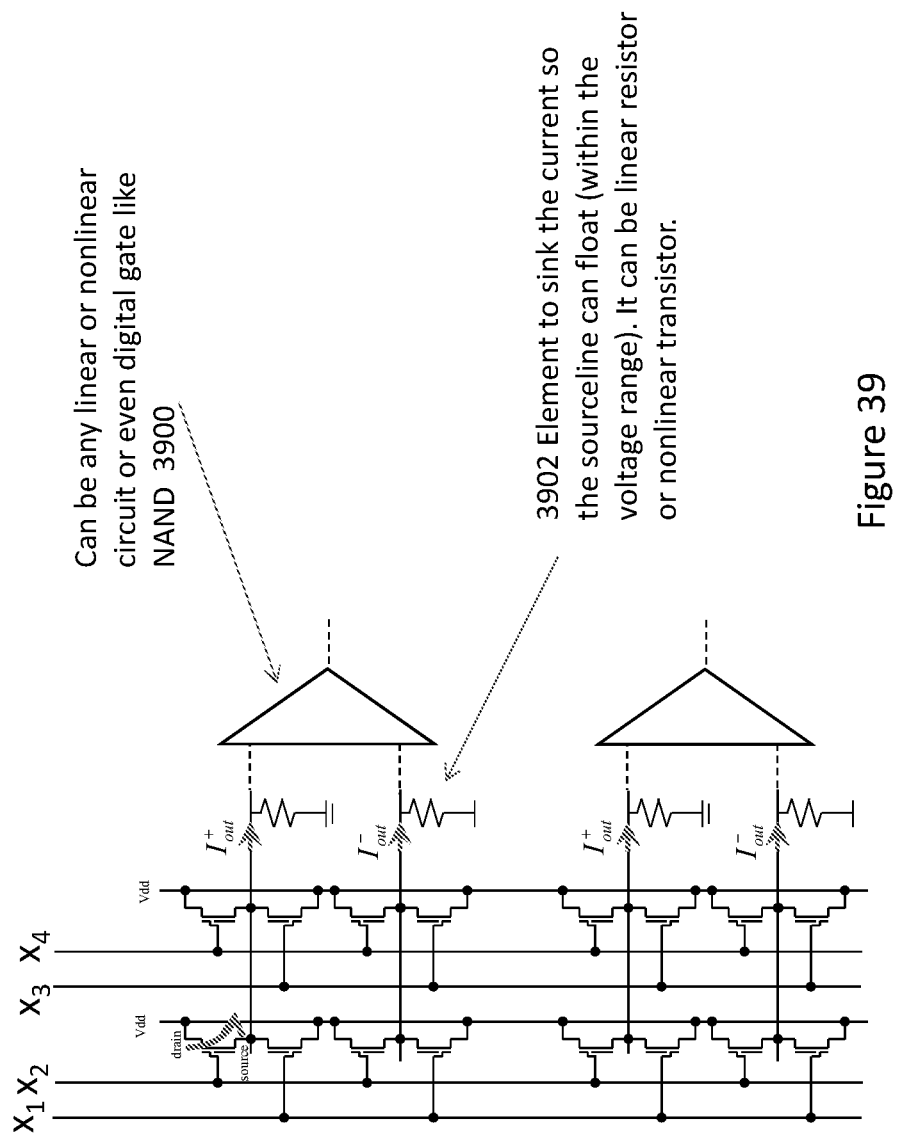
FIG. 39 illustrates an example wherein inputs are directly applied to gates so as to achieve a very high speed circuit, a single linear or nonlinear device is used to sink the current, the rows of the array are left floating, and a activation function is applied to the measured voltages. The current of each device is a nonlinear function of its state and input.

In most of the above circuits, because of the way the networks are implemented using differential weights, differential inputs or outputs, the architecture may be temperature insensitive.

i. Case Example 9 NMOS Flash Sourcing Currents with Floating Sourceline and Nonlinear Neurons FIG. 39 illustrates an example wherein inputs are directly applied to gates so as to achieve a very high speed circuit while rows are left floating, The current of each device is a nonlinear function of its state and input. Neuron circuitry now works with voltages on the rows and can be much simpler and much more low power, In some examples, digital gates (e.g., NAND) are used. For example, the element 3900 can be any linear or nonlinear circuit or even a digital gate (e.g., NAND gate)

The circuit of FIG. 39 includes an element 3902 to sink the current so the sourceline can float (within the voltage range). The element can be a linear resistor or a nonlinear transistor.

j. Case Example 10: Sourcing and Sinking Flash Devices with Nonlinear Neurons

Figure 40:
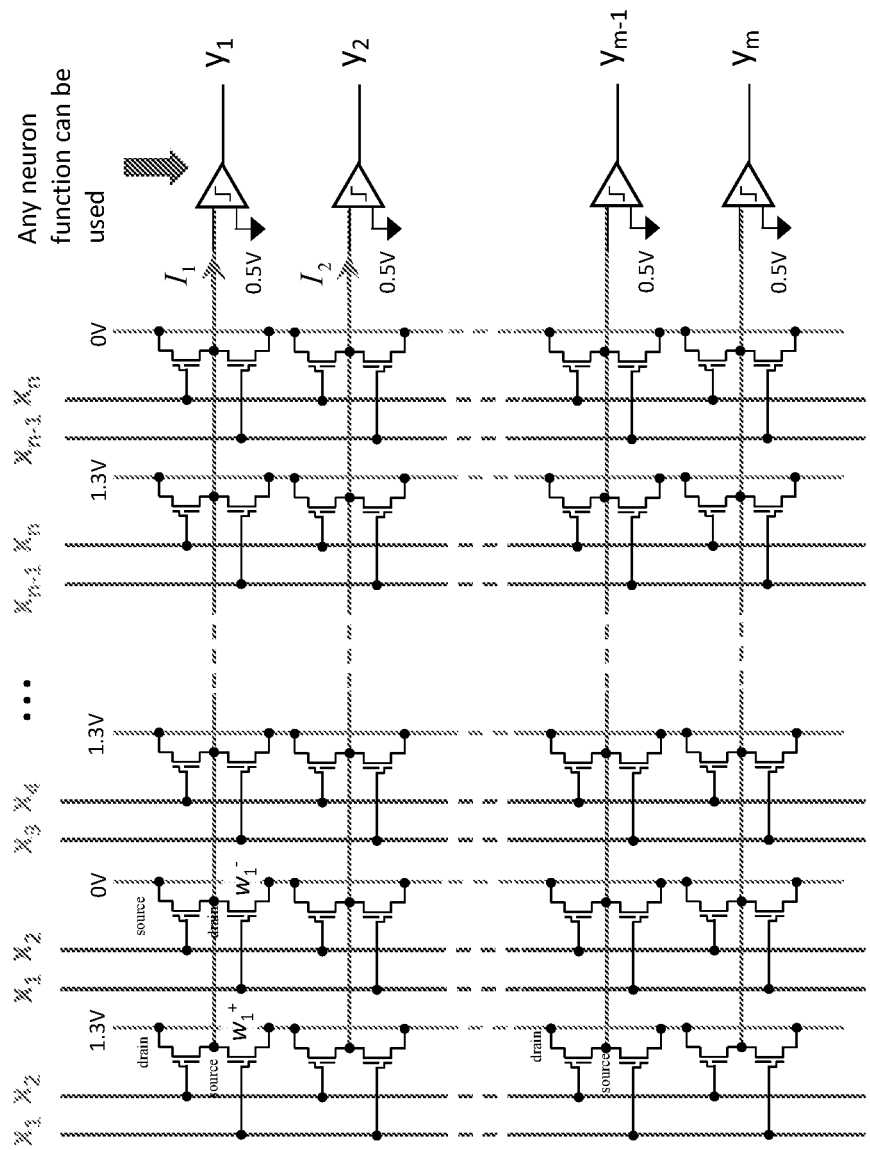
FIG. 40 illustrates an example including both sinking and sourcing devices and floating neuron circuitry.

FIG. 40 illustrates an example including both sinking and sourcing devices biased in nonlinear region, the floating source lines will have a voltage between $V_{SS}$ and $V_{DD}$ based on the power of sinking and sourcing currents. The neuron will apply another function to the voltage of these floating lines without impacting them. The indicated voltages are examples.

Figure 41:
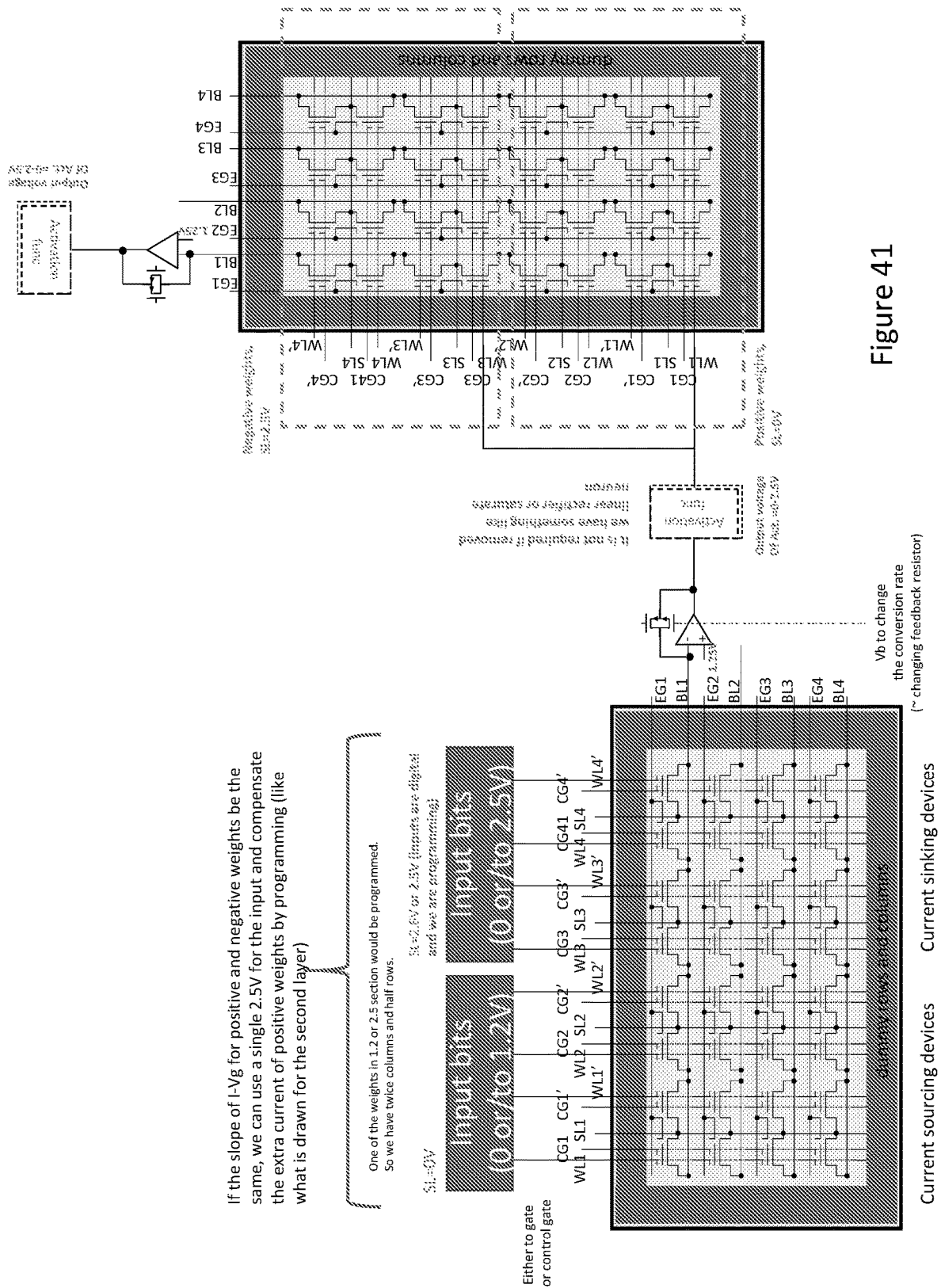
FIG. 41 illustrates an example wherein positive and negative nonlinear/binary weights are achieved using multi-gate flash devices.

Sourcing current devices try to pull the source voltage up while sinking devices try to pull the source voltage down.

k. Case Example 11: Positive and Negative Exponentialibinary Weights Based on Multi-Gate Flash Devices FIG. 41 illustrates an example wherein nonlinear positive and negative weights (including exponential/binary weights) are achieved using multi-gate flash devices. In this architecture, inputs are applied as a voltage to WL or CG or both, positive weights are implemented with NMOS flash transistors biased to source current, negative weights are implemented with PHOS flash transistors or NMOS flash transistor biased to sink current (to reduce the number of required opamps), neuron circuitry adds the incoming currents and convert it into voltage linearly or nonlinearly using the device used as feedback in the neuron circuitry. The rest of the terminals of the flash devices are biased with fixed voltage during operation. An optional activation function can be applied to the output of the neuron. The output of this circuit can directly drive the next array implementing the next layer of the neural network.

In the example shown here, the output voltage of the activation function is in the range of 0-2.5V so it can directly drive the next layer implemented with similar circuit.

Although included in this example, the activation function is not required. if the activation function is removed, something similar to a linear rectifier or saturated neuron is obtained.

In the example shown here, for positive weights, in order to have devices sourcing current the source line (SL)=0V and for negative weights, in order for the NMOS flash device to be able to sink current the SL is set to 2.5V.

A voltage Vb is applied to change the gain or function of the conversion from current to voltage (e.g. changing the resistance of the feedback device).

l. Case Example 12: Multi-Gate Flash Devices and a Neuron-Less Network

FIG. 42 illustrates a circuit example comprising multi-gate flash devices and a neuron-less network. This example is similar to Example 11 with the difference that here the rows of the first array are left floating so their voltage will be determined based on the sourcing and sinking power of flash devices connected to each row (so depending to the inputs and states of flash transistors). If the power of current sourcing devices is higher, the voltage of the floating row will be higher. Since in this architecture we are applying inputs to the gates of flash transistors with very high impedance, we can directly apply the outputs (rows of the first array) to the inputs of the next layer (gates of the second array) to create a multi-layer network. In this network, WL, CG or both can be used for inputs, and other terminals will be biased with proper fixed voltages. This architecture will have a very efficient implementation because it doesn't require neurons. Also since the inputs are applied as voltage to the gates of flash transistors, it will have very high speed.

Since we are using active devices, the transistors of the first array can directly drive the second array so no neuron circuitry is needed (the nonlinearity of the activation function is implemented with flash devices operating in nonlinear region like subthreshold).

Since the output of $1^{st}$ layer is connected to high impedance gates of second layer, it won't affect the voltage on the rows in the first layer.

If required, a buffer or activation function can be positioned as shown.

m. Training

In all of the above network examples a-l, it is assumed that the nonlinear network is modeled and already trained in software for a particular application and we are programming flash transistors with synaptic weights obtained from simulation to use the hardware for efficient inference. Since these networks are not using regular linear VMMs, and they perform nonlinear equations, first their nonlinear functionality needs to be modeled. This model will be used in the software simulation to train the network implemented based on these modules and then the weight will be imported to the hardware.

4. Process Steps

FIG. 43 is a flowchart illustrating a method of fabricating a circuit useful for implementing a neural network.

The method comprises the following steps (referring also to FIGS. 17-42 and labeling in FIG. 23 and FIG. 25).

Block 4300 represents providing a plurality of Non-Volatile Memory (NVM) devices (e.g., memristors or flash transistors) each having an NVM input A for receiving an input x and an NVM output B, wherein each of the NVM outputs outputs a signal comprising a nonlinear function g(x, w) of the input x to the NVM input and an internal state w of the NVM, the internal state corresponding to a weight assigned to the input x.

Block 4302 represents connecting a plurality of input lines indexed $I_i$ (where i is an integer 0<i<n and n is an integer), each of the plurality of input lines connected to a first plurality of the NVM inputs A so as to transmit at least some of the input x to the NVMs.

Block 4304 represents connecting a plurality of output lines indexed $O_j$ (where j is an integer 0<j<m and m is an integer), each of the plurality output lines connected to a plurality of the NVM outputs B so as to receive the signals from the NVMs.

Block 4306 represents optionally connecting additional circuitry.

In one or examples, the step comprises connecting circuitry C1 combining a pair of the output lines $O_1$. $O_2$ so that the signals in the output lines in the pair are combined to form a combined output O used by a neuron to make a decision.

In one or more examples, the input lines include pairs of associated input lines $V_a$, $V_b$, each of the pairs including input line $V_a$ transmitting the input x comprising input $x_a$ to the NVM devices connected to the input line $V_a$ and input line $V_b$ transmitting the input x comprising input $x_b$ to the NVM devices connected to the input line $V_b$. Circuitry is provided so as to form a function $f(x_a)$ of the input $x_a$ transmitted in the input lines $V_a$. Thus, input lines $V_b$ transmit the input $x_b$ that is the function $f(x_a)$ (e.g., the negative of) of the input $x_a$ to the NVM devices inputs connected to input line $V_b$. In one or more embodiments, the outputs from the NVM devices connected to the input lines $V_a$ and $V_b$ are combined to form a combined output used by the neuron to make a decision.

Block 4308 represents the end result, a neural network device comprising the plurality of the NVM devices, the output lines, and the input lines.

In one or more examples, the output lines are left floating and the device further comprises circuitry applying a nonlinear activation function to a voltage in each of the output lines or in a combination of the output lines, In one or more examples, the neural network comprises pairs P of the input lines comprising a first input line x1 and a second input line x2, wherein the first input line in a pair is connected to first NVM devices 3200 that are each a current source in response to the input x transmitted on the first input line, the second input line in the pair is connected to the second NVM devices 3202 that are each a current sink in response to the input x transmitted on the second input line, and the NVM outputs for the first NVM devices and the second NVM devices in a pair are connected to a same one of the output lines (see e.g., FIG. 32).

In one or more examples, the device comprises a plurality of synapses 2100 each receiving a plurality of synapse inputs $x_i$ and generating a synapse output $y_i$ in response to the plurality of synapse inputs (see e.g., FIG. 21). Each of the synapses comprise the plurality of the NVM devices, wherein each of the plurality of synapses (1) receive a plurality of voltages Vi from a first layer of first neurons, wherein each of the voltages are inputted to one of the input lines Ij, and (2) output a synapse signal comprising a combination of the signals received on one of the output lines Oj or a combination of the output lines Oj. At least one second neuron is connected to one or more of the synapses, and the at least one second neuron is configured to generate a decision based on the synapse signal.

In one or more examples, the nonvolatile memory devices are operated in their nonlinear operating region and still implement a neural network. The advantages of such operation include implementing much simpler and more efficient networks without requiring to meet so many of the constraints of operating in the linear region of these devices.

Embodiments of the neural network device can be programmed according to the programming techniques described in section IV and/or biased using gates other than the word line as described in section III, e.g., so as to perform VMM,

REFERENCES

The following references are incorporated by ence herein.
[1] U.S. Pat. No. 5,029,130.
[2] U.S. Pat. Ser. No. 15/594,439.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Vector-by-Matrix Multiplication (VMM) circuit to implement larger neural networks, comprising:
   first cells of field effect transistors (FETs), each of the first cells comprising a first FET and a second FET;
   second cells of FETs each connected to one of the first cells, each of the second cells comprising a third FET and a fourth FET, and each of the FETs comprising:
   a source (S), a drain (D), and a channel between the source and the drain;
   a first gate disposed over a first portion of the channel and insulated from the first portion of the channel, the first gate controlling a first conductivity of the first portion in response to a first voltage applied to the first gate;
   a second gate comprising a floating gate disposed over a second portion of the channel, the floating gate controlling a second conductivity of the second portion in response to an amount of charge (electrons or holes) stored on the floating gate;
   a third gate comprising a gate coupled to the floating gate so as to control the amount of charge transferred to the floating gate during programming;
   a first line electrically connecting the first gate in the first FET and the first gate in the third FET;
   a second line electrically connecting the first gate in the second FET and the first gate in the fourth FET;
   a third line electrically connecting the third gate in the first FET and the third gate in the third FET;
   a fourth line electrically connecting the third gate in the second FET and the third gate in the fourth FET;
   a fifth line electrically connecting the sources of the first and second FETs with the sources of the third and fourth FETs when the FETs are n-type FETs, or electrically connecting the drains of the first and second FETs with the drains of the third and fourth FETs when the FETs are p-type FETs;
   a sixth line electrically connecting the drains of the third and fourth FETs when the FETs are n-type FETs, or electrically connecting the sources of the third and fourth FETs when the FETs are p-type FETs;
   a first pass gate connecting the third gate in the first FET to the drain in the first FET when the FETs are n-type FETs or connecting the third gate in the first FET to the source in the first FET when the FETs are p-type FETs;
   a second pass gate connecting the third gate in the second FET to the drain in the second FET when the FETs are n-type FETs or connecting the third gate in the second FET to the source in the second FET when the FETs are p-type FETs; and wherein:
   the input current to the first FET is inputted to the drain of the first FET when the FETs are n-type FETs or the input current to the first FET is inputted to the source of the first FET when the FETs are p-type FETs;
   the input current to the second FET is inputted to the drain of the second FET when the FETs are n-type FETs or the input current to the second FET is inputted to the source of the second FET when the FETs are p-type FETs;
   the output current from the third FET is a dot product multiplication of the input current to the first FET and a weight determined by the amount of charge stored on the floating gates of the first FET and the third FET;

the output current from the fourth FET is a dot product multiplication of the input current to the second FET and a weight determined by the amount of charge stored on the floating gates of the second FET and the fourth FET; and the FETs are operated in a subthreshold regime.

2. The circuit of claim 1, further comprising:
a third pass gate connecting the first gate in the first FET to the third gate in the first FET; and
a fourth pass gate connecting the first gate in the second FET to the third gate in the second FET.

3. The circuit of claim 1, wherein the current in the sixth line comprises an addition and/or subtraction of the output currents outputted from each of the third and fourth FETs whose drains or sources are connected by the sixth line.

4. The circuit of claim 3, further comprising:
a plurality of synapses between a first layer of first neurons and a second layer comprising at least one second neuron, the synapses each comprising a plurality of the first cells and the second cells, wherein:
the plurality of synapses receive a plurality of inputs from the first layer of first neurons and output a plurality of outputs to the at least one second neuron in response thereto,
the plurality of inputs are inputted onto the sources or drains of the first cells and the plurality of outputs comprise the current in the sixth line, and
the at least one second neuron is configured to generate a decision based on the current in the fourth line.

5. The circuit of claim 1, wherein:
the FETs each further comprise a fourth gate comprising a gate coupled to the floating gate so as to erase charge from the floating gate;
the circuit further includes a seventh line electrically connecting the fourth gate in the first FET to the fourth gate in the third FET;
the circuit further includes an eighth line electrically connecting the fourth gate in the second FET to the fourth gate in the fourth FET.

6. The circuit of claim 2, wherein:
the pass gates each have an input and an output,
when the pass gates are on, the input voltage to the input is the same as the output voltage from the output, and
when the pass gate is off, the inputs and outputs are isolated.

7. The circuit of claim 5, wherein:
the fifth line, the seventh line, and the eighth line are each biased at a fixed voltage,
each of the input currents are inputted to the drains of the first cells when the FETs are n-type FETs or the sources of the first cells when the FETs are p-type and the pass gates are on,
each of the input currents are converted to voltage on the third gates of the first cell,
the voltage is shared with third gates of the second cells,
the second cells convert the voltage to current with different gains proportional to the amount of charge stored on the floating gates in the first cells and the second cells, and
the currents outputted from each of the third and fourth FETs are summed on the sixth line.

8. A circuit useful for implementing a neural network, comprising:
a plurality of Non-Volatile Memory (NVM) devices each having an NVM input for receiving an input x and an NVM output, wherein each of the NVM outputs outputs a signal comprising a nonlinear function g(x, w) of the input x and an internal state w of the NVM devices, the internal state corresponding to a weight assigned to the input x;
a plurality of input lines, each of the plurality of input lines connected to a first plurality of the NVM inputs so as to transmit the input x to the NVM devices; and
a plurality of output lines, each of the plurality of output lines connected to a plurality of the outputs so as to receive the signals from the NVM devices.

9. The circuit of claim 8, further comprising circuitry combining a pair of the output lines so that the signals in the output lines in the pair are combined to form a combined output.

10. The circuit of claim 8, further comprising:
the input lines including pairs of associated input lines, each of the pairs including:
an input line $I_a$ transmitting the input x comprising input $x_a$ to the NVM devices connected to the input line $I_a$, and
input lines $I_b$ transmitting the input x comprising input $x_b$ that is a function of the input $x_a$.

11. The circuit of claim 8, wherein the output lines are left floating and the device further comprises circuitry applying a nonlinear activation function to a voltage in each of the output lines or in a combination of the output lines.

12. The circuit of claim 8, further comprising:
pairs of the input lines each comprising a first input line and a second input line, wherein:
the first input line is connected to the NVM devices comprising first NVM devices that are each a current source in response to the input x comprising a first input x transmitted on the first input line, and
the second input line is connected to the NVM devices comprising second NVM devices that are each a current sink in response to the input x comprising a second input x transmitted on the second input lines,
the NVM outputs of the first NVM devices in the pair and the NVM outputs of the second NVM devices in the pair are connected to a same one of the output lines.

13. The circuit of claim 8, wherein the NVM devices comprise memristors or flash transistors.

14. The circuit of claim 8, further comprising:
a plurality of synapses each receiving a plurality of synapse inputs and generating a synapse output in response to the plurality of synapse inputs, each of the synapses comprising the plurality of the NVM devices, wherein:
each of the plurality of synapses:
receive a plurality of voltages from a first layer of first neurons, wherein each of the voltages are inputted to one of the input lines,
output a synapse signal comprising a combination of the signals received on one of the output lines or a combination of the output lines; and
at least one second neuron connected to one or more of the synapses, wherein the at least one second neuron is configured to generate a decision based on the synapse signal.

* * * * *